United States Patent [19]

Allgood

[11] 4,415,896
[45] Nov. 15, 1983

[54] COMPUTER CONTROLLED ENERGY MONITORING SYSTEM

[75] Inventor: Marvin D. Allgood, Oxon Hill, Md.

[73] Assignee: ADEC, Inc., Oxon Hill, Md.

[21] Appl. No.: 272,011

[22] Filed: Jun. 9, 1981

[51] Int. Cl.³ .................. G08C 19/00; G08C 19/04; G08C 19/10; G08B 21/00

[52] U.S. Cl. .................. 340/870.03; 324/127; 338/22 R; 330/254; 340/870.04; 340/870.11; 340/870.17; 340/825.52; 340/606; 340/584

[58] Field of Search .................. 340/825.52, 870.02, 340/870.03, 870.04, 870.38, 870.11, 870.13, 606, 870.17, 825.07, 584; 338/22 R; 324/127; 364/480–483; 330/254, 278, 279, 284, 285

[56] References Cited

U.S. PATENT DOCUMENTS

| | | |
|---|---|---|
| 1,769,358 | 7/1930 | Pinkerton et al. |
| 2,828,479 | 3/1958 | Jackson |
| 2,883,647 | 4/1959 | Leeds et al. |
| 2,962,702 | 11/1960 | Derr et al. |
| 3,082,412 | 3/1963 | Sargent |
| 3,369,219 | 2/1968 | Abramson et al. |
| 3,553,376 | 1/1971 | Bogart et al. |
| 3,621,392 | 11/1971 | Liebermann et al. |
| 3,742,142 | 6/1973 | Martin |
| 3,800,090 | 3/1974 | Matena |
| 3,961,317 | 6/1976 | DeBrem et al. |
| 3,962,545 | 6/1976 | Abe |
| 3,973,890 | 2/1976 | Blethen et al. |
| 3,990,036 | 11/1976 | Savit |
| 4,016,369 | 4/1977 | Pedersen |
| 4,088,983 | 5/1978 | Crandall |
| 4,100,533 | 7/1978 | Napolitano et al. |
| 4,147,893 | 4/1979 | Matson |
| 4,149,144 | 4/1979 | Diefenderfer |
| 4,161,634 | 7/1979 | Bellisio |
| 4,161,786 | 7/1979 | Hopkins et al. |
| 4,204,195 | 5/1980 | Bogacki |
| 4,262,287 | 4/1981 | McLoughlin et al. |
| 4,322,728 | 3/1982 | Ginn |
| 4,335,361 | 6/1982 | Acker |

Primary Examiner—James J. Groody
Attorney, Agent, or Firm—Stevens, Davis, Miller & Mosher

[57] ABSTRACT

Disclosed is a centralized data communications system incorporating a plurality of remote stations, each having a plurality of information channels associated therewith. A selected remote station and its associated information channels are tone addressed by a central station communicating with a group of remote stations over a respective communications channel. The remote stations may have a current sensor connected to one of the information channels for sending data corresponding to the amount of current sensed in an electrical path back to the central station upon being properly addressed. This data, together with data representative of the voltage on the monitored electrical path, is used by the central station to calculate energy consumption. The calculated energy consumption is retained at the central station and used for information and billing purposes. The central station may also send data to an addressed information channel at a remote station for controlling an operation thereat. The central station can also receive data from various parameter measuring sensors at a remote station, e.g. sensors measuring temperature, humidity, fluid flow, etc. which may be connected to other information channels and thus the system may be used as a general purpose data gathering or distributing communications system.

84 Claims, 49 Drawing Figures

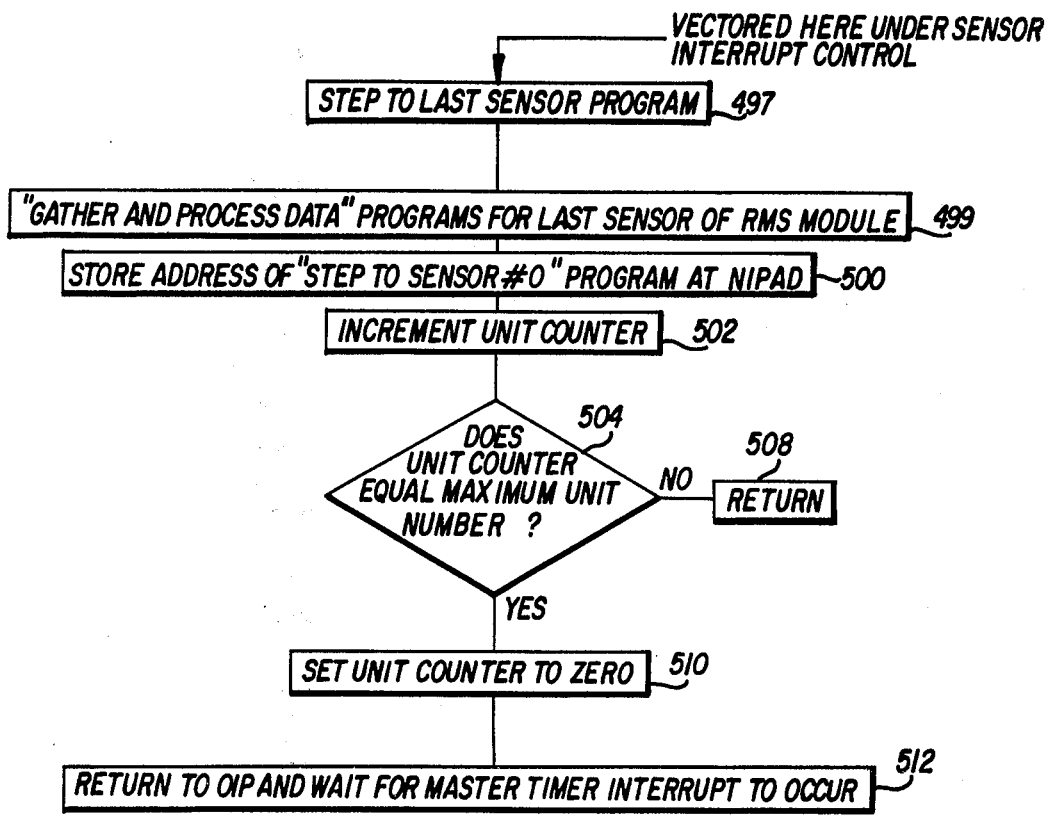
FIG. 13B
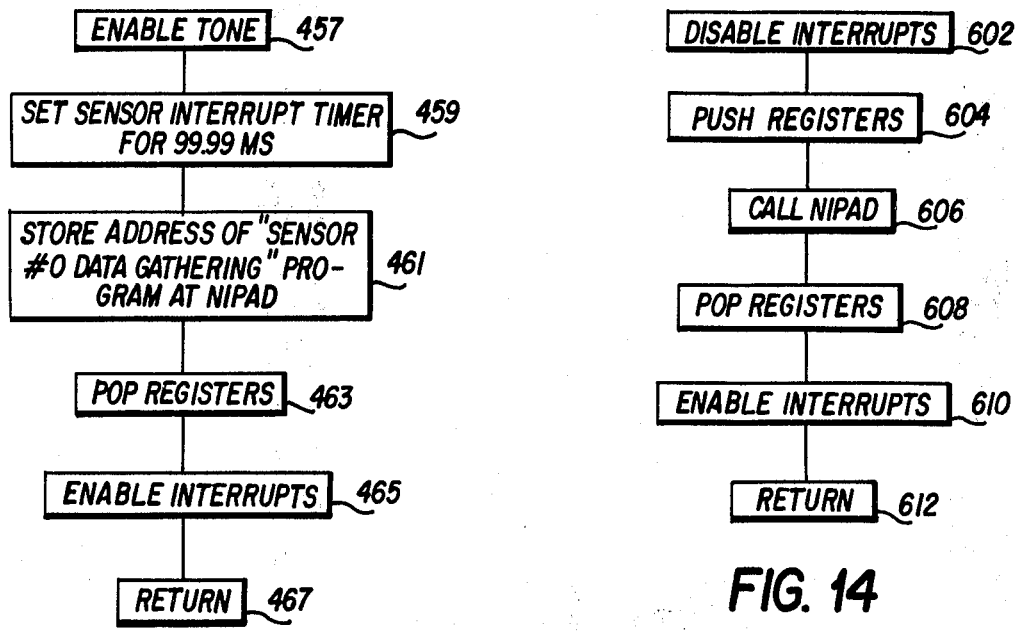
FIG. 12
FIG. 14

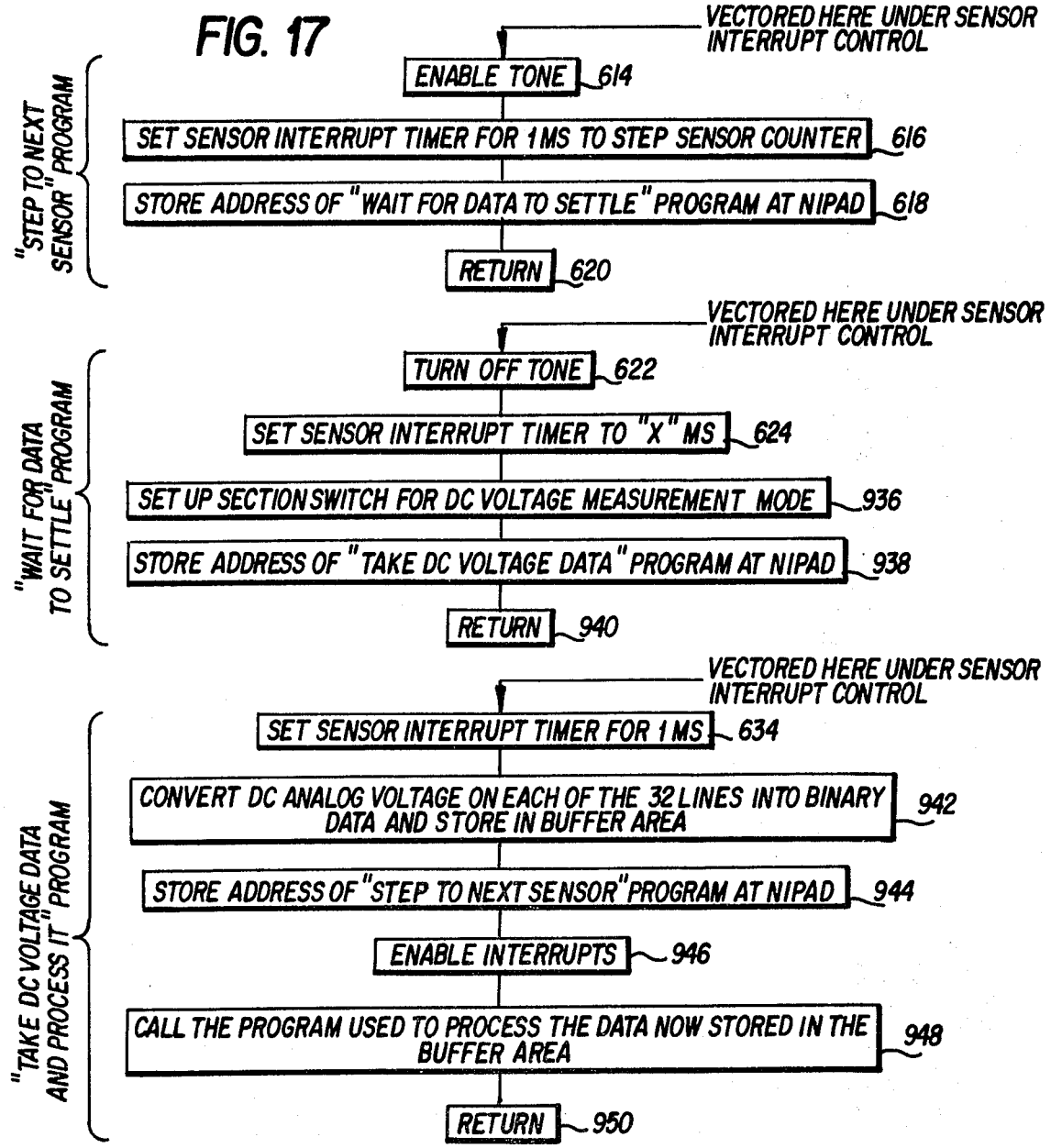

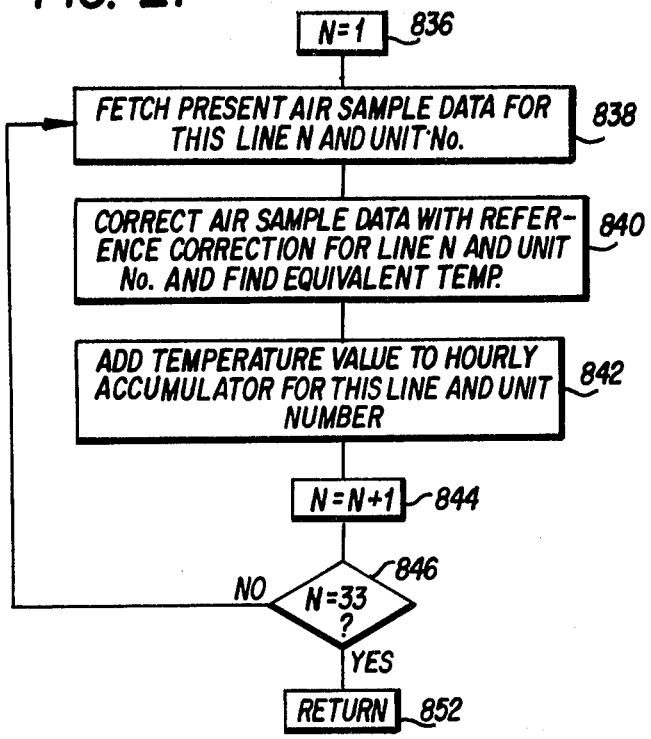
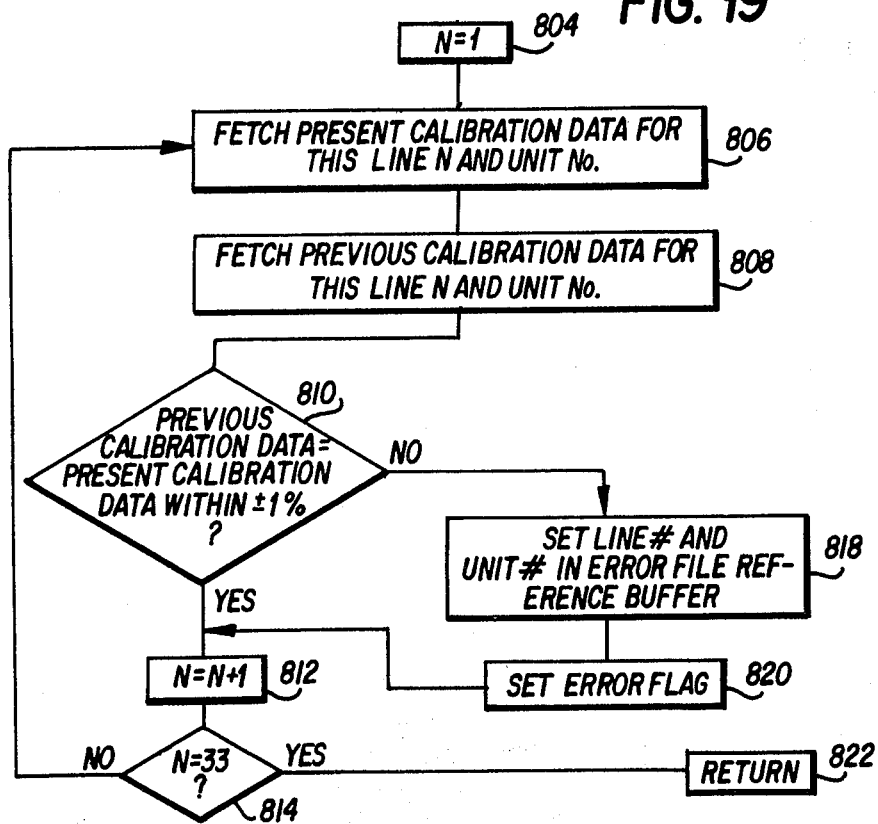

COMPUTER CONTROLLED ENERGY MONITORING SYSTEM

BACKGROUND AND SUMMARY OF THE INVENTION

The present invention relates to a centralized data communications system in which a plurality of groups of remote stations communicate with a central station over a respective plurality of communications channels each of which is shared by all the remote stations of a group. In a preferred arrangement of the system, data communicated from the remote stations to the central station is representative of sensed current in an electrical path which is used, together with data representing the voltage on the electrical path, by the central station to indicate energy consumption for information and billing purposes.

Various types of centralized data communications systems have been proposed in which a plurality of remote stations are addressed by a central station over one or more communications channels for the purposes of receiving data from or transmitting data to the remote stations. Generally speaking, the type of addressing which is employed is quite complex requiring sophisticated apparatus at both the central and remote stations. The complexity of this apparatus naturally decreases its reliability and increases its cost, limiting widespread use of centralized data communications systems.

Accordingly, one object of the present invention is to provide a relatively simple, reliable and low-cost data communications system in which a central station tone addresses a plurality of remote stations, each containing a plurality of information channels which may send data to or receive data from the central station. Each remote station contains apparatus therein for counting the number of tones on a communications channel connecting it to the central station and connecting one of the information channels to the communications channel only when the number of counted tones falls within a numerical range of tones assigned thereto. In addition, each remote station contains apparatus for sequentially connecting the information channels to the communications channel as tones within the predetermined numerical range assigned to remote station are counted. This type of addressing provides a centralized data communications system which is both simple and reliable, while considerably reducing its cost. The simplicity of construction of the remote stations also allows them to be constructed as low-cost modules which may be powered solely by the addressing tones.

An additional object of the invention is the provision of a centralized data communications system which is flexible and versatile, and which can be easily adapted to accurately take various output measurements from various types of sensors which may be connected to information channels at the remote stations.

An additional object of the invention is the provision of a centralized data communications system having a high degree of measurement accuracy which is achieved by calibrating the output of a remote station sensor. This is accomplished by first receiving and storing at a central station output calibration data from the sensor when measuring a parameter under known conditions. This calibration data is subtracted from output data of the sensor when measuring a parameter under unknown conditions, thus providing data that has been normalized to the known conditions.

An additional object of the invention is the provision of an automatic digital gain control circuit which is used at the central station of a centralized data communications system to adjust the level of an incoming signal to be within a predetermined measurement range of the central station equipment.

An additional object of the invention is the provision of a simple and low cost remote station module which is connected to a central station and used to monitor energy consumption or other parameters, which module contains unique circuitry for decoding and responding to tones emitted by the central station during addressing.

An additional object of the invention is the provision of a centralized data communications system which, with low cost sensors, is capable of measuring temperature, fluid flow, power and BTU consumption at a remote station with a high degree of accuracy.

An additional object of the invention is the provision of a centralized data communications system capable of controlling operations at an addressed remote station by sending tone control signals thereto.

The present invention also relates to a system for monitoring of energy consumption in an electrical path at a remote station. At present, there are many electrical installations such as in commercial buildings, apartments, condominiums, etc. where a single utility meter is provided at an electrical service entrance. With this arrangement, individual energy consumption in the apartments or other units of the building cannot be individually monitored or billed. This tends to promote waste as the occupants of the apartments have no individual control over total energy consumption and consequently little or no economic incentive to conserve energy.

Accordingly, an additional object of the invention is the provision of an energy management system which can be installed in a new or existing building not having individual unit metering to monitor and provide an indication of the individual energy consumption in each unit. Monitoring of the energy consumption enables the provision of an internal billing system for the building in which energy consumed by each unit can be individually metered and billed. In the system of the invention each unit contains at least one remote station communicating with a computer controlled central station over a communications channel. Each remote station includes at least one information channel which is connected to a current sensor which monitors the current passing through an input electrical path providing electrical service to the unit. The central station computer receives data from the current sensor representating current consumption and data representing voltage in the electrical path and calculates power, storing and processing it to provide a periodic indication of energy consumption which may be used for information or billing purposes. Thus, even though a building may not have individual electrical metering of each of the units, the system of the invention provides this function.

An additional object of the invention is to provide a unique power calculation circuit for calculating power existing in an electrical path from current in the path and a voltage derived from the voltage present on the path.

These and many other objects, features and advantages of the invention will become evident from the following detailed description which is presented in conjunction with the accompanying drawings.

BRIEF DESCRIPTION OF THE DRAWINGS

FIGS. 11 and 12 are flowcharts of the master timer interrupt program illustrated in FIG. 9;

FIG. 14 is a flowchart of a sensor interrupt program;

FIG. 17 is a flowchart of the FIG. 13 program as specifically configured to gather and process data for a DC voltage measurement;

FIGS. 18A, 18B, and 18C and 18D together form a flowchart of the FIG. 13 program as specifically configured to gather and process data for an AC power measurement;

FIG. 19 is a flowchart of a program for processing of gathered calibration data;

FIG. 21 is a flowchart of a program for processing gathered air temperature data;

DETAILED DESCRIPTION OF THE INVENTION

The remote station addressing technique and associated apparatus of the invention have applicability to any type of data gathering and/or distribution system wherein a central station communicates with a plurality of remote stations. Accordingly, this aspect of the invention will be described first. After this, a more detailed description of the data gathering and/or distribution system of the invention in a specific energy management system for monitoring energy consumption and other parameters at a remote station will be provided.

Figure 1:
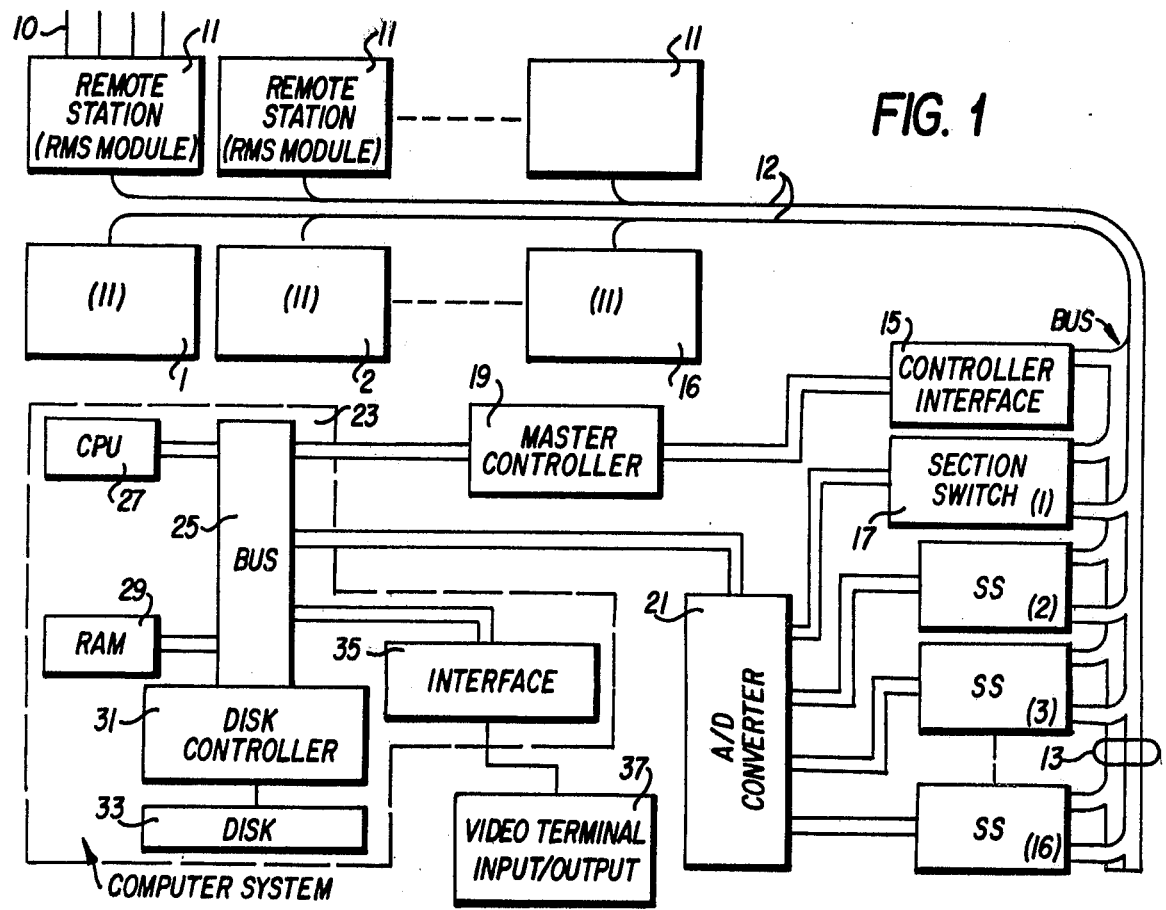
FIG. 1 is a block diagram of the data communications system of the invention.

The overall data gathering and/or distribution system of the invention is illustrated in FIG. 1 which shows a central computer system 23 which communicates with a plurality of modular remote stations 11 through a master controller 19, a controller interface 15, an A-D converter 21 and a plurality of section switches 17. The computer system 23 is a conventional commercially available system. One which has been found to be particularly suitable for use with the invention is known as the North Star Horizon. It includes a central processing unit (CPU) 27, a random access memory (RAM) 29 for temporarily storing programs and data, a disc controller 31, a floppy disc system 33 for permanently storing programs and data, an interface 35 for communicating with an externally connected video input output terminal 37, and a bus structure 25 to which the CPU 27, RAM 29 disc controller 31, and interface 35 are connected. The bus 25 is known in the industry as an S-100 bus having 100 communication lines respectively connected to a like number of terminal pins. Some of the communications lines are dedicated to signals for communicating among the various devices contained within the computer system 23, while others are provided for allowing the computer system 23 to communicate with external devices connected thereto.

Master controller 19 working in conjunction with controller interface 15 provides the necessary signals between computer system 23 and section switches 17 which enables the computer system (more particularly CPU 27) to address and take data from or provide data to a selected one of the information channels 10, e.g. wire pairs, located at the remote stations 11. Data is acquired from or sent to the remote stations 11 by means of the section switches 17 which are connected to the remote stations via a system bus 13 and communication channels, e.g. wire pairs, 12.

Each section switch 17 contains two identical portions which connect with respective communications channels and up to 16 separate remote stations can be attached to each communiations channel. If 16 remote stations are connected to each communications channel and 16 section switches are provided, each handling two communications channels, a total of 512 (16×16×2) remote stations can be handled by the system. If each remote station in turn has 16 information channels thereat, the computer system 23 can then address any one of 8,192 information channels (256 information channels for each communications channel).

The information channels 10 may have various sensors S or operative devices D connected thereto, the outputs or inputs of which are directly connected to the computer system 23 through the section switches 17 and A/D converter 21 when the information channel 10 corresponding thereto is addressed by the computer system 23. Data coming from the information channels via the remote stations 11 is converted to digital data by analog to digital converter 21 prior to entering computer system 23 which stores the digitized data.

Addressing of the remote stations 11 and the information channels 10 thereat is accomplished by sequentialy sending tone bursts down a communications channel 12 to which a group of remote stations is connected. The tone bursts are received by each of the remote stations of the group simultaneously, but each station is only enabled by a preassigned numerical range of tone bursts (an address). Upon receipt of the sequential tone bursts in its preassigned numerical range, a remote station sequentially connects each of its information channels 10 to the communications channel. For example, a first remote station may only respond to the first 16 tone bursts transmitted to it to sequentially connect, upon each occurrence of a tone burst, a respective information channel 10 to the communications channel. Other tone bursts outside the assigned numerical range which are received by that remote station do not cause connection of any of its information channels 10 to the communications channel. The next remote station of the group may be responsive, for example, to the next sequence of 16 tone bursts, the third remote station responsive to the next 16 tone bursts, etc.

Thus, for any given communications channel interconnecting a section switch 17 with a group of remote stations, each of the remote stations of the group can be addressed by cycling through a predetermined number of tone bursts. If 16 remote stations each containing 16 information channels are connected to each communications channel, a total of 256 tone bursts will serve to address and sequentially connect each of the information channels to the communications channel. By repeating the sequence of 256 tone bursts, the remote stations and information channels thereat can be continually addressed by computer system 23. Moreover, the sequential addressing tone bursts can be sent simultaneously over all the communications channels so that every tone burst sent will cause 32 addressed information channels to be connected to the central station over 32 communications channels. A more detailed description of the component parts of the FIG. 2 system now follows.

REMOTE STATIONS

Figure 2:
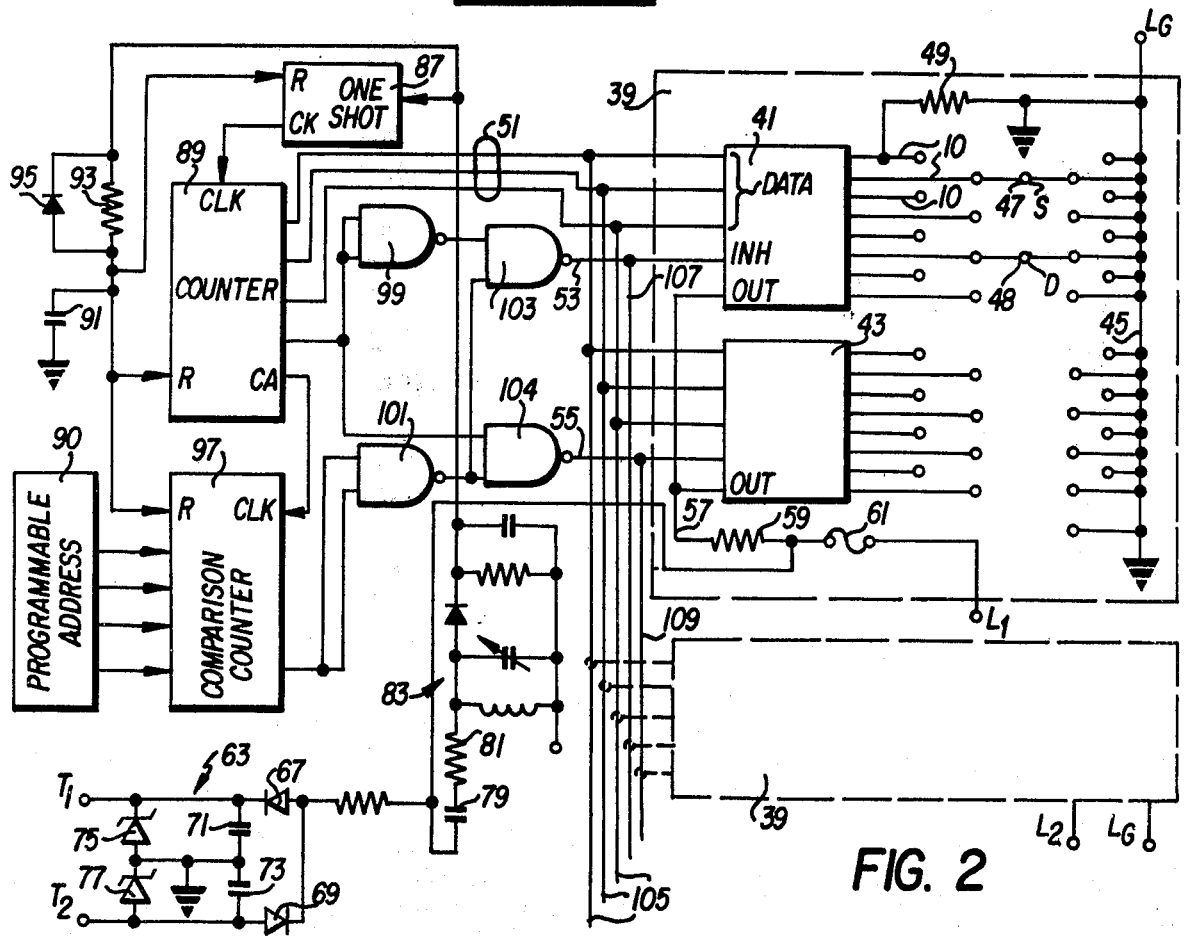
FIG. 2 is a schematic diagram of the remote stations illustrated in FIG. 1.

A better understanding of the addressing of the remote stations 11 can be seen with reference to FIG. 2 which shows the remote station apparatus. Terminals LG and L1 respectively represent the connection points of the remote station to the communications channel which leads to a section switch 17. For the purpose of further discussion, it will be assumed the information channels 10 and communications channel 12 are wire pairs, but other types of communications links can also be employed. The section switch itself will be described in more detail below.

The information channels 10 comprise a plurality of terminal pairs across which various sensors S or operative devices D can be connected. For purposes of illustration, a sensor 47 and operative device 48 have been shown as being respectively connected to the second and sixth information channels of the remote station illustrated. Each of the information channels 10 can be tone burst addressed in sequence and when addressed are connected by analog switches 41 and 43 to an output line 57 which is in turn connected through resistor 59 and fuse 61 to terminal L1. The terminal LG is a ground terminal at the remote station.

Terminal L1 is also connected through fuse 61, a capacitor 79, and a resistor 81 to a tuned circuit 83 which reacts to the frequency of the tone bursts on the line L1. Each time a tone burst of the proper frequency, e.g. 100 KHz, occurs, the output of tuned circuit 83 applies a signal to the input of one shot multivibrator 87 which responds by outputting a clock pulse to the clock input of counter 89.

Counter 89 is a 1 of 16 counter which supplies data output signals corresponding to the instantaneous value counted. These output signals occur on lines 51 which are connected to analog switches 41 and 43, and control which information channel 10 is connected to output line 57. An additional data line from counter 89 is provided to the inputs of NAND gates 99 and 104. The output of NAND gate 99 is connected to the input of NAND gate 103. NAND gates 103 and 104 are respectively connected to inhibit inputs of analog switches 41 and 43 and accordingly serve as "enabling" gates controlling whether switches 41 and 43 are operative or not. When operative, switches 41 and 43 connect one of the information channels 10, as determined by the data inputs thereto from counter 89, to the output line 57.

Gates 103 and 104 will remain off as long as there is no output signal from NAND gate 101. The latter gate is connected to the output of a comparison counter 97 which receives as inputs the output of a programmable address device 90 and the carry output of counter 89. As counter 89 cycles through its 16 count positions, it generates a carry output signal each time it completes a counting cycle. Comparison counter 97 counts the carry outputs, and when the counted number of carry outputs equals the count value set by programmable address device 90, it provides an output signal to gate 101 causing gates 103 and 104 to enable analog switches 41 and 43. The programmable address device 90 determines the address of the remote station, or stated otherwise, the numerical tone burst range (number of tone bursts) to which the remote station responds. Thus, each group of 16 tone bursts appearing on line L1 will be directed to a particular remote station. By changing the programmable address in device 90 by a digital value of "one" for each successive remote station, each group of 16 tones appearing on line L1 will address a different remote station by the output of the respective comparison counter 97. In addition, each tone burst in the tone burst group will address the information channels 10 at an addressed remote station by the data output of counter 89.

Each remote station also includes a timing circuit including capacitor 91, resistor 93 and a diode 95 in parallel with resistor 93. This timing circuit responds to a tone burst appearing on line L1 for a predetermined time duration longer than the time duration of the tone bursts which are used to address the information channels. The purpose of this timing circuit is to recognize a reset tone burst placed on the communications channel by the central station and to produce a reset signal to comparison counter 97, counter 89 and one shot multivibrator 87. The central station sends this reset tone burst just prior to sending another complete addressing sequence of tone bursts, e.g. 256 tone bursts. This ensures that all remote stations will be reset prior to the occurrence of the next (first) addressing tone burst of the next tone burst sequence on the line. Since the addressing tone bursts are of much shorter duration than the reset tone burst, the timing circuit will not respond to them and thus counters 89 and 97 are free to perform their counting functions in response only to the addressing tone bursts.

Each remote station is self-powered and includes a power supply circuit 63 which consists of a pair of oppositely polled diodes 67 and 69 connected to the opposite ends of a pair of series connected capacitors 71 and 73. The opposite ends of the series connected capacitors in turn are connected across a series pair of Zener diodes 75 and 77 with the connection point between the capacitors 71 and 73 and Zener diodes 75 and 77 being connected together and to ground. A pair of terminals T1 and T2 are connected to opposite ends of the Zener diodes and provide operative power to switches 41 and 43, all of the gates, one shot multivibrator 87, counter 89, comparison counter 97 and programmable address device 90. Power supply circuit 63 derives operative power from the tone bursts which are supplied on line L1 from the central station and in this manner, a separate remote station power supply is not required.

FIG. 2 also illustrates the information channel switching portion of each remote station by a numeral 39. In some instances, for example where the outputs of two or more sensors are to be simultaneously connected to the central station over respective communications channels, a plurality of switching portions 39 at a remote station are connected in parallel. Thus, a remote station can have one or more switching portions 39 connected to the outputs of counter 89 and gates 103 and 104, as illustrated in FIG. 2. Each additional switching portion 39 would have its own information channels 10, input and output terminals corresponding to LG and L1, but all may derive their operative power from a common power supply circuit 63.

Two switching devices 39 could be used, for example, to simultaneously connect a current sensor connected to one device 39 and a voltage sensor connected to the other to the central station so that instantaneous power could be calculated (V×I).

Because of the relative simplicity of the circuit used and the self-contained power supply, the remote stations may be constructed as low cost modular units of identical construction, the only difference between units being in the address assigned thereto by the programming of address device 90.

A calibration resistor 49 is also shown connected to the first information channel 10. By periodically checking this fixed resistance value when the first information channel is connected to the central station, the central station can ensure that there has been no significant change in the condition of a communications channel. In other words, resistor 39 is used as a calibration standard to diagnose faulty line conditions.

As noted, a group of remote stations 11 may be commonly connected to a single wire pair forming a communications channel to the central station. Thus, the terminals LG and L1 for a plurality of remote stations may be connected in parallel to the communications channel which goes to a section switch 17. Moreover, a plurality of communications channels, each having a group of remote stations connected to it, may be used. To further illustrate the connection of the communications channels to the section switches, reference will be made to FIGS. 3 and 4 which show in detail in construction of each section switch 17. However, before further describing the structures of the section switch 17, as well as the remaining portions of the system, it is necessary to understand some of the bus line labeling and nomenclature which will be used.

BUS STRUCTURE

FIGS. 3 to 8 show various circuits connected to terminal areas designated as follows:

where N is a number. These designations throughout the drawings refer to pin terminals. When appearing on the drawings for the master controller 19 (FIG. 7) and the analog to digital converter 21 (FIGS. 8A and 8B) they identify pin terminals on the S-100 bus 25. When appearing on the drawings for the controller interface 15 (FIGS. 5, 6A and 6B) and the section switches 17 (FIGS. 3 and 4) they identify terminals on system bus 13.

To further facilitate description of the application, a brief description of the pin terminals used on both the S-100 bus 25 and the system bus 13 follows:

| S-100 Bus Addressing and Data Signals | | | | | |
|---|---|---|---|---|---|
| CPU 27 Address Lines | Pin Designation | Data Output Lines From CPU 27 | Pin Designation | Data Input Line To CPU 27 | Pin Designation |
| A0 | 79 | D00 | 36 | DI0 | 95 |
| A1 | 80 | D01 | 35 | DI1 | 94 |
| A2 | 81 | D02 | 88 | DI2 | 41 |
| A3 | 31 | D03 | 89 | DI3 | 42 |
| A4 | 30 | D04 | 38 | DI4 | 91 |
| A5 | 29 | D05 | 39 | DI5 | 92 |
| A6 | 82 | D06 | 40 | DI6 | 93 |
| A7 | 83 | D07 | 90 | DI7 | 43 |

| Control Signals | | |
|---|---|---|
| Control Signal | Pin Designation | Control Signal Description |
| $\overline{PWR}$ | 77 | Timing signal generated by CPU during output operation indicating valid data is on S-100 bus |
| SINP | 46 | Signal applied to S-100 bus by CPU during a data input operation |
| SOUT | 45 | Signal applied to S-100 bus by CPU during a data output operation |
| PDBIN | 78 | Signal provided by CPU indicating its reading of data from S-100 bus |
| PRDY | 72 | Signal placing CPU in wait state; generated by devices external to CPU 23 |
| $\overline{PINT}$ | 73 | Interrupt request line requesting interrupt of CPU |
| VI6 | 10 | Highest Priority interrupt (master interrupt) to CPU |
| VI5 | 9 | Next highest Priority interrupt (sensor interrupt) to CPU |
| VI4 | 8 | Lowest Priority interrupt (sampling interrupt) to CPU |
| CLK | 24 | System clock 4 MHz |
| PSYNC | 76 | Synchronizing signal generated by CPU during input/output cycles |
| $\overline{POC}$ | 99 | System reset signal synchronized to CPU clock |

System Bus 13

The system bus 13 may also be a 100 pin bus, but the signals on the various pin terminals are different from those on the S-100 bus. For system bus 13, the pin designations and corresponding signals are as follows:

| Addressing and Data Signals | | | | | |
|---|---|---|---|---|---|
| Data Output Lines From CPU 27 | Pin Designation | Data Input Lines To CPU 27 | Pin Designation | CPU 27 Address Lines | Pin Designation |
| D0Ø | 36 | DIØ | 95 | AØ | 79 |
| D01 | 35 | DI1 | 94 | A1 | 80 |
| D02 | 88 | DI2 | 41 | A2 | 81 |
| D03 | 89 | DI3 | 42 | A3 | 31 |
| D04 | 38 | DI4 | 91 | | |
| D05 | 39 | DI5 | 92 | | |
| D06 | 40 | DI6 | 93 | | |
| D07 | 90 | DI7 | 43 | | |

The system data bus 13 also includes pin terminals for the output lines of one or more analog to digital converters. These output lines, ADØ ... AD9, are connected to the pins of system bus 13 as follows:

| Analog to Digital Converter Outputs | Pin Designations |
|---|---|
| ADØ | 74 |
| AD1 | 75 |
| AD2 | 76 |
| AD3 | 82 |
| AD4 | 83 |
| AD5 | 84 |
| AD6 | 85 |
| AD7 | 86 |
| AD8 | 87 |
| AD9 | 37 |

The 32 incoming wire pairs from the remote stations 11 may be grouped into four groups of 8 incoming lines each as follows: S0L0 ... S7L0; S0L1 ... S7L1; S8L0 ... S15L0; and S8L1 ... S15L1. These incoming lines are respectively assigned to the pins of bus 13 as follows:

| Incoming Lines from Remote Stations | Pin Designation |
|---|---|
| SØLØ | 3 |
| S1LØ | 5 |
| S2LØ | 8 |
| S3LØ | 10 |
| S4LØ | 13 |
| S5LØ | 15 |
| S6LØ | 18 |
| S7LØ | 20 |
| SØL1 | 4 |
| S1L1 | 6 |
| S2L1 | 9 |
| S3L1 | 11 |
| S4L1 | 14 |
| S5L1 | 16 |
| S6L1 | 19 |
| S7L1 | 21 |
| S8LØ | 53 |
| S9LØ | 55 |
| S10LØ | 58 |
| S11LØ | 60 |
| S12LØ | 63 |
| S13LØ | 65 |
| S14LØ | 68 |
| S15LØ | 70 |
| S8L1 | 54 |
| S9L1 | 56 |
| S10L1 | 59 |
| S11L1 | 61 |
| S12L1 | 64 |
| S13L1 | 66 |
| S14L1 | 69 |
| S15L1 | 71 |

Bus 13 also contains various control signal lines containing signals generated by various portions of the system as follows:

| Control Signals | Pin Designation | Description of Signal |
|---|---|---|
| SS | 23 | CPU signal to clock automatic digital gain control through various gain values |
| V Test | 24 | Supplies a test voltage to various portions of the system for testing purposes |
| 15 Khz | 25 | A clocking signal used by portions of the system. |
| SSPCL | 26 | A reset signal used to reset the automatic digital gain control system |
| IFI0 | 28 | Decoded address from the CPU used to designate a controller interface input/output operation |
| $\overline{SSADOFF}$ | 30 | Control signal sent by CPU to control on/off operation of A to D converter on section switch |
| LINESEL | 32 | Decoded address from CPU which conditions section switches for line assignment |
| CFGSCL | 44 | Control signal sent by CPU to condition the section switches to configure them to operate on a split or nonsplit bus configuration |
| $\overline{SSIO}$ | 45 | Decoded address from CPU which conditions section switches for input/output operation |
| $\overline{ACGRD}$ | 46 | Control signal sent by CPU to activate offset voltage compensation in multiplying circuit of section switch |
| $\overline{SSP}$ | 47 | Control signal sent by CPU to enable automatic digital gain control circuit |
| 500 Khz | 48 | Another clocking signal used by portions of the system |
| Tone Signal | 49 | A gated tone signal used for addressing and control of remote stations |
| $\overline{PWR}$ | 77 | Same as $\overline{PWR}$ on S-100 bus |
| PDBIN | 78 | Same PDBIN on S100 bus |
| $\overline{ACMEN}$ | 97 | Control signal sent by CPU to condition section switches |

| Control Signals | Pin Designation | Description of Signal for AC measurements |
|---|---|---|

-continued

SECTION SWITCH

Figure 3:
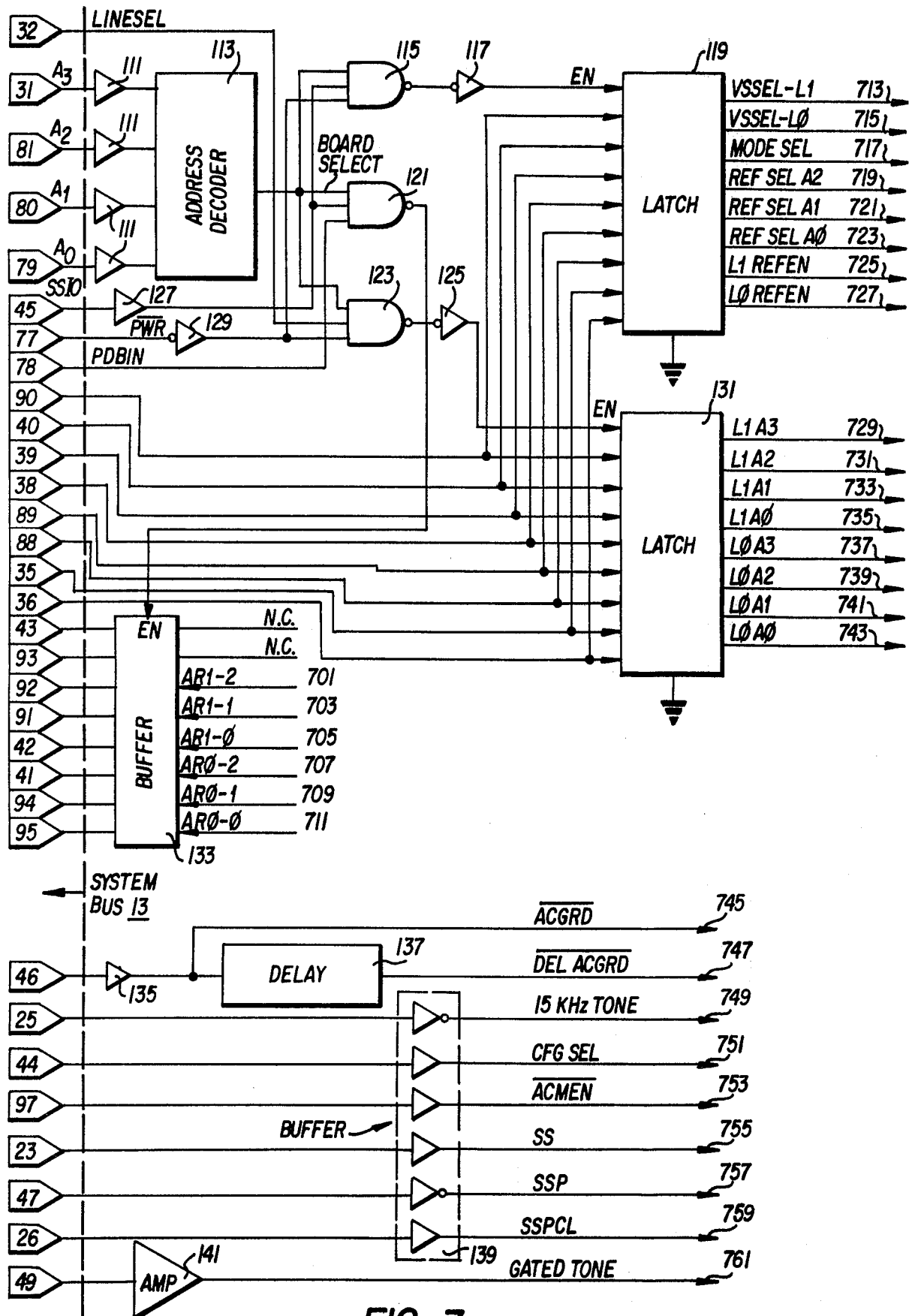
FIGS. 3 and 4, take together, form a schematic diagram of one of the section switches illustrated in FIG. 1.
Figure 4:
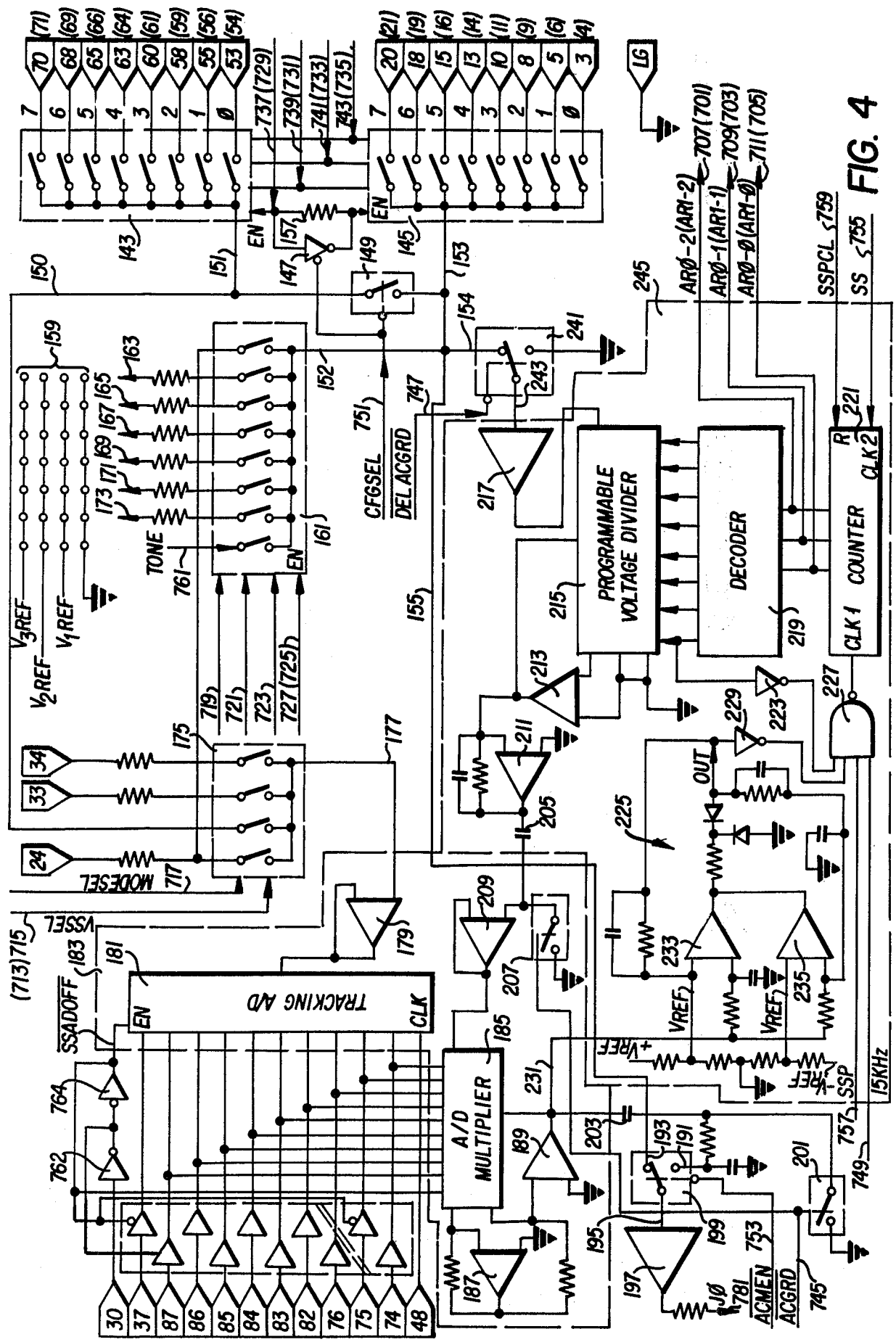

Each section switch includes two identical switching and signal processing portions shown in FIG. 4, which are respectively connected to different communications channels (input lines). The two identical section switch portions in turn share a common addressing and control signal generating portion, illustrated in FIG. 3.

Since FIG. 4 represents two identical section switch circuits, the unparenthesized line labels (numbers) are for one of the two circuits, and those in parenthesis are for the other circuit.

Each section switch portion (FIG. 4) is connected to 16 of the 32 incoming lines with the other identical portion being connected to the remaining 16 incoming lines. Since each section switch portion (FIG. 4) only services one of the 16 lines connected thereto, a pair of analog selection switches 143 and 145 is used to connect one of the 16 incoming lines to the remainder of the section switch circuit. The selecting data inputs to analog switches 143 and 145 are taken from lines 737, 739, 741 and 743 which are taken from the output of a latch 131 in FIG. 3. The data inputs to latch 131 originate from CPU 27 data output lines and are applied to the S-100 bus 25 and are also connected to system bus 13 pins 90, 40, 39, 38, 89, 88, 35 and 36 by the controller interface 15 as described in more detail below.

Half of the output data lines (737, 739, 741, 743) of latch 131 are coupled in parallel to analog switches 143 and 145 of one section switch portion. The other data output lines 729, 731, 733 and 735 are applied to the analog switches of the other section switch portion. Line 737 which is coupled to the enable input of switch 143 is also coupled through an inverter 147 to the enable input of switch 145. Line 737 serves to select one of the two switches 143 and 145 for operation, while the remaining three data input lines 739, 741 and 743 serve to connect one of the input lines to respective switches 143 and 145 to respective output lines 151 and 153.

During system initialization, CPU 27 assigns a section switch portion to one of the incoming lines connected thereto by addressing and supplying data to latch 131. Once initialization is completed, the section switch remains connected to the incoming line to which it was assigned.

Inverter 147 can be disabled by a control signal CFGSEL applied to line 751, in a manner described further below, so that the signal applied to line 737 will enable both analog switches 143 and 145 at the same time. In certain applications, it is desirable that each section switch portion illustrated in FIG. 4 be capable of communicating with two lines simultaneously. For example, if one incoming line was coupled to a voltage sensor and the other to a current sensor at a remote station, a section switch portion could simultaneously process current and voltage information to calculate the power being monitored at a remote station. This so-called "split-bus" configuration, is set by the CPU which addresses a latch 371 in the controller interface supplying thereto a signal CFGSEL which is applied to the section switches by a pin 44 of system bus 13. Each section switch receives the signal CFGSEL from pin 44 (FIG. 3) and applies it to line 751 to control switch 149.

When it is desired to have a "split-bus" configuration, the CFGSEL signal instructs switch 149 to open while for a normal bus configuration the switch 149 remains closed. Signal CFGSEL also controls operation of inverter of 147 so that when a split-bus configuration is desired both switches 143 and 145 are simultaneously enabled to pass one of the incoming lines respectively connected thereto to the respective output lines 151 and 153.

The output line 151 of analog switch 143 is connected to an input signal path 150 which is connected to one of the switch terminals of analog switch 175. The output line 153 of analog switch 145 is connected to input signal line 155 directly and through switch 241 to input signal line 243.

When a sensor which is connected to a section switch via an information channel and an incoming line outputs a DC voltage which is to be measured by the system, it is applied to line 155 which is connected as one of the input terminals to switch 199. When switch 199 is in the position illustrated in FIG. 4 this DC voltage from the sensor is passed through buffer amplifier 197 to an output line 781 (J$\emptyset$) which is one of thirty two input lines to the A/D converter 21 illustrated in FIG. 1. Switch 199 is controlled by a signal $\overline{\text{ACMEN}}$ signal applied to line 753 which controls whether an AC measurement or DC measurement is to be performed. The signal $\overline{\text{ACMEN}}$ is applied to the section switches via a system bus pin 97 which receives it from a latch 373 in the controller interface which is addressed and sent data by CPU 27 in a manner more fully described below. When the signal $\overline{\text{ACMEN}}$ has an opposite polarity than that which places switch 199 in a position illustrated in FIG. 4, the output line 195 of this switch is connected to input 191 which in turn is connected to the output of an AC power measurement circuit which is also more fully described below.

Since the output from various sensors connected to the information channels of the remote stations may differ widely in terms of the type of output generated, i.e. a changing resistance or a changing voltage, as well as in the level of the output signal, the section switches incorporate a voltage offset compensation circuit for adding to the sensor output a predetermined DC voltage level which serves to normalize the sensor output voltages to be within a predetermined voltage range, or to convert a resistance sensor output to a voltage signal. The voltage offset compensation is provided by an analog switch 161 and jumper selectable reference voltage bus 159. Analog switch 161 contains a plurality of inputs 163, 165, 167, 169, 171 and 173 which can be jumper connected through respective resistors to one of four reference voltage lines provided at bus 159. For example, the four lines illustrated may respectively receive voltages of 0, 2.5, 5 and 10 volts.

Two additional inputs to analog switch 161 are from line 761 which receives a tone burst signal from the controller interface 15 and from pin 24 which receives a test voltage as described below. Thus, the output of analog switch 161 can be any one of the reference voltages to which lines 163 . . . 173 are connected, the test voltage, or the tone on line 761. The tone burst is used for addressing the information channels at the remote stations, and can also be used to control an operative device connected to an addressed information channel. The addressing and control tone bursts are at different frequencies and the manner of generating frequency tones will be described below with reference to the controller interface 15.

The output 152 of analog switch 161 is selectively connected to one of the inputs by means of signals applied to control lines 719, 721, 723 and 727 (725 for the other section switch portion). The latter signal is an enable signal while the first three signals cause selection of one of the input lines to switch 161 to be connected to output line 152. The signals on lines 719, 721, 723 and 727 originate from latch 119 of the section switches (FIG. 3) which is coupled to the data output lines of CPU 27 through the system bus 13 and the S-100 bus 25. CPU 27 addresses latch 119 and sends to it data enabling switch 161 and instructing it to connect a predetermined one of its inputs to its output. Assuming for the moment that the output of switch 161 is one of the reference voltages contained on the input lines, this reference voltage is supplied to input path 155 (through an associated resistor) which is receiving the output (voltage or resistance) from a sensor. If the sensor output is a changing resistance, the reference voltage will be divided between the resistance of the sensor and resistance associated with the selected reference voltage to supply a D.C. voltage on line 155 which varies with a change in sensor resistance. The voltage on line 155 is supplied to line 193 of switch 199 and through amplifier 197 to line 781 (J$\emptyset$) which, as noted, is applied as one of thirty-two inputs to the A/D converter 21 (FIG. 1).

A principle feature of the system of the invention is its ability to monitor power consumed in an electrical path located at a remote station. For this purpose, a current sensing transducer (sensor) is coupled to an information channel at a remote station and its output is multiplied by a signal representing a voltage on the monitored electrical path to produce a signal representing power consumed. To perform the power calculation, each section switch portion illustrated in FIG. 4 includes AC measurement structures. Included are a power calculation circuit identified by dotted block 183 in FIG. 4 which performs actual power calculations and an automatic digital gain control circuit identified by dotted block 245 in FIG. 4, which is used to ensure that the calculated power value falls within a predetermined digitizing range of A/D converter 21 (FIG. 1).

For AC measurements, switch 199 is switched by the signal $\overline{ACMEN}$ from CPU 27 to a position where output line 195 is connected to input line 191. Input line 191 is connected to the output of amplifier 189 which receives at its input the output of amplifier 187, which in turn receives at its input the output of an analog-to-digital multiplier 185. Multiplier 185 and amplifiers 187 and 189 form a so-called "four quadrant multiplier". Multiplier 185 calculates power consumption by multiplying a digital representation of a voltage by an analog representation of current in a monitored electrical path. The current signal originates from a current sensor having a voltage output which changes with sensed current and is applied to the input terminal 154 of switch 241, the output 243 of which is connected to an amplifier 217. The output of amplifier 217 is connected to the input of a programmable voltage divider 215 having an output connected to the input of an amplifier 213. The output of amplifier 213 is connected to the input of an amplifier 211, the output of which passes to amplifier 209 through a capacitor 205. The output of amplifier 209, which is a voltage representative of sensed current, is applied to an analog input of analog/digital multiplier 185. A digitized voltage input is also applied, via a plurality of digital input lines, to multiplier 185.

The digital voltage input to multiplier 185 is received from a tracking analog to digital converter 181 which receives as an input signal the output of an amplifier 179 which receives on its input line 177 a voltage which represents the voltage on the electrical path at the remote station which is being monitored. This voltage can be obtained from a number of sources and for this reason an analog switch 175 is provided for selectively connecting one of four inputs thereto to its output which is connected to input line 177 of amplifier 179. The input voltage to converter 181 can be taken from pins 33 or 34 of the system bus 13 or from line 150 which is connected to output 151 of switch 143. As described earlier, the computer can configure switches 143 and 145 so that they are both simultaneously enabled allowing each of output lines 151 and 153 to be connected to a respective section switch input line. In this "split bus" configuration switch 149 is also activated to uncouple the outputs of lines 151 and 153 so that the output on line 151 is connected as an input to switch 175. This allows a remote station voltage sensor connected to one of the section switch input lines to be used as the voltage input to the tracking analog to digital converter 181, while one of the input lines to switch 145 supplies the output of a current sensor at the remote station.

As an alternative manner for generating a voltage representative of that at the electrical path being monitored, the electrical service entrance to a building can be tapped for a voltage which represents the voltage at the monitored electrical path. System bus 13 pins 33 and 34 which are inputs to switch 175 provide a voltage which is taken from the service entrance. A more detailed description of how these voltages are applied to pins 33 and 34 follows in the detailed description of the controller interface.

Switch 175 connects one of the inputs thereto to line 177 under control of signals MODESEL and VSSEL applied to lines 715 (713 for the other half of the section switch) and 717. These signals originate at latch 119 (FIG. 3) and are supplied thereto by CPU 27 which addresses the latch. The CPU thus determines which of the voltage inputs to switch 175 is used by the tracking A to D converter 181. Switch 175 also has an additional voltage input which is received from pin 24 of the system bus 13. This is a test voltage pin which can also be selected under control of the CPU by the MODESEL and VSSEL signals for testing purposes.

Before reaching the analog input of multiplier 185, the sensor current output passes through an automatic digital gain control circuit 245. This circuit ensures that the multiplied output of the four quadrant multiplier remains within the digitizing range of analog to digital converter 21. It automatically decreases the level of signal applied as an analog input to multiplier 185 until the output of multiplier 185 is within a predetermined signal range set by a window comparator.

Gain control circuit 245 receives as an input on line 231 the output of the four quadrant multiplier and supplies this output to a window comparison circuit 225 consisting of a pair of comparison amplifiers 233 and 235. Window comparator 225 determines if the output of the multiplier is within a predetermined range. If it is not, an output signal is applied through inverter 229 to gate 227 as an enable signal allowing gate 227 to pass 15 KHz clocking signals on line 749 to the clock terminal of counter 221. These clocking signals originate in the controller interface. As a result, the counter counts clock pulses occurring at a 15 KHz rate whenever the signal at the output of the four quadrant multiplier exceeds a predetermined signal level range.. Counter 221 also receives as an alternate clock input a signal SS on line 755 which is received from pin 23 of system bus 13 (FIG. 3). This signal originates from a latch 371 provided in the controller interface which is addressed and sent data by CPU 27 as described further below.

A reset terminal is also provided on counter 221 which is connected to line 759 which receives the control signal SSPCL from system bus 13 pin 26. This signal originates at a one shot multivibrator 383 (FIG. 6A) provided in the controller interface. Reset signal SSPCL is generated by the one-shot multivibrator at the leading edge of a control signal SSP supplied to a latch 373 in the controller interface by CPU 27. Signal $\overline{SSP}$ is also supplied as an enabling signal to gate 227.

The digital output of counter 221 is sent to a decoder 219 which supplies a digital representation of the counter 221 contents to a programmable voltage divider 215. Programmable voltage divider 215 and amplifier 213 together determine the gain applied by the automatic gain control circuit 245 to an applied input signal. The multiplying factors of amplifiers 213 and 211 are such that the maximum gain of automatic gain control circuit 245 is 32. However, this gain factor is reduced by the programmable voltage divider 215 so that the output signal from amplifier 211 may have a gain of 32 or gains of 16, 8, 4, 2, 1, 0.5, or 0.25 as determined by the output of decoder 219. Programmable voltage divider 215 can be formed by a multiplying analog to digital converter similar to that used as multiplier 185.

The SSPCL reset signal applied to counter 221 on line 759 is received from one shot multivibrator 383 in the controller interface as described earlier. The one shot multivibrator 383 supplies a pulse to reset the automatic gain control circuit 245 to maximum gain when CPU 27 instructs the setting of the automatic gain control circuit 245 via the SSP signal applied to line 757, and to one shot multivibrator 383.

As noted, the automatic digital gain control circuit 245 is rendered operative by the $\overline{SSP}$ signal applied to line 757 which enables gate 227 and thus counter 221 to begin counting clock pulses applied to line 749. Whenever window comparator 225 detects a voltage outside a suitable range of the analog to digital converter 21, gate 227 is enabled to pass the clock pulses to the clock input of counter 221. Accordingly, counter 221 steps through its counting states to progressively decrease the gain factor applied to the signal on line 243 until window comparator 225 provides an output signal indicating that the output of the four quadrant multiplier is within a suitable conversion range. When this occurs, the output of the window comparator passes through inverter 229 and disables gate 227. This stops the supply of clocking signals to counter 221 which remains in its last counting state which decoder 219 applies to the programmable voltage divider 215 leaving it in a particular voltage dividing state.

As counter 221 cycles through its counting states, decoder 219 may eventually instruct programmable voltage divider 215 to divide by its highest dividing value. This is detected by inverter 223 which operates to inhibit gate 227 from providing any further clock pulses to counter 221. Thus, when the programmable voltage divider is cycled through to its highest dividing value, counter 221 is inhibited so that no further changes occur and the programmable voltage divider remains set in its highest dividing (lowest gain) position.

An alternate clock input CLK2 also provided on counter 221 which is connected to line 755 which receives the control signal SS from system bus 13 pin 23 as described previously. This signal, composed of a series of pulses, is sent by the latch 371 under the control of CPU 27 to set the counter 221 to a previously determined state which sets the automatic digital gain control circuit 245 to a desired gain setting rather than allowing the automatic setting of the gain as described previously. This would normally only be done for test purposes.

CPU 27 receives the output data value from counter 221 via lines 707, 709 and 711 (701, 703 and 705 for the other half of the section switch). This data is furnished through buffer 133 (FIG. 3) to the system data bus 13 which in turn furnishes it to the S-100 data bus as inputs to the CPU 27. In this manner, the CPU 27 receives data representing the amount of attenuation applied to the output signal of amplifier 217. This attenuation value is used by the CPU 27 when it determines actual power consumed at a remote location, since the digitized value of current multiplied by voltage provided by the four quadrant multiplier will have been reduced by a factor corresponding to the output of counter 221.

An undesirable by-product of the current sensor signal path through the automatic gain control circuit 245 and into multiplying A/D converter 185 is a DC offset voltage produced by the various amplifiers in the chain. To compensate for these offset voltages, capacitors 205 and 203 are respectively provided in the outputs of amplifier 211 and 189. Prior to the occurrence of an AC power measurement, these capacitors are allowed to charge to the inherent offset voltages by connecting the output side of each to ground while at the same time grounding the AC path input 243 through switch 241 using control input 747 more fully described below. The outputs of capacitors 205 and 203 are grounded by respective switches 207 and 201 which are activated by CPU 27 prior to an AC measurement being taken. After capacitors 205 and 203 are charged to the DC offset voltages, their connection to ground is removed by CPU 27 opening switches 207 and 201 so that the accumulated charge on capacitors 205 and 203 acts inversely to cancel the offset voltage. Operation of switches 207 and 201 is controlled by the CPU 27 which sends a signal $\overline{ACGRD}$ to the section switches from system bus 13 pin 46 (FIG. 3). This signal is furnished to latch 373 (FIG. 6A) in the controller interface by CPU 27 just prior to an AC measurement operation. This signal closed switches 207 and 201 for a period sufficient to charge capacitors 205 and 203 to the offset voltage, after which it is removed by CPU 27. A delayed version of $\overline{ACGRD}$, i.e. $\overline{DELACGRD}$, is generated by a delay circuit 137 provided in the section switches (FIG. 3) on line 747 which is supplied to switch 241. $\overline{DELACGRD}$ controls switch 241 to connect amplifier 217 input signal line 243 to line 154 a predetermined period of time after capacitors 205 and 203 are released from ground by $\overline{ACGRD}$. Accordingly, a sensor output signal is applied to the input of the automatic gain control circuit 245 only after capacitors 205 and 203 have been charged to the DC offset voltages.

FIG. 4 also shows that the input to the multiplying A to D converter 185 may come from system bus 13 pins 30, 37, 87, 86, 85, 84, 83, 82, 76, 75 and 74. These pins are connected to another tracking analog to digital converter provided in the controller interface 15 which can be used if a tracking A to D converter 181 is not provided in the section switches. The tracking A to D converter 181, when provided in the section switches in the manner illustrated in FIG. 4, is enabled by a signal applied to pin 30 of the system bus 13 which receives a signal $\overline{\text{SSADOFF}}$ sent by CPU 27 to latch 371 in the controller interface.

FIG. 3 illustrates the common section switch portion which supplies control signals to the two section switch circuits illustrated in FIG. 4.

The bottom of FIG. 3 shows various signal lines which are applied to FIG. 4 to control the configuration of the section switch portions. Line 761 contains a gated tone which is supplied to switch 161 (FIG. 4). The tone originates in the controller interface which contains circuitry controlled by CPU 27 for setting both the frequency and on/off period of the tone. The tone is supplied to pin 49 of the system bus. The tone is taken from pin 49 and amplified by amplifier 141. The remaining control signals on lines 745, 747, 749, 751, 753, 755, 757 and 759 and their origination have been described above and will not be repeated.

Figure 6A:
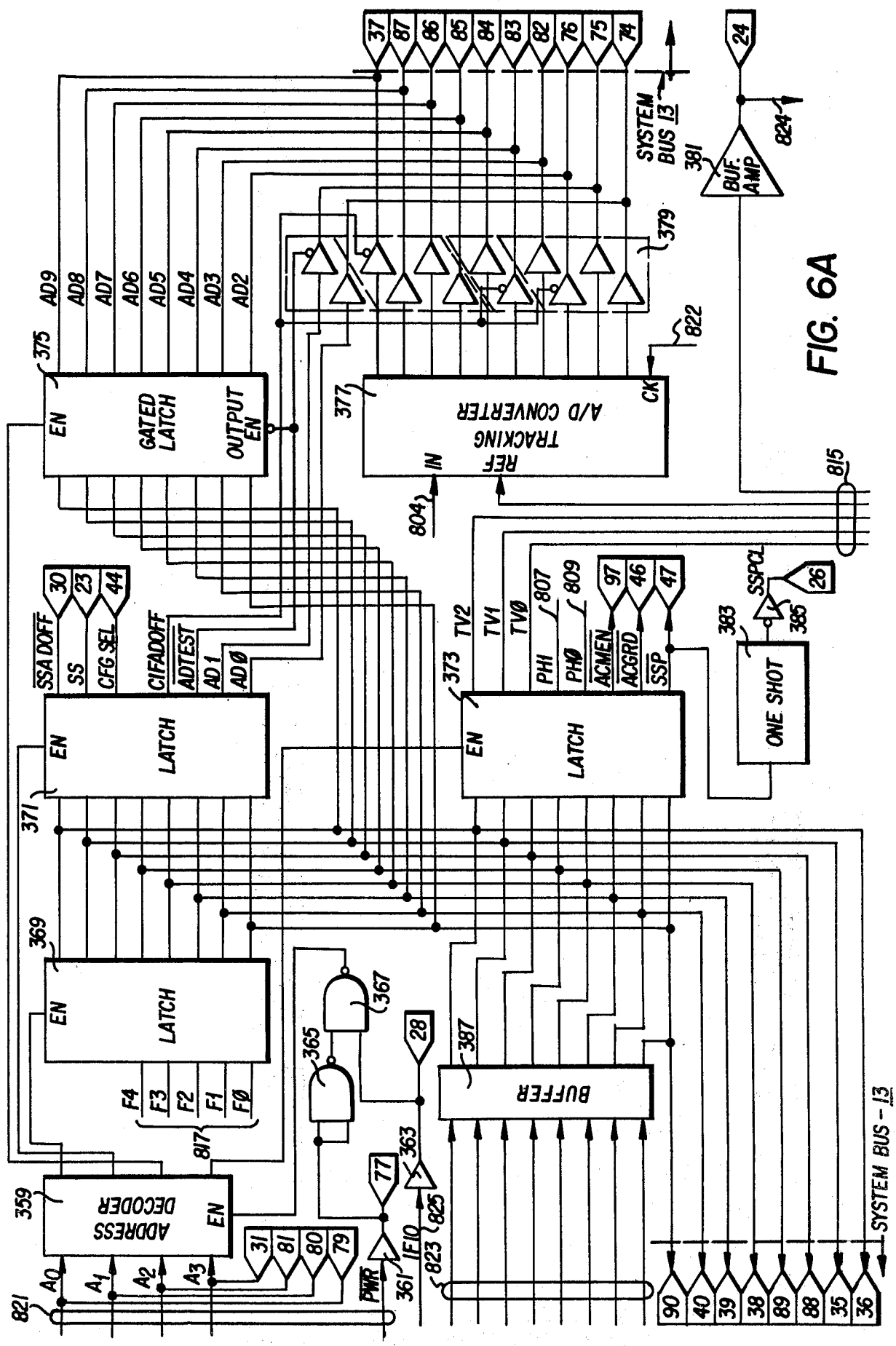
Figure 7:
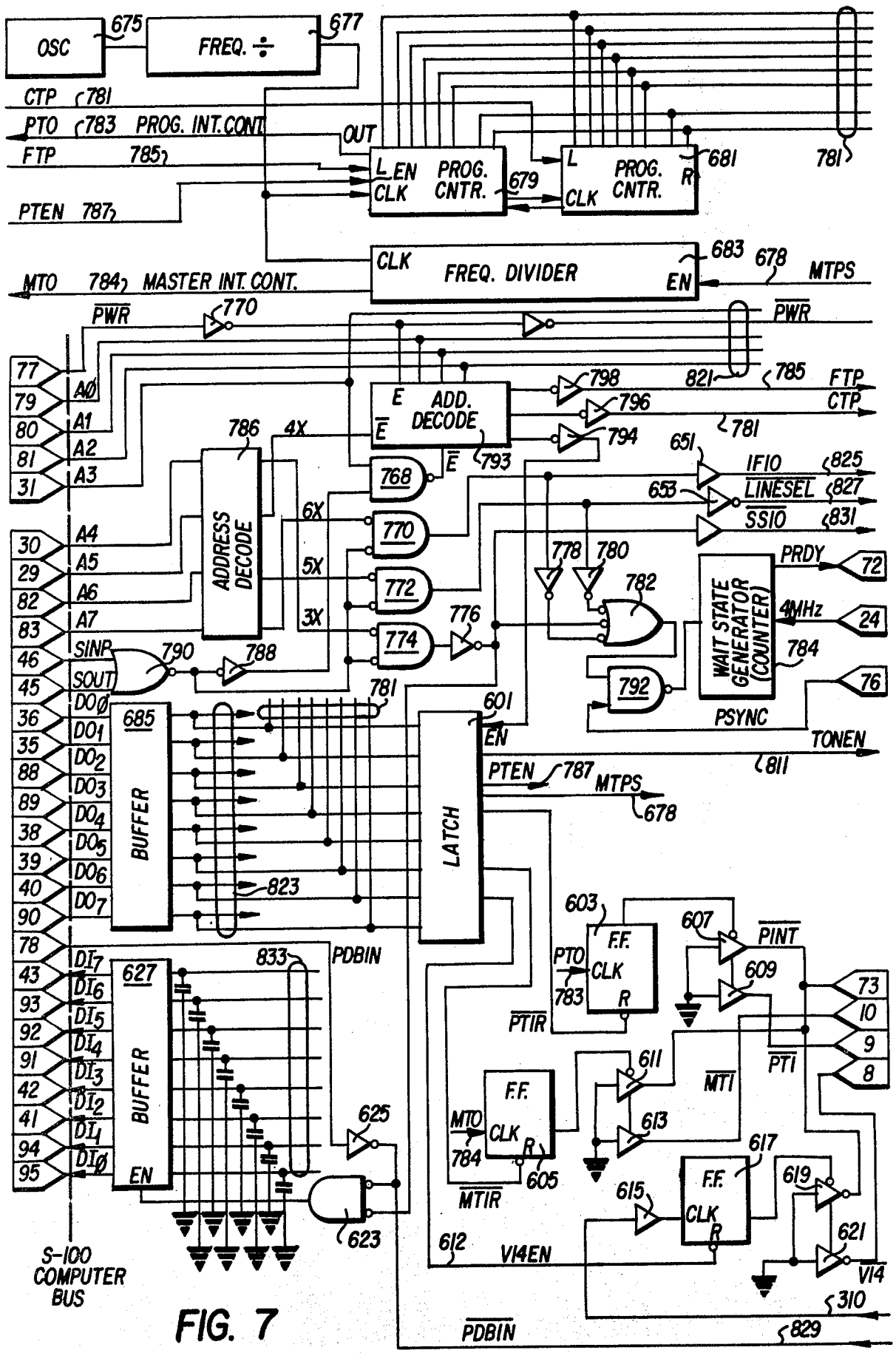
FIG. 7 is a schematic diagram of the master controller illustrated in FIG. 1.

As noted, each section switch is addressed by the CPU 27 which supplies data thereto and takes data therefrom. Data is received from the section switches through buffer 133 (FIG. 3) over lines 701, 703, 705, 707, 709, and 711 which represent the contents of the counters 221 contained in the two section switch portions (FIG. 4). The output of buffer 133 is supplied to pins 43, 93, 92, 91, 42, 41, 94, and 95 of the system bus 13. From there they are applied through buffer 325 of the controller interface (FIG. 5), buffer 627 of the master controller (FIG. 7) and the S-100 bus to the data input lines to CPU 27. Buffer 133 is enabled by NAND gate 121 which receives a section switch board select input from address decoder 113. Address decoder 113 is connected through buffers 111 to the address lines of pins 31, 81, 80 and 79 of the system bus 13 which are in turn connected to the address lines of the S-100 bus through lines 821 of the controller interface (FIG. 6A) and master controller (FIG. 7). Address decoder 113 receives addressing signals from CPU 27 and, when a particular section switch is addressed, supplies a board select signal to gate 121. Gate 121 also receives as enabling inputs thereto the output of buffer 127 which is connected to system bus 13 pin 45. The controller interface supplies a signal SSIO to pin 45 (FIG. 5) which is received from inverter 776 of the master controller (FIG. 7). The signal $\overline{\text{SSIO}}$ appears whenever any one of the 16 section switch latches 119 or buffers 133 is being addressed by CPU 27 and is used to condition the section switches for an input/output operation. Gate 121 also receives as an enabling input thereto a signal PDBIN on pin 78 of system bus 13. This signal is supplied to pin 78 by the controller interface which receives its inverted form from the master controller (FIG. 7), which in turn receives the signal PDBIN from pin 78 of the S-100 bus. The PDBIN signal is supplied by CPU 27 when it is reading data from the S-100 data input terminals. Thus, gate 121 is energized by a signal (BOARD SELECT) indicating it is being addressed, a signal requesting a section switch input/output operation ($\overline{\text{SSIO}}$), and a signal controlling the inputting of data to CPU 27 (PDBIN). When all three signals are present, buffer 133 is enabled to pass the signals on lines 701, 703, 705, 707, 709 and 711 to their respective system bus 13 pin terminals.

Latches 119 and 131 which respectively supply various control signals to the section switch portion illustrated in FIG. 4 are respectively enabled by the outputs of inverters 117 and 125. Inverter 117 receives the output of NAND gate 115. NAND gate 115 in turn receives enabling signals from the board select line from address decoder 113, the $\overline{\text{SSIO}}$ signal from pin 45 and a signal PWR from inverter 129 which receives the signal $\overline{\text{PWR}}$ from pin 77. The signal $\overline{\text{PWR}}$ at pin 77 is received from the controller interface, which in turn receives it from the S-100 bus pin 77 through the master controller. The $\overline{\text{PWR}}$ signal is a timing signal generated by CPU 27 indicating that data is on the S-100 bus for reception by a remote device.

NAND gate 115 responds to the presence of the three input signals to enable latch 119 to receive and latch data from the CPU 27.

NAND gate 123 enables latch 131 which also receives data from the CPU 27, supplying this to the section switch portion illustrated in FIG. 4. NAND gate 123 receives the board select output from address decoder 113, the $\overline{\text{PWR}}$ signal from inverter 129 and a line select (LINESEL) signal from pin 32 of the system bus 13. The LINESEL signal is applied to pin 32 by the controller interface (FIG. 5) which receives its inverted form from the master controller (FIG. 7) as a decoded address signal for 16 decoded addresses. Each of the 16 addresses corresponds to one of the 16 section switches. Each section switch NAND gate 123 receives enabling inputs from the line select signal $\overline{\text{PWR}}$ and Board Select signals such that one of the section switches will have the output of its NAND gate 123 enabled. This signal via inverter 125 enables latch 131 on the selected section switch 17, thus allowing the line assignment for that section switch to be transferred from system bus lines 90, 40, 39, 89, 88, 35 and 36 to latch 131. Thus, NAND gate 123 enables latch 131 to receive line selecting data from the CPU 27 which operates switches 143 and 145 (FIG. 4).

CONTROLLER INTERFACE

Figure 5:
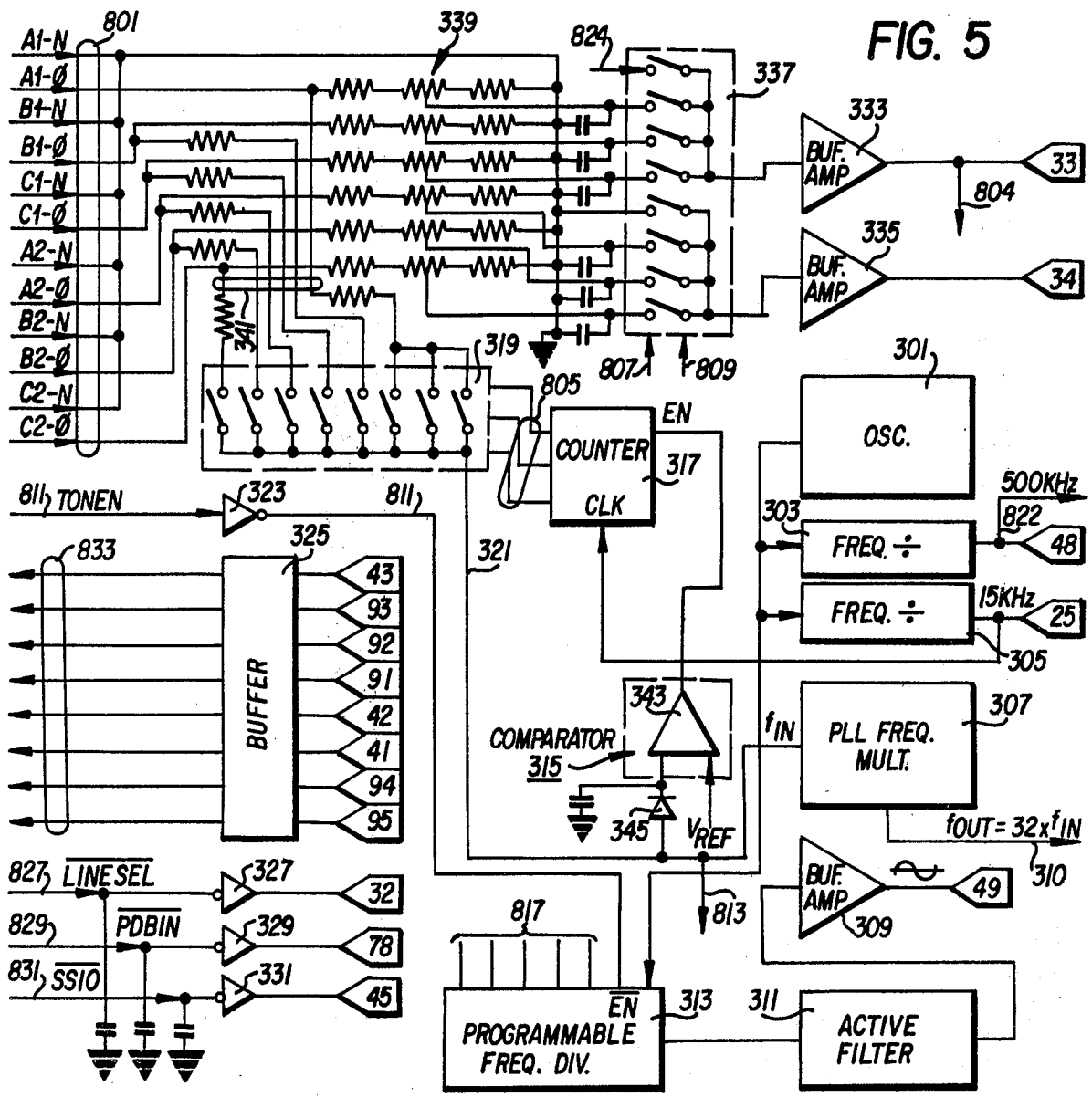

Referring to FIGS. 5 and 6, the controller interface 15 (FIG. 1) will now be described. As evident from the discussion of the section switches 17 above, the controller interface supplies to system bus 13 many of the control signals which the section switches use to configure them for a particular function, either receiving sensor outputs or supplying tone control signals to an addressed information channel 10 which is temporarily connected through a communications channel to a respective section switch portion (FIG. 4). The controller interface also generates the addressing tones which are sent to the remote stations to connect an information channel to a respective communications channel.

Referring first to FIG. 6, the controller interface includes an address decoder 359 which is connected to address line A$\emptyset$, A1, A2 and A3. These address lines, as well as signal line $\overline{\text{PWR}}$ collectively identified by numeral 821 in FIG. 6, are output lines from the master controller 19 as is signal line 825 containing IFIO. The address decoder 359, when enabled by the output of NAND gate 367, decodes four different addresses for respective latches 369, 371, 373 and 375. NAND gate 367 is enabled by the presence of the signal $\overline{\text{PWR}}$ which is applied to one input thereof via buffer 361 and NAND gate 365 and by the signal IFIO which is applied through buffer 363 to its other input. These signals which come from the master controller (FIG. 7), are supplied by CPU 27 whenever the controller interface is to perform an input/output operation.

Latch 369 receives as data inputs signals from data lines 823 via buffer 387 which originate in the master controller (FIG. 7). These in turn are connected to respective data output lines of the S-100 bus to which the CPU 27 sends output data. Accordingly, latch 369 latches data from the CPU 27 whenever addressed, as determined by address decoder 359. Latch 369 provides output data F$\emptyset$ . . . F4, collectively indicated as lines 817, which are used to program a desired tone frequency into a programmable tone generator 313 (FIG. 5).

Latch 371 is likewise addressed by the CPU 27 sending an address corresponding thereto which is decoded by address decoder 359 and which supplies an enable signal causing latch 371 to receive data provided by CPU 27 on its data output lines. The output data of latch 371 includes the signal $\overline{\text{SSADOFF}}$ which turns the analog to digital converters 181 on the section switches on or off. This signal is applied to pin 30 of system bus 13 which is in turn connected to the section switches as described earlier. Latch 371 also applies signals SS and CFGSEL to respective pins 23 and 44 of the system bus 13 which are also used by the section switches in the manner described earlier.

Another output signal CIFADOFF appears on an output data line of latch 371. This signal is used to enable the buffer amplifiers collectively identified as 379 in FIG. 6 to gate the output of a tracking analog to digital converter 377 to the pins 37, 87, 86, 85, 84, 83, 82, 76, 75 and 74 of the system bus 13. As described earlier, tracking analog to digital converter 377 is used to provide the digital representation of a voltage at a monitored electrical path if a like tracking analog to digital converter 181 is not provided on the section switch portions (FIG. 4). When converter 377 is used, the digital data input to the A/D multiplier 185 is taken from pins 37, 87, 86, 85, 84, 83, 82, 76 75 and 74, as described earlier with reference to FIG. 4.

Another output signal from latch 371 is $\overline{\text{ADTEST}}$ which is used to control two additional gated buffer amplifiers in buffer 379 and the output buffers in latch 375 to allow signals AD$\emptyset$ through AD9, respectively taken from other output lines AD$\emptyset$, AD1 of latch 371 and all the output lines AD2 . . . AD9 of latch 375, to pass to the system bus 13 AD$\emptyset$ through AD9 lines (pins 74, 75, 76, 82, 83, 84, 85, 86, 87 and 37). When $\overline{\text{ADTEST}}$ is present, signals AD$\emptyset$ through AD9, which form a test word, are applied to respective pins of the system bus 13 and these signals are used by the A/D multiplier 185 of the section switches to generate a corresponding output which is digitized by A/D converter 21 and checked by the CPU 27 for accuracy.

Latch 375 is also enabled by a signal provided as an output of address decoder 359. When it is addressed by CPU 27, data applied on data lines 823 is stored by latch 375. When the signal $\overline{\text{ADTEST}}$ is enabled by latch 371 the contents of latch 375 along with bits AD$\emptyset$ and AD1 are passed to the respective pins 37, 87, 86, 85, 84, 83, 82, 76, 75 and 74 of the system bus 13, as described in the preceding paragraph. The purpose of latch 375 is to store the eight most significant bits A2 through A9 of the test word to be applied by $\overline{\text{ADTEST}}$ to the input of the A/D multiplier 185 to test its operation and accuracy.

Latch 373 is also addressed by an output of address decoder 359. When addressed by CPU 27, it latches data on lines 823 and provides the output signals $\overline{\text{ACMEN}}$, $\overline{\text{ACGRD}}$ and $\overline{\text{SSP}}$ which are respectively supplied to pins 97, 46, and 47 of the system bus 13. These signals are used by the section switches in the manner described earlier. Latch 373 also supplies output signals PH$\emptyset$ and PH1 which are applied to 1 of 8 analog switch 337 (FIG. 5), the operation of which is described below.

Figure 6B:
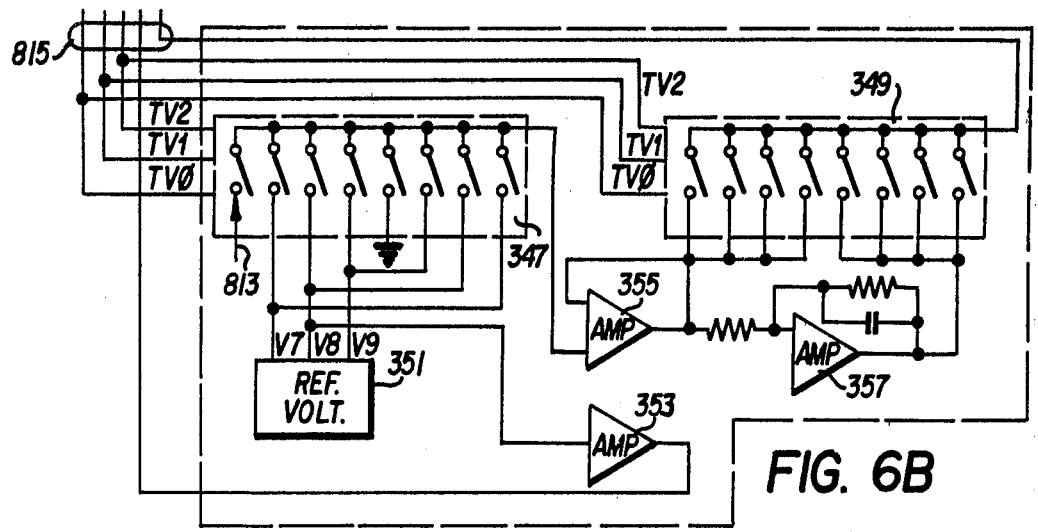
FIGS. 5, 6A and 6B, taken together, form a schematic diagram of the controller interface illustrated in FIG. 1.

Latch 373 also applies on respective output lines the signals TV$\emptyset$, TV1 and TV2 which are applied in common to the data selection inputs of 1 of 8 analog switches 347 and 349 (FIG. 6B). These analog switches serve to provide a selected test voltage of a selected polarity to pin 24 (FIG. 6A) which is connected to one input of 1 of 4 analog switch 175 and one input of analog switch 161 of each of the section switches (FIG. 4) for testing and calibration purposes.

A precision reference voltage generator 351 (FIG. 6B) is provided which supplies output voltages V7, V8 and V9 to six of the eight input lines to switch 347. The other two input lines to switch 347 are respectively connected to a 60 hz line voltage input on line 813 and ground. The output line of switch 347 is connected to amplifier 355, the output of which is connected in common to four of the input lines of switch 349. The output of amplifier 355 also passes through inverting amplifier 357 and the inverted signal is connected to the 4 remaining input lines of switch 349. A selected one of the switches of analog switches 347 and 349 is closed in response to the data selection signals TV$\emptyset$, TV1 and TV2 applied thereto, to provide at the output of switch 349 a precision voltage (one of V7, V8, V9, $-$V7, $-$V8, $-$V9 or a 60 hz reference signal, or a ground signal), the signal level and polarity of which is determined by data signals TV$\emptyset$, TV1 and TV2. An additional reference voltage is taken directly from the reference voltage generator 351 by amplifier 353. This is applied to the tracking analog to digital converter 377 and is used as a reference level by the converter in performing its converting operation. The input voltage which is digitized by the tracking A/D converter 377 is applied on an input line 804 thereto and this voltage is received from the output of a buffer amplifier 333 (FIG. 5) of the controller interface.

The output of analog switch 349 (FIG. 6B) is applied to buffer amplifier 381 (FIG. 6A) and from there to pin 24 of the system bus 13. The voltage on pin 24 is used as an input to analog switch 175 of the section switches (FIG. 4) which may be used as an input to tracking analog to digital converter 181 for testing purposes.

The precision voltage at the output of buffer amplifier 381 is also applied to line 824 which is an input line to analog switch 337 (FIG. 5) which will be described below.

The $\overline{\text{SSP}}$ output of latch 373 (FIG. 6A) is also applied to a one shot multivibrator 383 which produces a pulse signal of a predetermined duration which appears at the output of inverter 385 as the signal SSPCL. This signal is applied to pin 26 of system bus 13 which is applied to line 759 of the section switch to reset counter 221. FIG. 6A also illustrates the coupling of data lines 823 from the master controller through buffer 387 to the pins 90, 40, 39, 38, 89, 88, 35 and 36 of the system bus 13. This signal path serves to couple the CPU data output lines from the S-100 bus to the CPU data output pins of the system bus 13.

The controller interface also includes circuitry for deriving a voltage signal representative of the voltage in a monitored electrical path at a remote station from the electrical service entrance of a building. Signal lines 801 collectively represent signal lines connected to two three-phase electrical service inputs to a building. These signal lines are coupled to the service entrance by transformers (not shown) which step the high voltage entering the building down to a low voltage level. The lines A1-N, B1-N, and C1-N represent three wires connected to the neutral wire of one of the two three-phase power distribution lines, while the signal lines A1-∅, B1-∅, and C1-∅ respectively represent the three-phases of the first power line. The second set of power distribution lines are designated as A2-N, B2-N, and C2-N for three wires connected to the neutral wire and A2-∅, B2-∅ and C2-∅ for the three phases of the second power line. The power lines, collectively illustrated as 801, are connected to a voltage dividing network 339 and the lines A1-∅, B1-∅, C1-∅, A2-∅, B2-∅, and C2-∅ are respectively coupled to different inputs of analog selection switch 337. Another input to selection switch 337 is the test voltage input on line 824 which is taken from the output of buffer amplifier 381 (FIG. 6A).

Analog switch 337 contains two switching sections operating in parallel which are responsive to data signals applied to lines 807 and 809 to selectively connect one applied input signal to an associated buffer amplifier (333 or 335) respectively connected to the outputs of the two sections of switch 337. The data applied to lines 807 and 809 are the signals PH∅ and PH1 which appear on the output of latch 373. By addressing latch 373 and applying the appropriate signals PH∅ and PH1 thereto CPU 27 configures one half of switch 337 to pass one of the signals on input lines 824, A1-∅, B1-∅, or C1-∅ to the input of buffer amplifier 333. The output of buffer amplifier 333 is applied to pin 33 of system bus 13 and to line 804 which is applied as an input to tracking A to D converter 377 (FIG. 6A). Likewise, in response to PH∅ and PH1 the other half of switch 337 couples one of the outputs from lines A1-N, A2-∅, B2-∅, or C2-∅ to the input of buffer amplifier 335, the output of which is connected to pin 34 of the system bus 13. The voltages of pins 33 and 34 appear as inputs to analog switch 175 of the section switches (FIG. 4) as described earlier. The voltage applied by buffer amplifiers 333 and 335 to pins 33 and 34 respectively can be used by the tracking analog to digital converter 337 in the controller interface (333 only) or by the tracking analog to digital converters 181 in the section switches (333 or 335) to provide a digital signal representative of the voltage on a monitored electrical path which can be used as the inputs to multiplier 185 for calculating power consumption.

FIG. 5 also illustrates an oscillator 301, the output of which is connected to the inputs of frequency dividers 303 and 305. Frequency divider 303 provides an output signal of, e.g. 500 KHz, to pin 48 of the system bus 13 to which the clocking input of the tracking A/D converters 181 of the section switches are connected (FIG. 4). The 500 KHz output of frequency divider 303 is also applied to signal line 822 which is used as a clocking signal for tracking analog to digital converter 377 (FIG. 6A). Frequency divider 305 provides an output signal of, e.g. 15 KHz, to pin 25 of the system bus. The 15 KHz output signal of frequency divider 305 is used as a clocking input to a counter 317. When counter 317 is enabled by a signal applied to the enable input thereof, it continually counts and the counted output appears on output lines 805 as an input to one of eight analog switch 319. As counter 317 continues to count, individual switches of analog switch 319, which have respective inputs connected to the lines A1-∅, B1-∅, C1-∅, A2-∅, B2-∅ and C2-∅, will be successively closed. The output line 321 from switch 319 is applied via diode 345 to the input of a comparator 315 consisting of a comparison amplifier 343. Comparison amplifier 343 provides an output whenever an input voltage is applied thereto which exceeds a predetermined reference voltage. The purpose of switch 319, counter 317, and comparator 315 is to provide an automatic adaptive control loop which will continue to step switch 319 until a voltage is found on one of the power lines A1-∅, B1-∅, C1-∅, A2-∅, B2-∅ or C2-∅. When a voltage is found, it is sensed by comparison amplifier 343 which changes state and removes the enable input on counter 317, stopping the counter from counting further clock pulses received from frequency divider 305. This causes analog switch 319 to remain in its last state effectively locking the switch closed on one of the power lines which has a voltage thereon. The output line 321 from analog switch 319 is applied as an input signal to a phase lock loop (PLL) frequency multiplier 307, the output of which ($f_{out}$) is thirty-two (32) times the input frequency ($f_{in}$). The output of multiplier 307 appears on line 310 which runs to the master controller (FIG. 7). This signal is used as a sampling interrupt signal VI4 in a manner more fully described below.

The output of frequency divider 305 is also applied to pin 25 of system bus 13 which connects to NAND gate 227 of the section switch portions (FIGS. 3, 4) as described previously.

The controller interface also includes a programmable frequency divider 313 (FIG. 5) which receives as an input an output of oscillator 301. The frequency of oscillator 301 is divided by a value programmed into the frequency divider 313 on data lines 817. These data lines receive data from latch 369 (FIG. 6A) which is addressed by the CPU 27 to apply data to the latch representative of a desired tone frequency which is to be sent from the section switches to the remote station lines connected thereto. One tone frequency, e.g. 100 Khz, is used for addressing the information channels 10 at the remote stations, while other tone frequencies can be used to control an operative device connected to an addressed information channel 10 at a remote station. The output of programmable frequency divider 313 is applied to an active filter 311, the output of which is coupled to a buffer amplifier 309, the output of which is connected to pin 49. As discussed earlier, the section switches are connected to pin 49 (FIG. 3) via amplifier 141 to supply a tone on input line 761 of one of eight analog switch 161, which when appropriately configured by CPU 27, supplies the tone to a remote station communications channel which is connected to a respective section switch.

FIG. 5 also illustrates a set of buffer amplifiers, 325, which are provided in the controller interface to couple data on pins 43, 93, 92, 91, 42, 41, 94 and 95 of the system bus 13 to data lines 833 which run to the master controller (FIG. 7) and from there to the CPU 27 data input pins of the S-100 bus.

FIG. 5 also illustrates lines 827, 829 and 831 which respectively receive the signals $\overline{\text{LINESEL}}$, $\overline{\text{PDBIN}}$, and $\overline{\text{SSIO}}$ from the master controller (FIG. 7). These signals are coupled through respective buffer amplifiers 327, 329 and 331 to pins 32, 78 and 45 of the system bus 13 and are received and used by the section switches as described earlier with reference to FIG. 3.

A line 811, also originating in the master controller, supplies a tone enable signal (TONEN) which is inverted by inverter 323 and applied as an $\overline{\text{ENABLE}}$ input to programmable frequency divider 313. Accordingly, the frequency emitted by programmable frequency divider 313 is controlled by data on the input lines 817 and the on/off state of the programmable divider is controlled by the TONEN signal on line 811 from the master controller.

MASTER CONTROLLER

The system master controller 19 (FIG. 1) is illustrated in greater detail in FIG. 7. One of the principal functions of the master controller 19 is to provide the CPU 27 with three separate interrupt signals which are used by CPU 27 to execute various interrupt programs for acquiring and processing data from remote station sensors.

The master controller includes an oscillator 675 having an output signal which is connected to the input of a frequency divider 677. The output of frequency divider 677 is connected to a frequency divider 683 the output of which provides a master interrupt timing signal MT0 on line 784. The output of frequency divider 677 is also coupled to the input of a programmable counter illustrated as having two separate programmable counting sections 679 and 681. The programmable counter sections are each configured to load an eight bit data signal which corresponds to a count value which must be reached before an output signal is provided on line 783 from the programmable counter. The two counter sections 679 and 681 are separately loaded in two successive eight bit bytes of a data signal applied to lines 781 by CPU 27 through buffer 685 which is connected to the CPU data output pins 36, 35, 88, 89, 38, 39, 40 and 90 of the S-100 bus. Data signals from CPU 27 program the counter sections 679 and 681 to set the time period (number of clock signals counted) which must transpire before an output signal is placed on line 783. The counter sections 679 and 681 are respectively loaded by load signals FTP and CTP provided on lines 785 and 781. These signals are generated as separately decoded addresses by address decoder 793 which is connected to address lines A∅, A1 and A2 of the S-100 bus (pins 79, 80 and 81). Signals FTP and CTP are applied to counter sections 679 and 681 after passing through respective buffer amplifiers 798 and 796. When CPU 27 programs the two sections 679 and 681 of the programmable counter, it successively outputs the signals FTP and CTP by providing appropriate address signals to address decoder 792, along with the data which is to be loaded into the counter sections 679 and 681 (applied to lines 781) by the FTP and CTP load signals.

The output of the programmable counter (PTO) on line 783 is a programmable time duration interrupt control signal, the purpose of which will become more evident in the discussion of the interrupt programs executed by CPU 27.

The programmable counter is enabled by PTEN, a data signal applied by CPU 27 to latch 601 via the S-100 bus data output lines through buffer 685. The signal PTEN is used to gate the programmable counter on so that after expiration of the time period set therein, the signal PTO will be generated. Other signals supplied to latch 601 by the CPU 27 are TONEN, $\overline{\text{PTIR}}$, MTPS, $\overline{\text{MTIR}}$ and VI4EN, the purpose of these signals will be described below.

The tone enable signal (TONEN) from latch 601 is supplied as an output on a line 811 which connects with the controller interface (FIG. 5) and provides the on/off control signal to the enable input of programmable frequency divider 313 as described above.

The MTPS signal is an enable signal which is applied by the CPU (through latch 601) to frequency divider 683 to on/off control its operation.

The remaining three signals at latch 601, $\overline{\text{PTIR}}$, $\overline{\text{MTIR}}$ and VI4EN control the application of three separate interrupt signals to the CPU interrupt lines as more fully described below.

Address decoder 786 is connected to the A4, A5, A6 and A7 address lines respectively connected to pins 30, 29, 82 and 83 of the S-100 bus. Address decoder 786 serves to decode four groups of sixteen addresses. For purposes of simplifying description, the address decoder is illustrated as having decoded output lines of 3X, 4X, 5X, and 6X (hex notation). The X represents one of sixteen possible hexidecimal numbers (∅ . . . F) so, for example, the address decoder provides an output on line 3X when it decodes any one of the hex decimal addresses 3∅ . . . 3F.

The 3X output is supplied as an input to negative input AND gate 774 which receives at another input thereto the output of NOR gate 790. Gate 774 is thus enabled whenever an address 3X is decoded and a SINP or SOUT signal is detected at respective S-100 bus pins 46 and 45. As described earlier, SINP and SOUT are signals supplied from the CPU 27 to the S-100 bus when it is getting ready to input data (SINP) or output data (SOUT) so that associated devices connected to the S-100 bus can suitably ready themselves for the input or output operations. When gate 774 is enabled, it supplies a signal to inverter 776, the output of which is supplied to negative input OR gate 782 as one enabling input thereof. The output of inverter 776 is also applied to a buffer amplifier to generate the the signal $\overline{\text{SSI0}}$ on line 831. This signal is applied to the controller interface (FIG. 5) which in turn supplies it to pin 45 of the system bus 13 as previously described.

The 5X decode output of address decoder 786 is applied as one input to a negative input AND gate 772, the other input of which is connected to the output of NOR gate 790. When enabled by the concurrent presence of the two input signals, gate 772 provides a signal LINESEL which passes through inverter 653 and appears on line 827 as $\overline{\text{LINESEL}}$. This signal is applied to the controller interface (FIG. 5) which in turn supplies it to pin 32 of the system bus 13 and from there to the section switches as described earlier.

The decoded 6X output from address decoder 786 is supplied as one input to negative input AND gate 770, the other input of which receives the output of NOR gate 790. When enabled by the concurrent presence of the 6X decode addresses and a SINP or SOUT signal from CPU 27, gate 770 supplies, through buffer 651, a signal IFIO to line 825 which leads to the controller interface (FIG. 6A) as previously described.

The respective outputs of gates 770, 772 and 774 are also applied through respective inverters 778, 780 and 776 as inputs to negative input OR gate 782. The output of gate 782 enables, through NAND gate 792, a wait state generator 784 which supplies a wait signal to an output PRDY line connected to pin 72 of the S-100 bus.

When a wait signal is supplied to pin 72, the CPU stops operating. The wait state generator 784 is a counter which counts through a predetermined counting period upon being enabled. It receives a clock input of, for example, 4 MHz which is available at pin 24 of the S-100 bus. To ensure that timing begins at an appropriate point in the instruction execution cycle of the CPU 27, a PSYNC signal applied to pin 76 of the S-100 bus by the CPU 27 is also applied as an enabling input to NAND gate 792. The PSYNC signal sychronizes enablement of the wait state generator with the CPU instruction processing.

As noted, address decoder 793 receives address signals from the address lines A$\emptyset$, A1 and A2. It also receives an enable signal $\overline{PWR}$ through inverter 770 which receives the signal $\overline{PWR}$ from pin 77 of the S-100 bus. The signal $\overline{PWR}$ is generated by CPU 27 during an output operation indicating that valid data is on the S-100 CPU data output pins. Address decoder 793 also has two negative enable inputs, one of which is connected to the 4X decoded output from address decoder 786 and the other of which is connected to the output of NAND gate 768 which in turn receives at one input the output of NOR gate 790 through inverter 788. The net result of the enable signals and address signals applied to addess decoder 793 is that it decodes addresses corresponding to the signals FTP and CTP and the enable signal for latch 601 (applied through inverter 794) from the CPU 27.

The master controller also provides three separate interrupt signals $\overline{MTI}$, $\overline{PTI}$ and $\overline{VI4}$ to respective pins 10, 9 and 8 of the S-100 data bus. These pins are in turn connected to three interrupt lines of CPU 27. The CPU processes applied interrupts in an order or priority with the $\overline{MTI}$ interrupt being of highest priority and the $\overline{VI4}$ interrupt being of lowest priority. Each interrupt has one or more respective interrupt programs associated therewith which CPU 27 executes upon being interrupted. These programs will be described in detail below.

The three interrupts signals generated by the system are a master interrupt $\overline{MTI}$ applied to pin 10 of the S-100 bus (FIG. 7), a programmable interrupt $\overline{PTI}$ applied to pin 9 of the S-100 bus, and a sampling interrupt $\overline{VI4}$ phase locked to an AC power line and applied to pin 8 of the S-100 bus. The latter interrupt is generated by the phase lock loop (PLL) frequency multiplier 307 of the controller interface (FIG. 5) and is supplied as a signal VI4 on line 310 to the master controller. The programmable interrupt $\overline{PTI}$ is provided on pin 9 upon the appearance of the output signal PTO from programmable counter section 679 on line 783. The master interrupt $\overline{MTI}$ is provided on pin 10 upon the appearance of the MTO signal emitted by frequency divider 683 on line 784.

The three interrupt control signals VI4, PTO and MTO are each connected to respective identical latching and reset circuits in the master controller. For the purpose of simplifying description, only the latching and reset circuit which generates signal $\overline{PTI}$ will be described in detail. The PTO control signal on line 783 is applied to a clock input of a flip-flop 603 the output of which enables buffer amplifiers 607 and 609 to apply a ground condition to respective pins 73 and 9 of the S-100 bus. Amplifiers 607 and 609 respectively generate output signals $\overline{PINT}$ and $\overline{PTI}$. The $\overline{PINT}$ signal which is applied to pin 73 of the S-100 bus goes "low" to indicate to the CPU 27 that an interrupt has occurred. The CPU 27 then examines its interrupt lines respectively connected to pins 10, 9 and 8 of the S-100 bus to determine which interrupt(s) is occurring. The CPU then processes the interrupt program for the highest priority interrupt then occurring.

After the interrupt $\overline{PTI}$ occurs, flip-flop 603 must be reset before the occurrence of the next interrupt, otherwise it will not be detected. For this purpose, flip-flop 603 is reset by a signal $\overline{PTIR}$ which is provided on an output line of latch 601. CPU 27 supplies the signal $\overline{PTIR}$ to the latch 601 to reset flip-flop 603 during processing of the interrupt program(s) associated with the $\overline{PTI}$ interrupt. The master interrupt control signal MTO on line 784 likewise clocks flip-flop 605 which is reset by a signal $\overline{MTIR}$ also received from the output of latch 601. In like manner, the interrupt control signal VI4 received on line 310 clocks flip-flop 617 which is reset by the signal VI4EN supplied by latch 601. Whenever any of the interrupt outputs to respective pins 10, 9 or 8 is generated, the associated interrupt request signal $\overline{PINT}$ is also generated to notify CPU 27 that an interrupt signal is present.

FIG. 7 also shows a buffer 627 which is used to output data to the data input pins 43, 93, 92, 91, 42, 41, 94 and 95 of the S-100 bus which are connected to the data input lines of CPU 27. The buffer is enabled by the output of negative input AND gate 623. One input to gate 623 is taken from the output of inverter 625 which has an input connected to pin 78 of the S-100 bus. This pin has a signal PDBIN applied thereto by CPU 27. As described earlier, this signal is supplied when CPU 27 desires to read input data. The other input to gate 623 is taken from the output of inverter 776. Thus, whenever address decoder 786 decodes a 3X address and CPU 27 supplies a SINP signal to NOR gate 790 (enabling negative input AND gate 774) and the signal PDBIN to negative input AND gate 623, the latter is enabled to enable buffer 627 and allow data to pass to the input pins of the S-100 data bus.

A/D CONVERTER

Figure 8A:
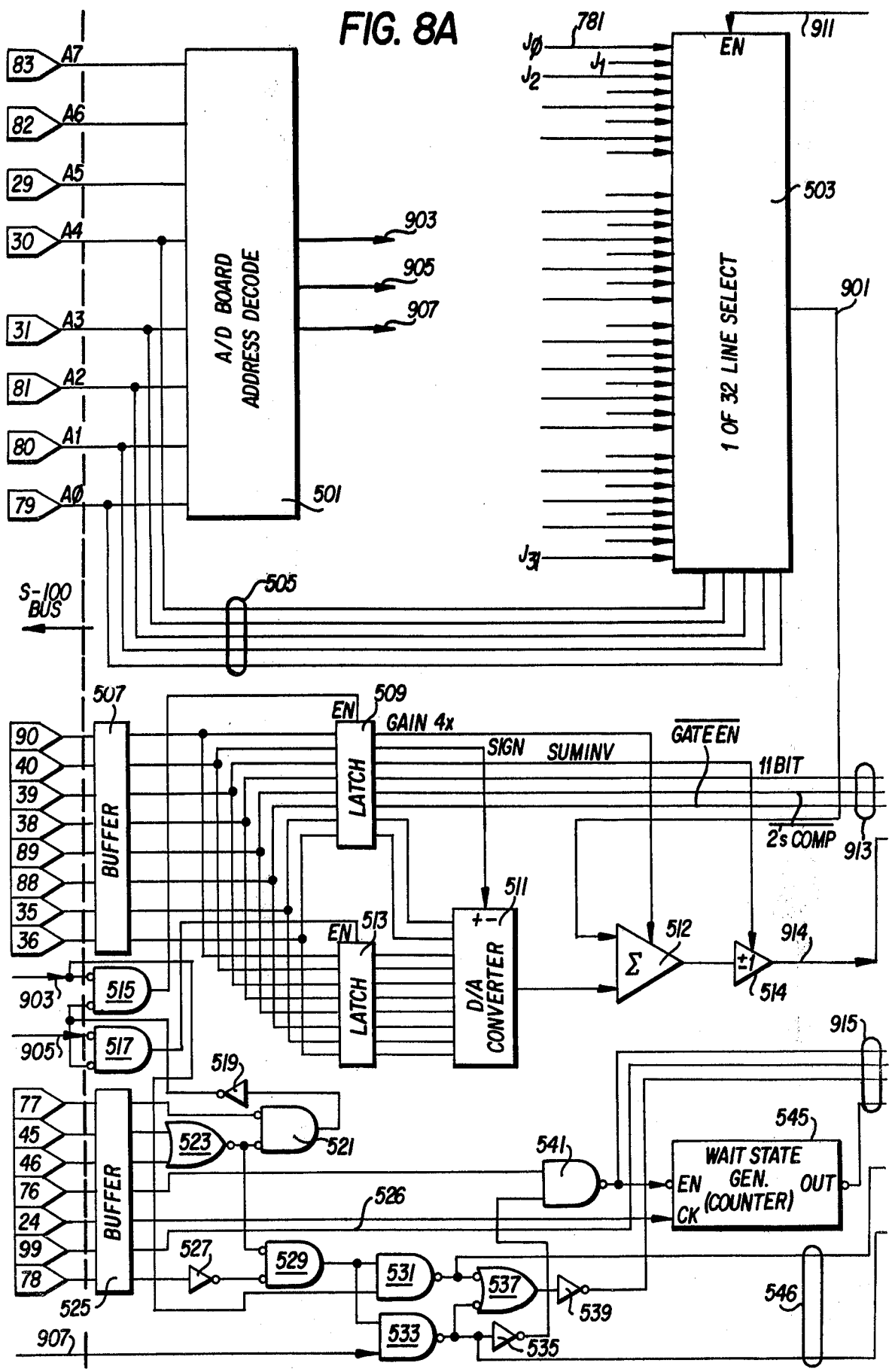
FIGS. 8A and 8B, taken together, form a schematic diagram of the A/D converter illustrated in FIG. 1.
Figure 8B:
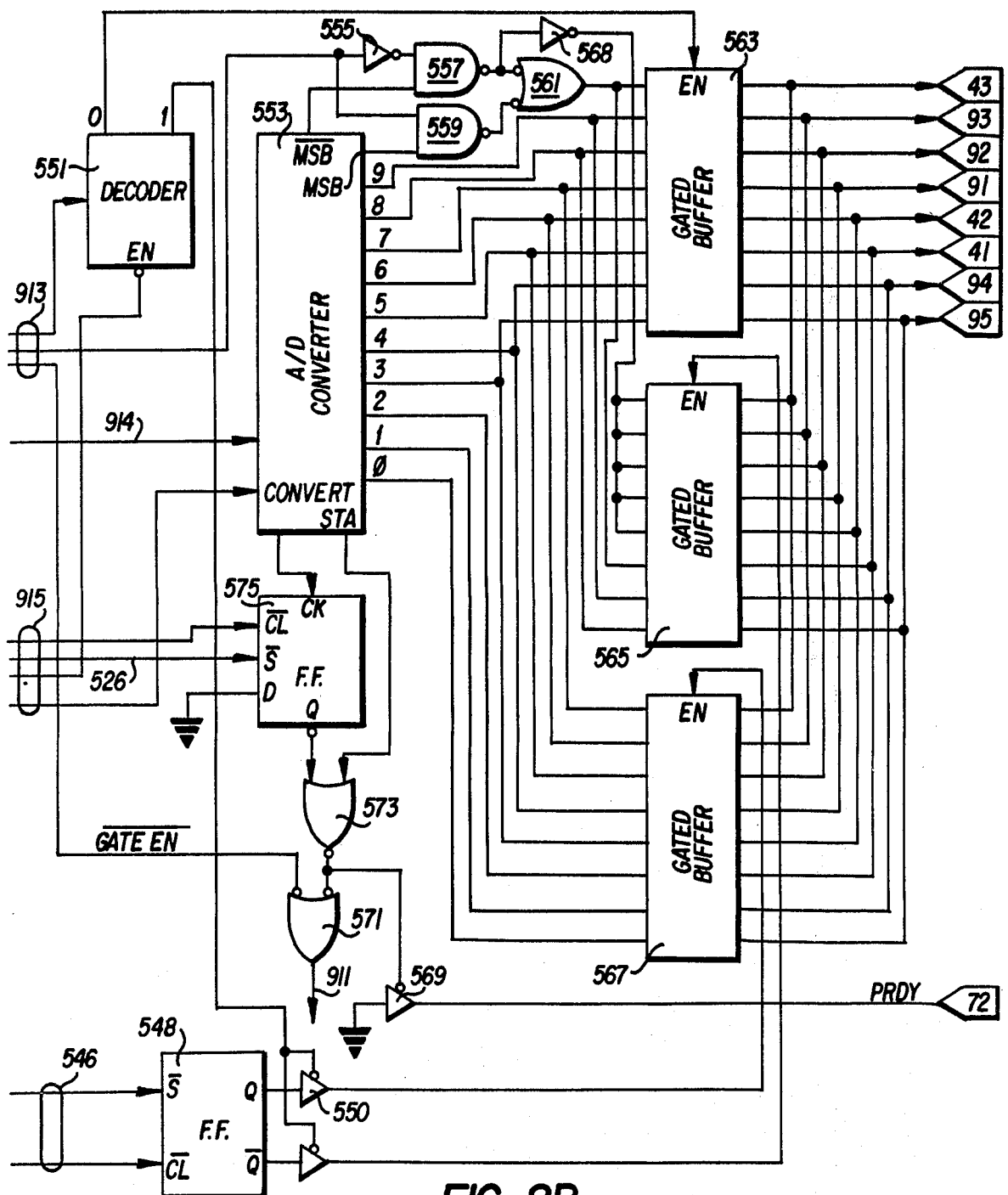

FIGS. 8A and 8B show the details of the analog to digital converter 21. This device receives each of the output lines from the section J$\emptyset$ . . . J31. These output lines contain an analog signal representing a sensor output, an AC power calculation signal or a test signal. The analog signals on the section switch output lines are digitized by A/D converter 21 and are then supplied to the data input lines of the S-100 bus for input to the CPU 27.

The A/D converter 21 includes an address decoder 501 (FIG. 8A) which is connected to the address lines A0, A1, . . . A7 of the S-100 bus. Address decoder 501 has three output lines 903, 905 and 907. Output line 907 contains a signal when any one of 32 different addresses, corresponding one each to the section switch FIG. 4 portions, are received from the CPU 27. This line is an address line for energizing the A/D converter 21. Output lines 903 and 905 of address decoder 501 are two specific addresses which supply signals to negative input AND gates 515 and 517 respectively. These gates respectively enable latches 509 and 513 which receive data from the CPU through buffer 507 connected to the data output pins 90, 40, 39, 38, 89, 88, 35 and 36 of the S-100 bus. Additional input enable signals to gates 515 and 517 arrive from the output of inverter 519 which has an input connected to the output of negative input AND gate 521. The two inputs to gate 521 come respectively from pin 77 of the S-100 bus and NOR gate 523 having its inputs respectively connected to pins 45 and 46 of the S-100 bus. NOR gate 523 determines whether the CPU 27 has supplied either of the signals SOUT or SINP to the S-100 bus, respectively indicating that output data will be supplied or that it will accept input data. When gate 523 detects either of these signals and the signal $\overline{PWR}$ is applied to pin 77 by CPU 27 when it is ready to do an output operation, gate 521 will be enabled and either of gates 515 and 517 will thus be enabled depending on which is addressed by the CPU 27 via the signal on lines 903 and 905 of address encoder 501.

Latch 513 receives previously stored offset data from the CPU 27 via buffer 507 which is representative of calibration voltages obtained from the various sensors which are connected to the information channels at the remote stations during a calibration procedure. This digitized offset data is supplied to the input of D/A converter 511. The calibration voltages are obtained by sequentially scanning the sensors when they are under known load conditions and they are stored by the CPU 27 for summation with actual sensor output signals which are to be digitized. The output of latch 513 represents, in digital form, the upper eight bits of the digitized offset values. The lower two bits come from latch 509 and are latched therein together with the control signals GAIN 4X, SIGN, SUMINV, 11 BIT, $\overline{\text{TWO'S COMP.}}$, and $\overline{\text{GATE EN}}$, all of which are supplied by CPU 27. The control signals configure A/D converter 21 to different operative states as described below.

Digital to analog converter 511 has a control input which selects the polarity (positive or negative) of the analog output. The polarity of the offset is set by the SIGN control signal at the output of latch 509.

The analog offset voltage output of D/A converter 511 is fed to a summing amplifier 512 which receives at its other input the output of 1 of 32 line select switch 503. This device is similar to previously described analog selection switches. A particular switch is closed to pass one of the input lines to the output line 901 in accordance with the addressing data signal applied thereto. The selecting of an appropriate input line is accomplished by connecting the data select input 505 of the line select switch 503 to the address bus lines A∅ . . . A4 of the S-100 bus. The line inputs to the line select switch 503 are the respective lines J∅ . . . J31 exiting from the section switches. Two lines exit each section switch, one for each of the FIG. 4 portions. These lines represent the 32 wire pairs which are respectively connected to 32 groups of remote stations.

Summing amplifier 512 sums the calibration offset voltages applied by D/A converter 511 with the output from the section switches which are selectively connected to line 901. Summing amplifier 512 has a switchable gain. In normal operation it has a gain factor of one, but it can be switched by a control signal GAIN-4X applied from the output of latch 509 to a gain factor of 4. The output of summing amplifier 512 is applied to switchable polarity, unity gain amplifier 514. The polarity of the output of amplifier 514 is set by the control signal SUMINV. The output of amplifier 514 appears at line 914 which is an input line to A/D converter 553 (FIG. 8B). The output of A/D converter 553 is supplied via gated buffers 563, 565 and 567 to data input pins 43, 93, 92, 91, 42, 41, 94 and 95 of the S-100 bus and are thus fed to CPU 27.

Buffers 563, 565 and 567 are used to gate the 11 bit output lines of A/D converter 553 to the 8 bit input data lines of CPU 27. Various outputs of the A to D converter 553 are transmitted to the CPU 27 data input lines by operating buffers 563, 565 and 567 at different times under control of a decoder 551 and a flip-flop 548 (FIG. 8B). Decoder 551 decodes the control signal 11 BIT to activate either its "0" or "1" output lines depending on the level of 11 BIT. When decoder 551 applies a signal to its "0" output line, gate 563 is enabled. Decoder 551, in turn, is enabled by the output of inverter 539. When enabled, buffer 563 applies the 8 most significant bits (MSBS) of the output of A/D converter 553 to pins 43, 93, 92, 91, 42, 41, 94 and 95.

Flip flop 548 has its two outputs (Q, $\overline{Q}$) respectively connected to the enable inputs of buffers 565 and 567 through gated buffer amplifiers 550. The gating signal for amplifiers 550 originates at the "1" output line of decoder 551. When decoder 551 enables amplifiers 550 either buffer 565 or 567 will be enabled depending on the state of flip flop 548. By toggling flip flop 548 buffers 565 and 567 can be sequentially enabled.

Buffer 565 has five upper inputs connected to the output of a gate 557 through inverter 568 and the next input to the MSB or $\overline{\text{MSB}}$ output of converter 553 as described below. The last two bits of buffer 565 go to bits 9 and 8 of A/D converter 553. Buffer 567 has its 8 inputs connected to the 8 least significant bits of A/D converter 553. As can be seen, by appropriately controlling decoder 551 with the control signal 11 BIT and operating flip flop 548 with the outputs of gates 531 and 533 (respectively applied to the $\overline{S}$ and $\overline{CL}$ inputs) various output bits of the A/D converter 553 can be gated under control of CPU 27 to its data inputs.

The uppermost data input line of buffer 563 is connected to the most significant bit MSB and inverted most significant bit $\overline{\text{MSB}}$ output lines of A/D converter 553 through negative input OR gate 561, and NAND gates 557 and 559. The purpose of these gates and inverter 555 is to allow the upper data line of buffer 563 and buffer 565 to receive either the MSB or $\overline{\text{MSB}}$ outputs of A/D converter 553. This is under control of the $\overline{\text{TWO'S COMP}}$ control signal at the output of latch 509.

The A/D converter 21 also includes various gating circuits which are used to control operation of the A/D converter 553 as well as to enable decoder 551 and operate flip flop 548. Negative input AND gate 529 receives the output of NOR gate 523 and the output of an inverter 527 connected through the buffer 525 to the pin 78 of the S-100 bus which contains the PDBIN signal. Accordingly, when the CPU 27 outputs either an SOUT or an SINP signal and a PDBIN signal, gate 529 is enabled. The output of gate 529 is supplied to the input of NAND gate 531 which has its other input the output signal on line 903 which is an address decoded by address decoder 501. When the address signal and output of gate 529 are present, gate 531 is enabled to supply a signal to one input of negative input OR gate 537 which receives at its other input the output of NAND gate 533. The inputs of NAND gate 533 are respectively connected to the output of gate 529 and line 907 which is one of the address select line for the A/D converter 21. Accordingly, when the A/D converter 21 is addressed to make line 907 true and the CPU supplies the signals PDBIN and either of SOUT or SINP, NAND gate 533 is enabled. When either of gates 531 or 533 are enabled, negative input OR gate 537 supplies an output signal which is inverted by inverter 539. The output of inverter 539 is passed to the decoder 551 enabling it to supply its decoded output to the "0" or "1" output line. The output of gates 531 and 533 also control the state of flip flop 548 and in turn the enablement of buffers 565 and 567.

The output of NAND gate 533 is also connected through inverter 535 to one input of NAND gate 541 which receives as its other input the PSYNC signal on pin 76 of the S-100 bus through buffer 525. When enabled by the concurrent presence of the two input signals thereto, NAND gate 541 supplies an enable signal to wait state generator 545. Wait state generator 545 is similar to the wait state generator on the master controller. When enabled, it counts a predetermined number of clock pulses before emitting an output signal. The purpose of wait state generator 545 is to allow data to settle on the incoming section switch lines before A/D converter 553 is instructed to perform a conversion operation. The output signal from wait state generator 545 is supplied to a convert input terminal of the A/D converter 553 and this starts the A/D conversion operation.

The output of NAND gate 541 which enables the wait stage generator is also applied as a clear ($\overline{CL}$) input to flip-flop 575. The output of flip-flop 575 passes through NOR gate 573 and activates buffer 569 to pull the line connected to pin 72 of the S-100 bus "low". This supplies a $\overline{PRDY}$ signal to the CPU 27 placing it in a wait state. After the wait state counter counts to its predetermined value (approximately a two microsecond delay), the A/D converter 553 is instructed to begin conversion. At this time the status line STA of A/D converter 553 goes high and remains high during the conversion process. This signal passes through NOR gate 573 and keeps buffer amplifier 569 enabled to continue application of the $\overline{PRDY}$ signal to pin 72 of the S-100 bus. After conversion is completed (approximately two micro-seconds), A/D converter 553 removes the high signal from the status line and also supplies a clock reset signal to flip-flop 575 so that NOR gate 573 is now disabled and removes the control signal from buffer amplifier 569 thereby removing the wait signal from PRDY pin 72. A set input (line 526) to flip-flop 575 is supplied through buffer 525 from the POC line connected to pin 99 of the S-100 bus. This signal is a reset signal which is applied to pin 99 whenever the system is reset and merely resets flip-flop 575 whenever a main system reset occurs.

A negative input OR gate 571 is also provided which receives the $\overline{GATE\ EN}$ signal from latch 509 and the output of gate 573. It supplies an enabling signal to line select switch 503 on line 911 whenever $\overline{GATE\ EN}$ is present or when gate 573 is supplying a wait state control signal to gated buffer amplifier 569.

SENSORS

The system as described above has the capability of measuring a sensor output as a resistance, a precision resistance change, a voltage, or a current. The sensor outputs are read and digitized under control of CPU 27 during the time that the addressed information channels are connected to the central station over one of the 32 line pairs connecting the central station with the various groups of remote stations. The outputs of the sensors can represent sensed temperature, fluid flow, BTU consumption, etc. virtually without restriction.

Several representative sensors which can be used in the invention and the parameters which they measure will now be described.

Figure 26:
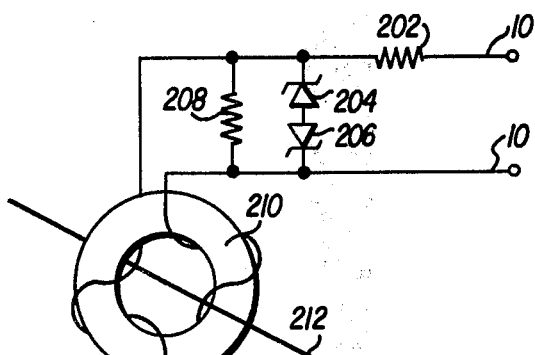
FIG. 26 illustrates a current sensor which may be used with the invention.

For the purpose of measuring current in an electrical path at a remote station, a current measuring transducer as shown in FIG. 26 may be employed. It comprises a precision wound toroidal current transformer 210 having a precision resistor 208 mounted adjacent to the transformer. The precision resistor 208 is connected in parallel with the secondary output of the transformer and with a pair of back-to-back Zener diodes 204 and 206. A resistor 202 is also connected in series with the coil, precision resistor and Zener diodes and the entire assembly is then connected across the terminals of an information channel 10 at a remote station. Since the precision resistor 208 is a fixed part of the assembly, the output of the circuit illustrated in FIG. 2 is a voltage, not a current, as with a standard current transformer. The main advantage of having a voltage output for the current sensor is that the length of wire between the transducer and an actual measuring device is not critical, as is the case with a typical current transformer.

The series resistor 202 at the current transducer output is used to provide a high output impedance which makes it easy to detect tampering with the current transducer. For example, if various resistive or reactive electrical components are connected across the output of the current transducer, the resultant impedance change caused can be easily detected. Tampering can thus be detected by periodically operating CPU 27 to check the impedance of the current transducer against a known reference impedance value for the transducer stored during initial calibration of the system. The purpose of Zener diodes 204 and 206 is to protect precision resistor 208 and the remote station 11 to which the transducer is connected from very high current surges in line 212 which try to induce very high voltages across resistor 208.

The present invention can also be used to economically measure temperature, fluid flow and heat flow at a multiplicity of locations. This is done by using a combination of resistance and precision resistance change measurements in conjunction with various temperature and flow sensors which have been developed to supply resistance and precision resistance outputs to the information channels 10.

Temperature is measured using a thermistor or other temperature sensitive device which is connected to an information channel 10 at a remote station. CPU 27 operates the A/D converter 21, controller interface 15 and section switches 17 to acquire and store the temperature sensor output as digital data.

Figure 27:
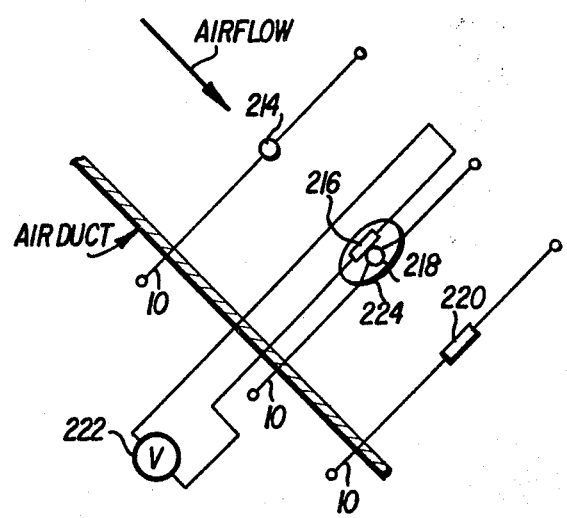
FIG. 27 illustrates an air flow sensing system which may be used with the invention.

Air flow is determined by measuring the temperature difference between a first conventional temperature sensor e.g. a thermistor, provided in an air stream and a second temperature sensor provided in the air stream at a location downstream of the first. FIG. 27 illustrates an air flow sensing system using a thermistor 214 and a thermistor 218, the latter being thermally bonded to a fixed resistor 216 by a thermally conductive epoxy 224, as the first and second temperature sensors. Resistor 216 is connected across a voltage source 222. Also illustrated is a conventional humidity detector 220. The temperature difference between thermistor 218 and thermistor 214 (each of which changes resistance with temperatures changes) determines the air flow since for any given air handling system a curve of air flow rate versus temperature differences can be experimentally derived. Although these curves vary somewhat with absolute air temperature and humidity, it is possible to construct families of curves for air flow rate versus temperature difference which are entered into CPU 27 and used as look up tables for determining an air flow knowing the absolute air temperature and the humidity.

Humidity is measured by humidity detector 220 which provides an output resistance which changes with air humidity level. Since any one of several conventional devices can be used as humidity detector 220 a detailed description of this device is not provided.

The purpose of fixed resistor 216 and associated voltage source 222 is to provide a heated surface in contact with thermistor 218 which is maintained approximately 20° to 30° C. above the air temperature under full flow conditions. Experimentation has shown that the most accurate results are achieved when the heat dissipating area of the downstream sensor comprised of resistor 216, thermistor 218 and epoxy housing 224 is small and of consistent size and symmetrical shape to minimize the effects of orientation of the sensor in the flow stream which is being measured. The best configuration for the air flow sensor has been found to be a resistor and thermistor encapsulated in an oval shaped housing made of a highly thermally conductive and low electrically conductive epoxy 224. The oval shape makes it possible to string the flow sensor across an air flow duct perpendicular to the air flow with a minimum of air disturbance and without concern for its rotational position.

Heat transferred in BTU's by air handling heat exchangers can be determined by using the invention with sensors which measure the input air temperature to an air heat exchanger (e.g. sensor 214, FIG. 27), the output air temperature from the exchanger, the air flow rate (e.g. sensors 214 and 224, FIG. 27) and the humidity (sensor 220). For each combination of these parameters, a unique BTU value will exist. Thus, CPU 27 can read the values of these parameters from sensors connected at the remote station and calculate the corresponding BTU value.

Figure 28A:
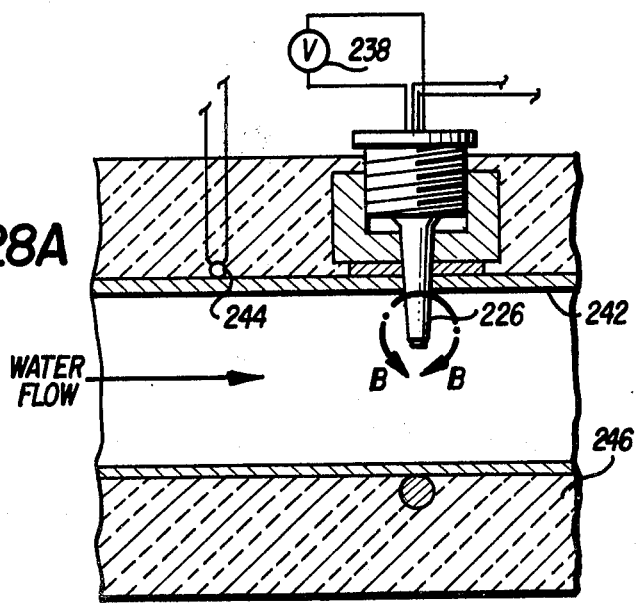
FIGS. 28A and 28B illustrates a fluid flow sensing system which may be used with the invention.
Figure 28B:
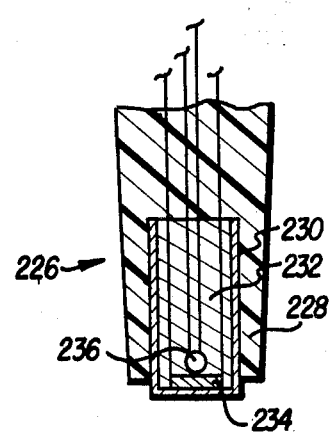

Water (or other liquid) flow is measured by the system of the invention in much the same manner as air flow. In this case, however, humidity variations are not a consideration. To measure water flow, a thermistor/resistor sensor, similar to that for the air flow, has been devised which is housed in a tiny metal can. This flow sensor is illustrated in FIG. 28A and 28B. The sensor 226 comprises a chip resistor 234 which is connected to a voltage source 238 for providing a constant temperature adjacent a thermistor 236 which is mounted by means of highly thermally conductive epoxy 232 in thermal contact with resistor 234. The entire assembly then is encased in a metal can 230 which is provided in a housing 228. The metal can is then inserted into a hole in a pipe 242 which defines a water flow path. A saddle T or other type of fixation device which will allow penetration of the metal can into the water stream without causing a leak in the pipe is used.

An additional thermistor 244 is mounted upstream of sensor 226. Sensors 244 and 226 operate essentially on the same principal as the two sensors of FIG. 27 which measure air flow. For any given water flow path, a set of curves can be experimentally obtained representing a temperature difference between the sensors which corresponds to a particular flow rate. Thus a set of curves can be experimentally obtained and stored by CPU 27 relating the water flow rate to a difference in temperature sensed by sensors 244 and 226. The cylindrical shape of the metal can makes it possible to place the flow sensor in a pipe perpendicular to the water flow without having to worry about its rotational position. Once the temperature difference is determined, CPU 27 can then calculate a water flow rate.

Figure 29:
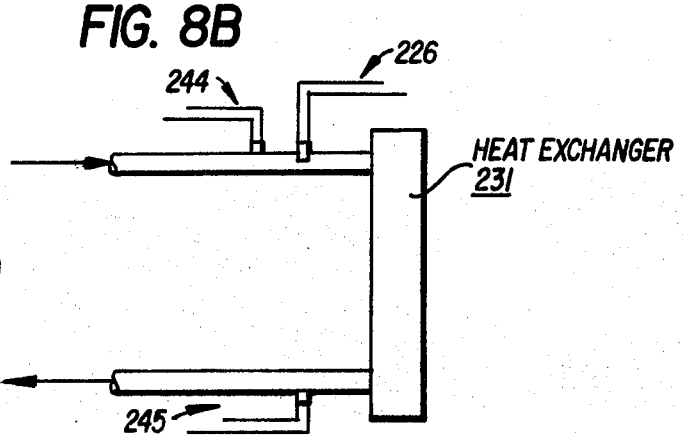
FIG. 29 illustrates a BTU sensing system which may be used with the invention.

For BTU measurements of liquid flow heat exchanger, the sensors 244 and 226 can be used on the input line to a heat exchanging device 231 (FIG. 29). The output line of the heat exchanging device can also be connected to another temperature sensor 245 identical to sensor 244. By measuring the input and output liquid temperatures with sensors 244 and 245 and the liquid flow rate with sensors 244 and 226 as described above, the amount of thermal energy emitted (or collected) by heat exchanger 231 can be determined.

The characteristics of the air and fluid flow sensors illustrated can be varied by changing the materials, component values, heater power, mechanical configuration and physical size. Consistency from one sensor to another is achieved when all these parameters are maintained constant. However, even if there are variations from one sensor to another, the data processing and storage capabilities of the CPU 27 can obtain consistency between sensors as it can store known flow calibration readings for each sensor so that actual sensor readings can be balanced out using the calibration data. Thus, inexpensive sensors can be used while still achieving a high degree of measurement accuracy.

CPU OPERATION

Sensor data gathering and processing for the system is handled under interrupt control of the CPU 27. Further processing of the sensor data into more meaningful information for the display of gathered and processed data is handled by an operator interactive sequential program (OIP) which runs continuously, except when interrupted by the various system interrupts.

The system uses three interrupts to control the operation of CPU 27. These have been briefly described above with reference to the system hardware. The highest priority interrupt $\overline{MTI}$ is generated under control of the master timer signal MTO which is the output of divider 683 in the master controller. MTO is a pulse signal generated, for example, at the rate of 512 pulses per hour (one every 7.03125 seconds).

The next highest priority interrupt $\overline{PTI}$ is generated under control of the output (PTO) of the system's programmable timer formed by programmable counter sections 679 and 681 in the master controller. This interrupt is the system's most active interrupt and the time between the occurrence of PTO is programmed by the CPU 27 during execution of a program. For purposes of subsequent description the $\overline{PTI}$ interrupt will be referred to as the sensor interrupt.

The lowest priority interrupt VI4 for the system is generated by the phase lock loop (PLL) multiplier 307 on the controller interface. The output of the phase lock loop frequency multiplier is 32 equally spaced pulses for each cycle of an applied 60 Hz input signal; that is, a pulse rate of 1920 Hz. These interrupts are used by CPU 27 to gather and process data for AC power measurements.

Figure 9:
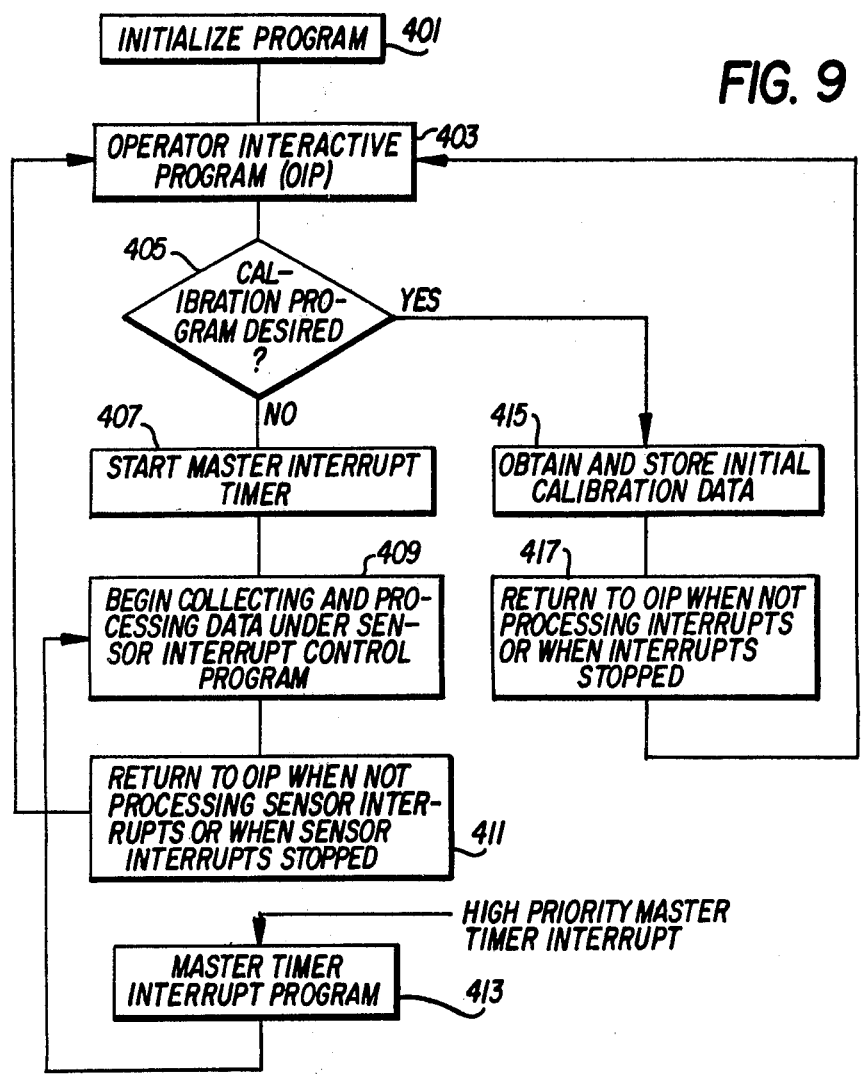
FIG. 9 is an overall system flowchart for the operation of the computer illustrated in FIG. 1.
Figure 10:
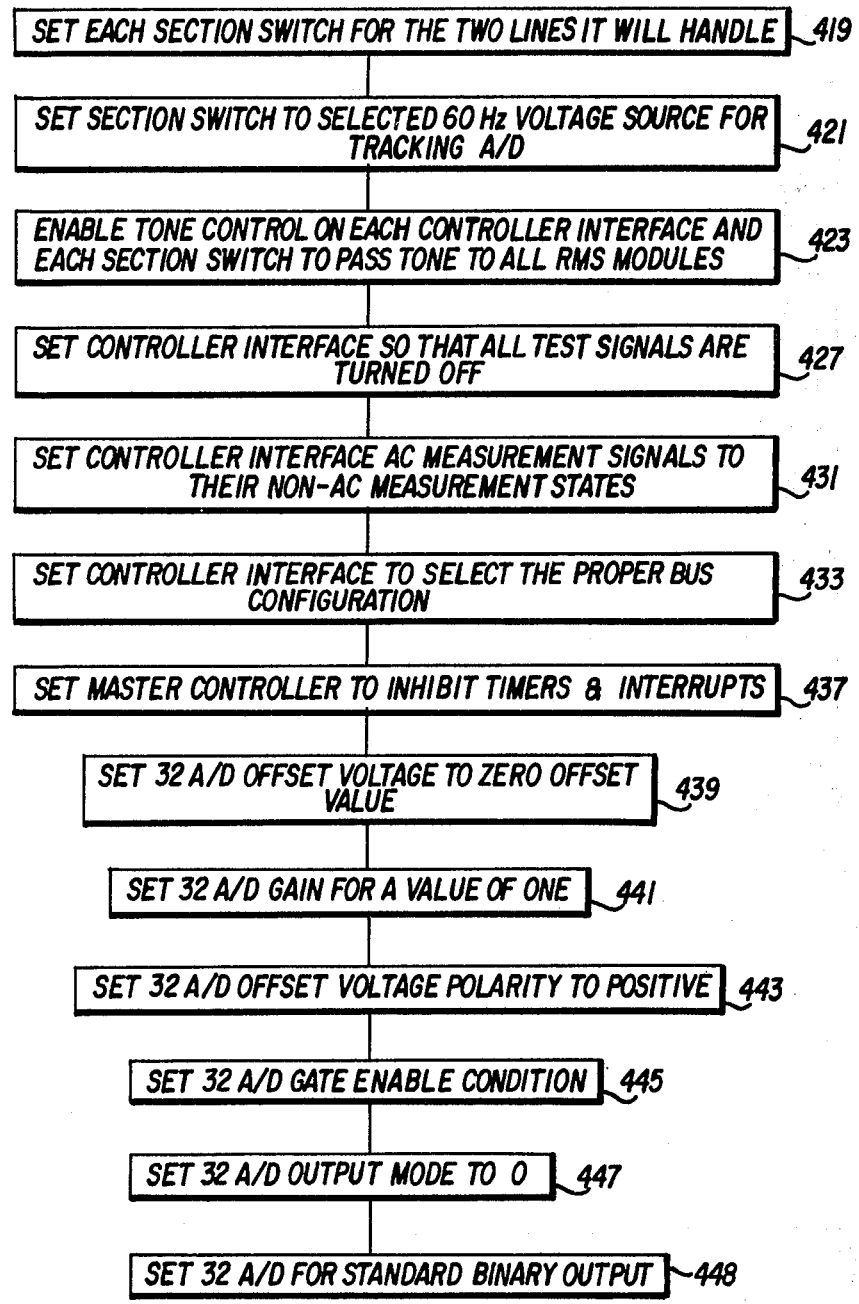
FIG. 10 is a flowchart of the initialization program illustrated in FIG. 9.

The overall program executed by CPU 27 is illustrated in FIG. 9. It begins at step 401 where the CPU 27 initializes the system hardware. The initialization program executed at step 401 is shown in FIG. 10 and described in detail below. The overall program next proceeds to step 403 which contains the operator interactive program (OIP) which is illustrated in greater detail in FIGS. 25A . . . 25M and also described in more detail below. During initial system installation and at periodic times thereafter, it is desirable to calibrate the system by taking measurements under known conditions of the outputs of various sensors which are connected to the information channels 10 at the remote stations. Accordingly, step 405 determines whether a calibration routine is desired. If so, the program proceeds to step 415 where the CPU 27 obtains and stores initial calibration data from the sensors under control of the sensor interrupt. This data is that which is supplied by CPU 27 to D/A converter 511 through latches 509 and 513. If no further sensor interrupts occur or when it completes processing a sensor interrupt, CPU 27 returns to the operator interactive program (OIP). Since the data gathering programs executed during system calibration (step 415) are the same as those executed during normal system operation (described below) to obtain sensor data, a separate discussion of the calibration data gathering programs will not be provided.

Assuming that calibration is not desired, the CPU proceeds to start the master interrupt timer in step 407. In this step, the CPU 27 removes the $\overline{\text{MTIR}}$ reset signal from latch 601 which allows flip flop 605 to be responsive to the MTO output of the master interrupt timer to provide the signal $\overline{\text{MTI}}$ at the output of buffer 613 (pin 10). CPU 27 also supplies signal MTPS to latch 601 which enables frequency divider 683.

again collecting and processing sensor data by returning to step 409.

It should be appreciated that the flowchart of FIG. 9 is a macro flowchart and that many individual programs or program steps occur at each operational block illustrated. A more complete description of CPU 27 operation follows.

The operational steps performed by CPU 27 when executing step 401 of FIG. 9 are shown in greater detail in the flowchart of FIG. 10.

When the system hardware is initially activated, it must be initialized, that is preset, to a particular installation environment. The section switches must be instructed as to which input lines they will handle, the tracking analog to digital converter in the section switches must be fed voltage from one of the available voltage sources, etc. This is what is accomplished by the initialization program.

In the first step 419 of the initialization program, the CPU supplies the section switch line selector latch 131 with data relating to which incoming line each section switch portion (FIG. 4) will handle, whether in a "split bus" or non-"split bus" configuration. Table I illustrates the line selecting bit value assignments of latch 131 for a "split bus" configuration, while Table II illustrates the bit value assignments for a non-"split bus" configuration.

TABLE I

| Latch 131 | 1st 8 Input Lines | | | | | | | | 2nd 8 Input Lines | | | | | | | |
|---|---|---|---|---|---|---|---|---|---|---|---|---|---|---|---|---|
| Latch Outputs | 0 | 1 | 2 | 3 | 4 | 5 | 6 | 7 | 8 | 9 | 10 | 11 | 12 | 13 | 14 | 15 |
| L1 A3 | 1 | 1 | 1 | 1 | 1 | 1 | 1 | 1 | 1 | 1 | 1 | 1 | 1 | 1 | 1 | 1 |
| L1 A2 | 0 | 0 | 0 | 0 | 1 | 1 | 1 | 1 | 0 | 0 | 0 | 0 | 1 | 1 | 1 | 1 |
| L1 A1 | 0 | 0 | 1 | 1 | 0 | 0 | 1 | 1 | 0 | 0 | 1 | 1 | 0 | 0 | 1 | 1 |
| L1 A0 | 0 | 1 | 0 | 1 | 0 | 1 | 0 | 1 | 0 | 1 | 0 | 1 | 0 | 1 | 0 | 1 |
| L0 A3 | 1 | 1 | 1 | 1 | 1 | 1 | 1 | 1 | 1 | 1 | 1 | 1 | 1 | 1 | 1 | 1 |
| L0 A2 | 0 | 0 | 0 | 0 | 1 | 1 | 1 | 1 | 0 | 0 | 0 | 0 | 1 | 1 | 1 | 1 |
| L0 A1 | 0 | 0 | 1 | 1 | 0 | 0 | 1 | 1 | 0 | 0 | 1 | 1 | 0 | 0 | 1 | 1 |
| L0 A0 | 0 | 1 | 0 | 1 | 0 | 1 | 0 | 1 | 0 | 1 | 0 | 1 | 0 | 1 | 0 | 1 |

TABLE II

| Latch 131 | 16 Input Lines | | | | | | | | | | | | | | | |
|---|---|---|---|---|---|---|---|---|---|---|---|---|---|---|---|---|
| Latch Outputs | 0 | 1 | 2 | 3 | 4 | 5 | 6 | 7 | 8 | 9 | 10 | 11 | 12 | 13 | 14 | 15 |
| L1 A3 | 0 | 0 | 0 | 0 | 0 | 0 | 0 | 0 | 1 | 1 | 1 | 1 | 1 | 1 | 1 | 1 |
| L1 A2 | 0 | 0 | 0 | 0 | 1 | 1 | 1 | 1 | 0 | 0 | 0 | 0 | 1 | 1 | 1 | 1 |
| L1 A1 | 0 | 0 | 1 | 1 | 0 | 0 | 1 | 1 | 0 | 0 | 1 | 1 | 0 | 0 | 1 | 1 |
| L1 A0 | 0 | 1 | 0 | 1 | 0 | 1 | 0 | 1 | 0 | 1 | 0 | 1 | 0 | 1 | 0 | 1 |
| L0 A3 | 0 | 0 | 0 | 0 | 0 | 0 | 0 | 0 | 1 | 1 | 1 | 1 | 1 | 1 | 1 | 1 |
| L0 A2 | 0 | 0 | 0 | 0 | 1 | 1 | 1 | 1 | 0 | 0 | 0 | 0 | 1 | 1 | 1 | 1 |
| L0 A1 | 0 | 0 | 1 | 1 | 0 | 0 | 1 | 1 | 0 | 0 | 1 | 1 | 0 | 0 | 1 | 1 |
| L0 A0 | 0 | 1 | 0 | 1 | 0 | 1 | 0 | 1 | 0 | 1 | 0 | 1 | 0 | 1 | 0 | 1 |

In the next step 409, CPU 27 begins collecting and processing sensor output data under control of the sensor interrupt ($\overline{\text{PTI}}$) appearing at pin 9 of the S-100 bus. Whenever sensor interrupts are not being processed or when the sensor interrupts stop, the CPU returns to the operator interactive program (OIP) in step 411.

Whenever the high priority master interrupt occurs (signal $\overline{\text{MTI}}$ on pin 10 of the S-100 bus), the CPU executes a master timer interrupt program which, among other things, sends a reset tone pulse to all the remote stations on the 32 communications lines and begins In step 421 latch 119 is addressed by CPU 27 and supplied data to configure switch 175 so that one of the voltages applied thereto is supplied as a voltage source to the input of tracking analog to digital converter 181.

If the configuration is a split bus configuration the correct voltage source is normally selected by resetting MODESEL and setting VSSEL-L1 and VSSEL-L2 of latch 119 on all the section switches. In this configuration the CFGSEL signal of latch 371 is set and each section switch voltage source for the two lines L1 and L2 it has been assigned is selected by the data at the output of latch 119 according to Table III below.

TABLE III

| Latch 119 Outputs | First SS Portion Selected Line Input to SW 161 | | | | | | | | Second SS Portion Selected Line Input to SW 161 | | | | | | | |
|---|---|---|---|---|---|---|---|---|---|---|---|---|---|---|---|---|
| | 0 | 1 | 2 | 3 | 4 | 5 | 6 | 7 | 0 | 1 | 2 | 3 | 4 | 5 | 6 | 7 |
| L0 REFEN | 1 | 1 | 1 | 1 | 1 | 1 | 1 | 1 | 1 | 1 | 1 | 1 | 1 | 1 | 1 | 1 |
| L1 REFEN | 1 | 1 | 1 | 1 | 1 | 1 | 1 | 1 | 1 | 1 | 1 | 1 | 1 | 1 | 1 | 1 |
| REFSELA0 | 0 | 0 | 0 | 0 | 0 | 0 | 0 | 0 | 0 | 0 | 0 | 0 | 0 | 0 | 0 | 0 |
| REFSELA1 | 0 | 0 | 0 | 0 | 0 | 0 | 0 | 0 | 0 | 0 | 0 | 0 | 0 | 0 | 0 | 0 |
| REFSELA2 | 0 | 0 | 0 | 0 | 0 | 0 | 0 | 0 | 0 | 0 | 0 | 0 | 0 | 0 | 0 | 0 |
| MODESEL | 0 | 0 | 1 | 1 | 0 | 0 | 1 | 1 | 0 | 0 | 1 | 1 | 0 | 0 | 1 | 1 |
| VSSEL-L0 | 1 | 1 | 0 | 0 | 1 | 1 | 1 | 1 | 1 | 1 | 0 | 0 | 1 | 1 | 1 | 1 |
| VSSEL-L1 | 1 | 1 | 1 | 1 | 1 | 1 | 1 | 1 | 1 | 1 | 1 | 1 | 1 | 1 | 1 | 1 |

If the configuration is a normal bus configuration with one voltage source the correct voltage phase is selected by choosing the phase via controller interface latch 373 outputs PH0 and PH1 which control switch 337 according to Table IV below:

TABLE IV

| Latch 373 Outputs | Phase selected by SW 337 | | |
|---|---|---|---|
| | Phase A | Phase B | Phase C |
| PH0 | 1 | 0 | 1 |
| PH1 | 0 | 1 | 1 |

Normally in this configuration the only tracking A/D converter in the system is the one on the controller interface and thus signals $\overline{\text{SSADOFF}}$ and $\overline{\text{CIFADOFF}}$ of latch 371 are reset.

If the configuration is a normal bus configuration with two voltage sources then signals $\overline{\text{SSADOFF}}$ and $\overline{\text{CIFADOFF}}$ of latch 371 are set thus activating the section switch tracking A/D converters 181. In this case the proper voltage source is chosen first by selecting the phase as shown above and then the source by switches 175 according to Table V below:

TABLE V

| | Line 0 Switch 175 Voltage Inputs | | Line 1 Switch 175 Voltage Inputs | |
|---|---|---|---|---|
| | Source 1 (pin 34) | Source 2 (pin 33) | Source 1 (pin 34) | Source 2 (pin 33) |
| MODESEL | 1 | 1 | 1 | 1 |
| VSSEL-L0 | 1 | 0 | X | X |
| VSSEL-L1 | X | X | 1 | 0 |

X = don't care

In step 423 CPU 27 enables the controller interface 15 and section switches 17 to pass a tone signal to all remote stations connected to the line which has been selected for each section switch portion. This initial tone is designed to change the power supplies 63 in each of the remote stations.

"Enable Tone" is accomplished by first setting the output bits F0 . . . F4 of latch 369 as shown in Table VI below to select a desired tone frequency:

TABLE VI

| Frequency | F4 | F3 | F2 | F1 | F0 |
|---|---|---|---|---|---|
| 40KHz | 1 | 1 | 0 | 0 | 0 |
| 62.5KHz | 0 | 1 | 1 | 1 | 1 |
| 100KHz | 0 | 1 | 0 | 0 | 1 |
| 142.8KHz | 0 | 0 | 1 | 1 | 0 |

Then the TONEN output of latch 601 of the master controller is set and finally the output lines 719, 721, 723, 725 and 727 of latch 119 of all the Section Switches are set according to the Table VII below so that switch 161 passes a tone to the input line assigned to a section switch portion:

TABLE VII

| L0REFEN | 1 |
|---|---|
| L1REFEN | 1 |
| REFSELA0 | 0 |
| REFSELA1 | 0 |
| REFSELA2 | 0 |

In step 427 the CPU 27 addresses latch 371 and sets the $\overline{\text{ADTEST}}$ signal to turn off the application of test signals AD0 through AD9 to pins 74, 75, 76, 82, 83, 84, 85, 86, 87 and 37 of the system bus 13 through gated buffer 379 and gated buffer 375. In step 431 the CPU 27 configures each section switch to its DC measurement state by addressing latch 373 in the controller interface to $\overline{\text{ACMEN}}$ and reset $\overline{\text{ACGRD}}$, which are applied to switch 199 ($\overline{\text{ACMEN}}$) switches 201 and 207 ($\overline{\text{ACGRD}}$). Switch 241 receives the signal $\overline{\text{DELACGRD}}$, which is generated by delay 137 (FIG. 3).

In step 433, the CPU 27 sets the controller interface for a split or non-split bus configuration of the section switches. The split bus configuration is selected by setting signal CFGSEL at latch 371. This signal is reset for normal (non split-bus) configuration. The split bus configuration is used if a voltage output from a sensor attached to an information channel 10 at a remote station is to be supplied on line 150 for use by the tracking A/D converter 183. If the voltage sensing is done off an incoming power line, a normal bus configuration would be selected by CPU 27.

In step 437 CPU 27 addresses the master controller to inhibit the programmable timer and the generation of interrupt signals from the master controller. CPU 27 does this by addressing latch 601 to reset the signals $\overline{\text{PTIR}}$, $\overline{\text{MTIR}}$, VI4EN, PTEN and MTPS.

In step 439 CPU 27 addresses latches 513 and 509 in analog to digital converter 21 supplying thereto a data value representative of a zero offset voltage which is applied as an input to D/A converter 511. In step 441 CPU 27 addresses latch 509 in the A/D converter 21 supplying thereto a signal on the GAIN 4X line which instructs summing amplifier 512 to have a gain of 1.

In step 443, CPU 27 sets the polarity of the D/A converter 511 to a positive polarity output by the signal SIGN which is supplied as data to latch 509.

In step 445, CPU 27 also supplies a $\overline{\text{GATE EN}}$ signal to latch 509 which is applied via gate 571 to line 911 as an enabling signal to the one of 32 line selector 503. In step 447, CPU 27 supplies the 11 BIT signal to latch 509 to set the A/D converter 21 to a mode 0 state (set output "0" of decoder 551 in A/D converter 21 (FIG. 8B)). Finally, in step 448 CPU 27 sets A/D converter 21 for a standard binary output by setting the $\overline{\text{TWO'S COMP}}$ signal on latch 509.

Figure 11:
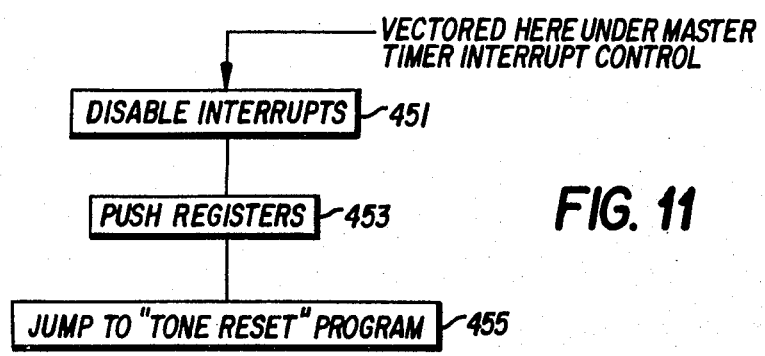

FIGS. 11 and 12 illustrate the master timer interrupt programs executed by CPU 27 in step 413 of FIG. 9, when a master timer interrupt (MTI) is received. In step 451 of FIG. 11, CPU 27 disables all maskable interrupts by sending its internal interrupt controller the proper signal. In step 453, CPU 27 "pushes" the contents of various registers into a stack memory for later retrieval in resuming the processing of an interrupted program when processing of the interrupt is finished. In step 455, CPU 27 jumps to the "Tone reset" program illustrated in FIG. 12.

In the first step 457 of the tone reset program CPU 27 applies a tone to all the communications channels (lines) interconnecting the section switches with the remote station groups. The steps for enabling a tone were described earlier with reference to step 423 of FIG. 10.

In a subsequent step 459, CPU 27 sets the programmable timer in the master controller with a digital value corresponding to 99.99 miliseconds. This is accomplished by CPU 27 resetting the signals PTEN and $\overline{\text{MTIR}}$ at latch 601. CPU 27 then supplies output data via buffer 685 to the inputs of programmable counter sections 679 and 681 in two successive eight bit loads controlled by load signals CTP and FTP which the CPU also supplies through address decoder 793. Then the signals PTEN and $\overline{\text{MTIR}}$ are set to start the counting of sections 679 and 681. At the end of the count a sensor interrupt control signal $\overline{\text{PTO}}$ will occur which initiates a sensor interrupt $\overline{\text{PTI}}$ at pin 9 of the S-100 bus (FIG. 7).

In step 461, the CPU 27 next stores the address of a program identified as "Sensor 0 data gathering" at NIPAD which is a pointer to the memory address of the first step of a program to be executed next. In step 463, CPU 27 "pops" the contents of the stack memory back into the CPU registers thereby restoring the data which had been previously pushed onto the stack so that CPU 27 can continue to execute a previously interrupted program. In the next step 465, the CPU enables the maskable interrupts by sending its interrupt controller the proper signal.

In step 467, the CPU 27 then returns to processing of the previously interrupted program and awaits the next sensor interrupt. It must be remembered that at this time a tone is being applied to all communications channels through the section switches and that the sensor interrupt timer has been set for 99.99 ms which is the time period for a "reset" tone. Fig. 13 illustrates a series of programs which are entered at various occurances of subsequent sensor interrupts. FIG. 14 illustrates the sensor interrupt program which is executed first at each sensor interrupt.

When the next sensor interrupt occurs under control of the $\overline{\text{PTO}}$ signal outputted by the programmable (sensor) interrupt timer (after 99.99 ms), CPU 27 first executes the sensor interrupt program of FIG. 14. In the first step 602 all the interrupts are disabled in the manner described earlier with reference to step 451 of FIG. 11. Then the registers are "pushed" in step 604 and the program having its address stored at NIPAD is executed in step 606. After execution of the program whose address is at NIPAD, CPU 27 "pops" the registers in step 608, enables the interrupts in step 610 and returns to the previously interrupted program in step 612.

Figure 13A:
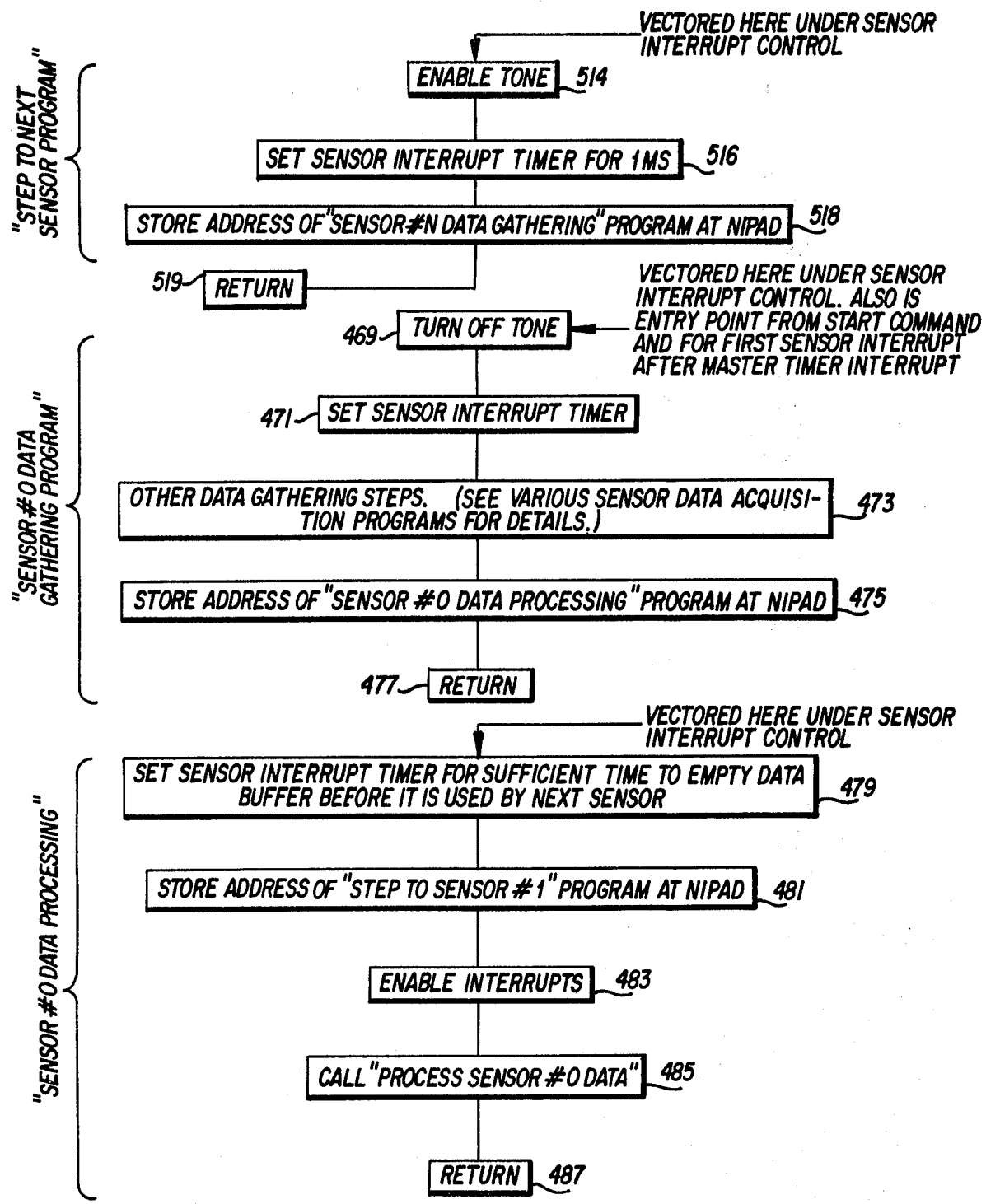
FIG. 13 is a flowchart showing the essential steps of the data collecting and processing programs illustrated in FIG. 9.

Since the address of the "Sensor #0 data gathering" program was previously stored at NIPAD (Step 461 FIG. 12) this is the first interrupt driven program run after the FIG. 12 program is executed. The "Sensor #0 data gathering" program is shown in FIG. 13A, 13B. As a first step 469 the resetting tone which was started at step 457 of the FIG. 12 program is turned off. This is accomplished by CPU 27 addressing the master controller and outputting data to latch 601 which resets the TONE EN (tone enable) signal on line 811. If it is desired to turn off the reset tone only on some lines the Master Controller TONE EN signal is left in the enabling condition and the signals L1 REFEN and L2 REFEN at latch 119 of each Section Switch are reset for each line where no tone is desired. At this point, the system is reset and subsequent tones (tone bursts) sent to a group of remote stations connected to a respective communications channel will cause the information channels at the remote stations to be sequentially addressed and connected to the communications channel. As earlier described, each remote station of a group is enabled by a numerical range of applied tones, e.g. 0–15, 16–31, 32–47, etc., while a different information channel of a remote station is connected to the communications channel upon the occurrence of each tone in the numerical range to which a remote station responds. For a system having 16 remote stations each having 16 information channels, 256 tones will serve to address all information channels. It should also be remembered that there may be, for example, up to 32 groups of remote stations connected to the central station by respective communications channels to which all tones are supplied simultaneously. Thus, the CPU is simultaneously addressing, gathering and processing data for 32 sensor outputs, one for each communications channel.

Returning to the "Sensor #0 data gathering" program (FIGS. 13A, 13B), in step 471 CPU 27 sets the programmable interrupt timer with a time value sufficient to allow the data on the lines from the sensor to settle. Typically, this will be 8 milliseconds but may vary depending on the type of sensor which is connected to the line. Since the manner in which the programmable timer is addressed and programmed by the CPU 27 was discussed with reference to step 459 of FIG. 12 it will not be repeated herein. In step 473, the CPU 27 performs other data gathering steps which may include setting of the programmable timer and other sensor interrupts. These programs will vary depending on the type of sensor output which is being examined. Different types of sensors can be used in the present invention to provide measurements of (1) resistance, (2) precision resistance changes, (3) DC voltage and (4) AC power. Specific exemplary programs for the different types of sensor output measurements will be described in detail below.

Upon completion of data gathering step 473, CPU 27 proceeds to step 475 where it stores the address of the "Sensor #0 data processing" program at NIPAD. From there, the CPU 27 proceeds to the return step 477. At this point, the CPU has gathered the digitized output data from Sensor #0 on all communications channels. When the next sensor interrupt is received, CPU 27 again executes the FIG. 14 routine except now NIPAD points to the "Sensor #0 data processing" program shown in FIG. 13A which is executed at step 606 of FIG. 14. This program begins at step 479 where the sensor interrupt timer is set for a time sufficient to empty the data buffer. Upon completion of step 479, CPU 27 proceeds to step 481 where it stores the address of a "Step to sensor #1" program at NIPAD. Subsequently, CPU 27 enables the interrupts in a manner described earlier and proceeds to step 485 where it calls the "Process sensor #0 data" program. Exemplary programs for processing various data from the sensors will be described below. After executing the "Process sensor #0 data" program, CPU 27 proceeds to return step 487, and proceeds from there to steps 608, 610 and 612 of the sensor interrupt program of FIG. 14.

Since NIPAD now contains the address of the program "Step to sensor #1", which is generally shown at the top of FIG. 13 as a "Step to next sensor" program, the next sensor interrupt causes CPU 27 to execute this program in step 606 of the sensor interrupt program (FIG. 14). In the first step 514 thereof, the tone is enabled as previously described. This tone causes sensor #1 of each group of remote stations to be connected to a respective communications channel. The sensor interrupt timer is then set for 1 millisecond in step 516 to define the tone duration and the address of the "Sensor #1 data gathering" program is set in NIPAD at step 518. The CPU then returns at step 519. Upon occurrence of the subsequent sensor interrupts, CPU 27 proceeds to execute a "Sensor #1 data gathering" program and then a "Sensor #1 data processing" program corresponding to steps 469 through 487 described earlier with reference to sensor #0.

In like manner, the CPU 27 proceeds upon receipt of successive sensor interrupt signals, to step through the programs for tone addressing a sensor, and gathering and processing the data for an addressed sensor. FIG. 13B illustrates the execution of the routine for addressing the last sensor of a first addressed remote station (e.g., sensor #15) and storing and processing output data therefrom. This routine begins at step 497 where the CPU 27 executes the "Step to last sensor" program (same as steps 514, 516, 518 and 519). It then proceeds to step 499 where it executes the programs for gathering and processing data for the last sensor and sets up for sensor #0 of a second remote station (corresponding to steps 469-487). At step 502, CPU 27 increments a unit counter which counts the number of remote stations of a group connected to a communications channel which have been addressed and at step 504 the CPU determines if the unit counter equals a maximum number or not. The purpose of the unit counter and the decision step 504 is to test whether all of the sensors at all of the remote stations of a group have been addressed. The unit counter counts the number of times all sensors #0–15 have been addressed and processed, which represents the number of remote stations which have been processed. If all remote stations of a group have not been processed, CPU 27 proceeds to return step 508 where it awaits the next sensor interrupt at which time the "Step to Sensor #0" program will be executed, this time for the next remote station. If the unit counter equals its maximum, indicating that the last sensor of the last remote station has been read, the CPU resets the unit counter to zero in step 510 and discontinues any further sensor interrupts and returns to the OIP program awaiting the occurrence of a master interrupt in step 512. When a master interrupt occurs, the programs of FIGS. 11 through 14 are again executed as described above to begin another sensor addressing and data gathering and processing cycle.

When the "Step to next sensor" program is executed for the first time following a master interrupt, the data stored in NIPAD at step 518 will be the address of the "sensor #0 data gathering" program; however, for subsequent sensor interrupts, this address will change to correspond with the next sensor, i.e. 1, 2 . . . etc. data gathering program which must be executed.

The generalized program illustrated in FIG. 13 for sequentially tone addressing the sensors and gathering and processing sensor data will change somewhat for different types of sensors which may be used. As noted, some sensors may change a resistance value or an output voltage as a monitored parameter changes. The system is able to perform resistance measurements, precision resistance change measurements, DC voltage measurements, and AC power measurements. For each type of measurement, a slightly different "Step to next sensor", "Sensor data gathering" and "Sensor data processing" program will be used.

Figure 15:
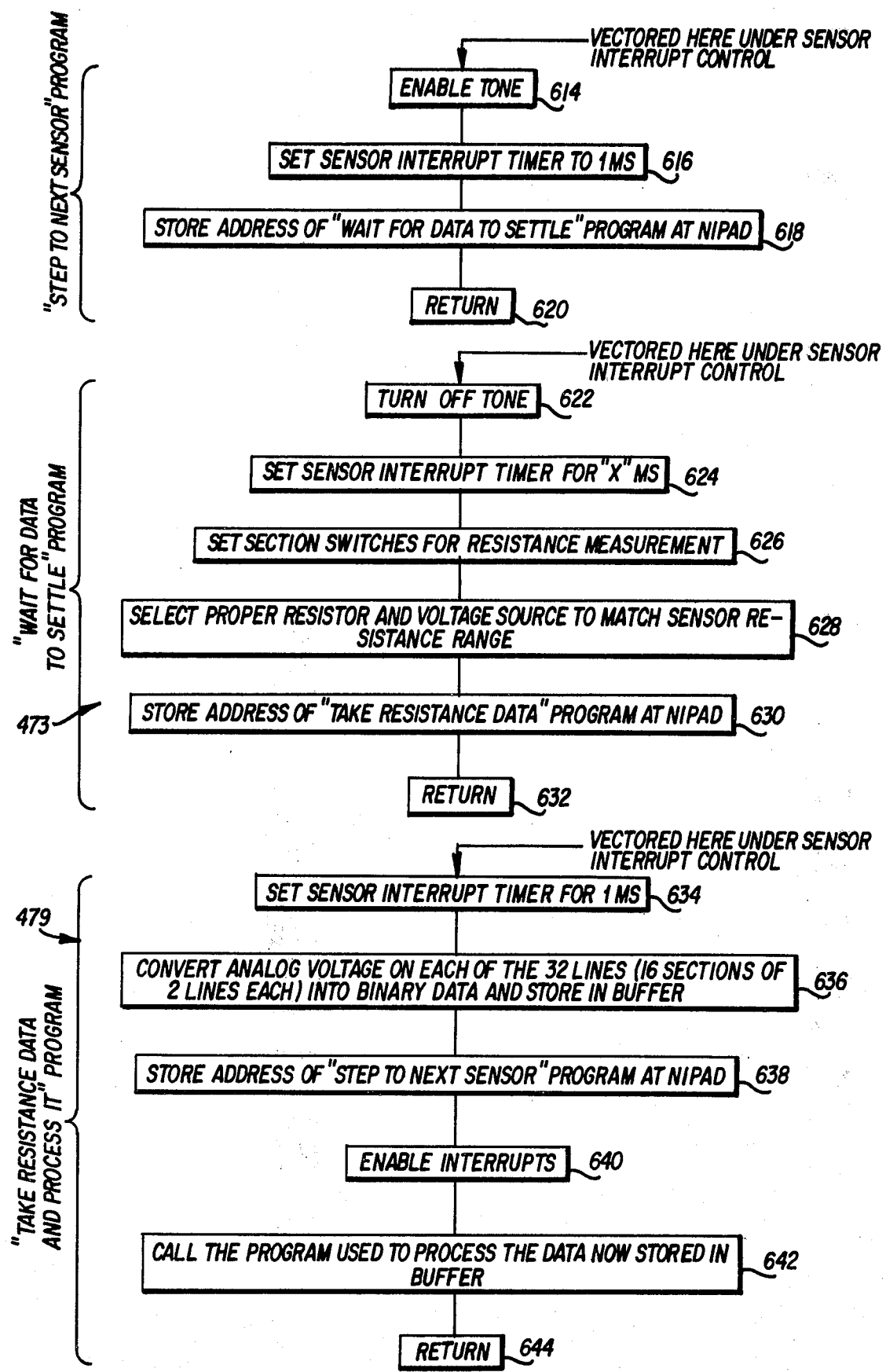
FIG. 15 is a flowchart of the program of FIG. 13 as specifically configured to gather and process data for a resistance measurement.

For sensor output resistance measurements, the programs of FIG. 15, which are slightly modified versions of the generalized FIG. 13 programs, are executed.

The "Step to next sensor" program includes step 614 where a tone is enabled, step 616 where the sensor interrupt timer is set for 1 millisecond and step 618 where the address of a "Wait for data to settle" program is stored at NIPAD. Steps 614 and 616 correspond directly with steps 514 and 516 described above with reference to FIG. 13.

The first step in the "wait for data to settle" program is 622 where the CPU turns off the tone. This step corresponds to step 469 of FIG. 13. CPU 27 then proceeds to step 624 where it sets the sensor interrupt timer for sufficient time "X" required to allow data from a monitored sensor to settle on the line. This may vary from sensor to sensor, but is typically 8 ms. In step 626, the CPU sets up the section switches for the resistance measurement mode. Here the CPU sets the signal $\overline{\text{ACMEN}}$ and resets the signal $\overline{\text{ACGRD}}$ in latch 373, of the controller interface (FIG. 6A). CPU 27 then proceeds to step 628 where it selects a proper resistance and voltage source to match the sensor output resistance range. This is accomplished by setting a proper code on the signal lines REFSELA∅, REFSELA1, REFSELA2, L1 REFEN and L2 REFEN at latch 119 by the CPU. Upon completing step 628, the CPU 27 proceeds to step 630 where it stores the address of the "Take resistance data" program at NIPAD and then to step 632 where it returns and awaits the next interrupt. When the next interrupt occurs, the CPU executes the "Take resistance data" program since this is the program whose address is presently stored at NIPAD. The first step of this program is illustrated as step 634 where the sensor interrupt timer is now set for one millisecond. Upon completing step 634, the CPU advances to step 636 where it sequentially converts analog voltage on each of the 32 communications channels extending between the section switches and remote stations into binary data and stores this in a buffer area. Upon completing this, the CPU advances to step 638 where it stores the address of the "Step to next sensor" program at NIPAD. It then proceeds to step 640 where it enables the interrupts and from there to step 642 where it calls the program used to process the data which has been stored in the buffer area. Upon completing step 642, the CPU returns to process an interrupted program in step 644 and awaits the next sensor interrupt. When the next sensor interrupt occurs, the CPU will be instructed by the address at NIPAD to proceed to step 614 of the "Step to next sensor" program where it enables the tone in step 614. Then in step 616, the CPU sets the sensor interrupt timer for one millisecond. After completing step 616, the CPU 27 advances to step 618 where it stores the address of the "Wait for data to settle" program at NIPAD, which has just been described.

The programs illustrated in FIG. 15 are repeated for each of the sensors of a remote station in the manner described above with reference to FIGS. 13A and 13B. When the last sensor, e.g. #15, of a remote station is processed; that is, when step 642 of FIG. 15 is executed for the last sensor of a remote station, the CPU executes a routine consisting of steps 502 ... 512 (FIG. 13B) to determine if all remote stations of a group have been processed. If not, the FIG. 15 programs are repeated until all sensors of all remote stations of a group have been processed at which time the CPU will return to OIP (step 512, FIG. 13B).

The program which is used to process the data stored in the buffer area which is called at step 642 by CPU 27 may take any one of a number of different forms depending upon what the measurement represents. The value may represent, for example calibration data, an air or liquid temperature value, or any other measured parameter. Depending on what the data represents, one of the applications programs of FIGS. 16 through 20 will be called at step 642 of FIG. 15.

If the measurement represents communication path resistance calibration data, the program at FIG. 19 is called in step 642 of FIG. 15. Acquisition of the communication path resistance calibration data occurs when the calibration program is called for at step 405 of FIG. 9. At this time, sensor calibration data is gathered from the sensors as just described. Following this, the calibration data is processed according to the FIG. 19 program. In the first step 804 of the FIG. 19 program, the CPU 27 sets a line counter N to one. It then fetches the present sensor calibration data from the buffer in step 806 for line N of the current set of remote stations (units) (N represents one of the 32 incoming communications channels. The 32 lines can be identified by a section switch S (0–15) and line L (0, 1) numbers, but for purposes of simplicity line number N (1–32) can and will also be used in the subsequent description.). In step 808, the CPU fetches the previous sensor calibration data for line N. A comparison is then made by CPU 27 in step 810 between the present and previous sensor calibration data. If they differ by less than $+1\%$ as determined in step 810, the CPU then adds a value of 1 to N in step 812 and proceeds to determine if the sensor calibration data for all lines have been processed in step 814. If all the lines have not been processed, the CPU proceeds to step 806 where sensor calibration data for the next line is fetched. If in step 814 CPU 27 decides that sensor data for all lines N (32) of the current set of units have been examined, it returns in step 822.

If in step 810 the present calibration data differs from the previous calibration data for a given line N by more than $\pm 1\%$, the line number N and the unit (remote station) number are all stored in an error buffer in step 818 after which CPU 27 sets an error flag in step 820. The CPU then proceeds to step 812.

If the gathered data represents an air temperature, the application program illustrated in FIG. 21 is executed at step 642 of FIG. 15. This application program begins at a step 836 in which CPU 27 sets a line counter value N to one. In step 838, a present sensor air sample value is fetched from a buffer for line N of the current set of units. This value is corrected with a previously stored correction value for line N of the current set of units, and an equivalent air temperature value is determined in step 840. In step 842, the CPU then adds the temperature value to an hourly accumulator and proceeds to step 844 where it increments N. In step 846, CPU 27 determines if the data for all lines N have been examined (N=33). If not, the CPU returns to step 838 where the next line sensor temperature sample is processed. If all lines have been processed, CPU 27 proceeds from step 846 to return step 852.

Figure 22:
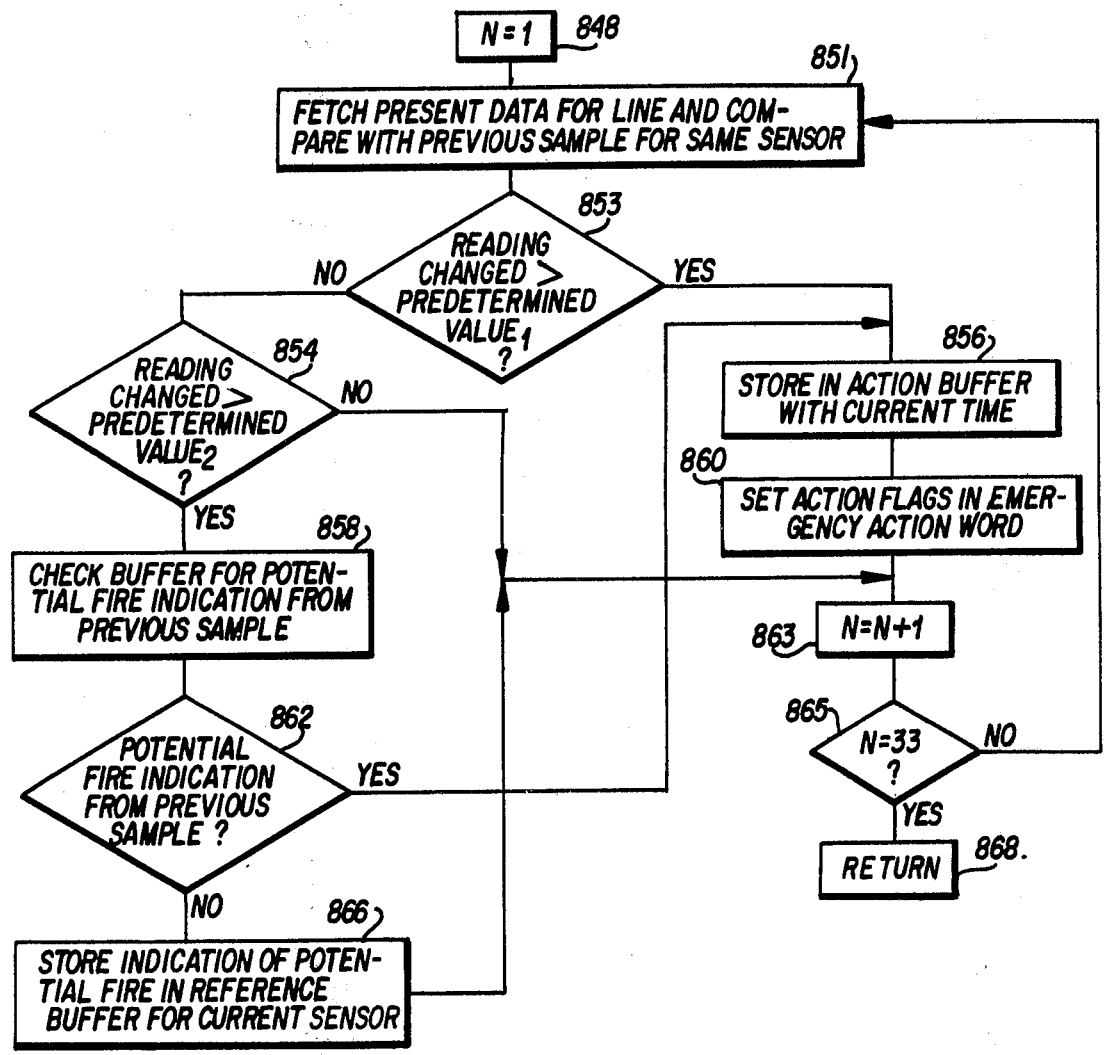
FIG. 22 is a flowchart of a program for processing gathered fire condition data.

A sensor output may also be used to represent a temperature which may be monitored for a fire condition. In such a case, the fire process routine of FIG. 22 is used as the program which is called in step 642 of FIG. 15. In the first step 848 of this program CPU 27 sets a counter value N to 1. In step 851 the CPU fetches the present sensor sample data for line N and compares it with a previous sample data for line N. In step 853, a decision is made by the CPU as to whether the temperature difference between the compared values exceeds a first predetermined value, thus indicating a fire. If a yes condition is realized in step 853, the CPU then stores in step 856 the unit number (remote station number) in an action buffer together with the current time. The CPU then proceeds to step 860 where it sets an action flag in an emergency action status word and then proceeds to step 863 where it increments N. In step 865, the CPU determines if data for all lines have been processed (N=33). If not, the CPU returns to step 851; if so, the CPU proceeds to return at step 868.

If step 853 indicates there is no fire, that is, the change in sensor reading between two sucessive samples does not exceed the first predetermined value, the CPU advances to step 854 where it checks to see whether the difference exceeds a second lower predetermined value which may indicate a potential fire. If a yes condition exists in step 854 the CPU proceeds to step 858 where it checks a buffer for a potential fire indication from a previous sample. If it finds one in step 862 it proceeds to step 856 and stores information relating to the unit number (remote station number) and current time in the action buffer as described previously. If step 862 indicates that there was no previous potential fire indicated, the CPU proceeds to step 866 where it stores an indication of a potential fire in a reference buffer for the current unit for comparison with a subsequent sample of that unit sensor output upon the next execution of the program. From step 866, the CPU then proceeds to step 863 where it increments the line number N. If, in step 854, the CPU determines that there is no potential fire, it proceeds to step 863 to increment to the unit number N.

Figure 23:
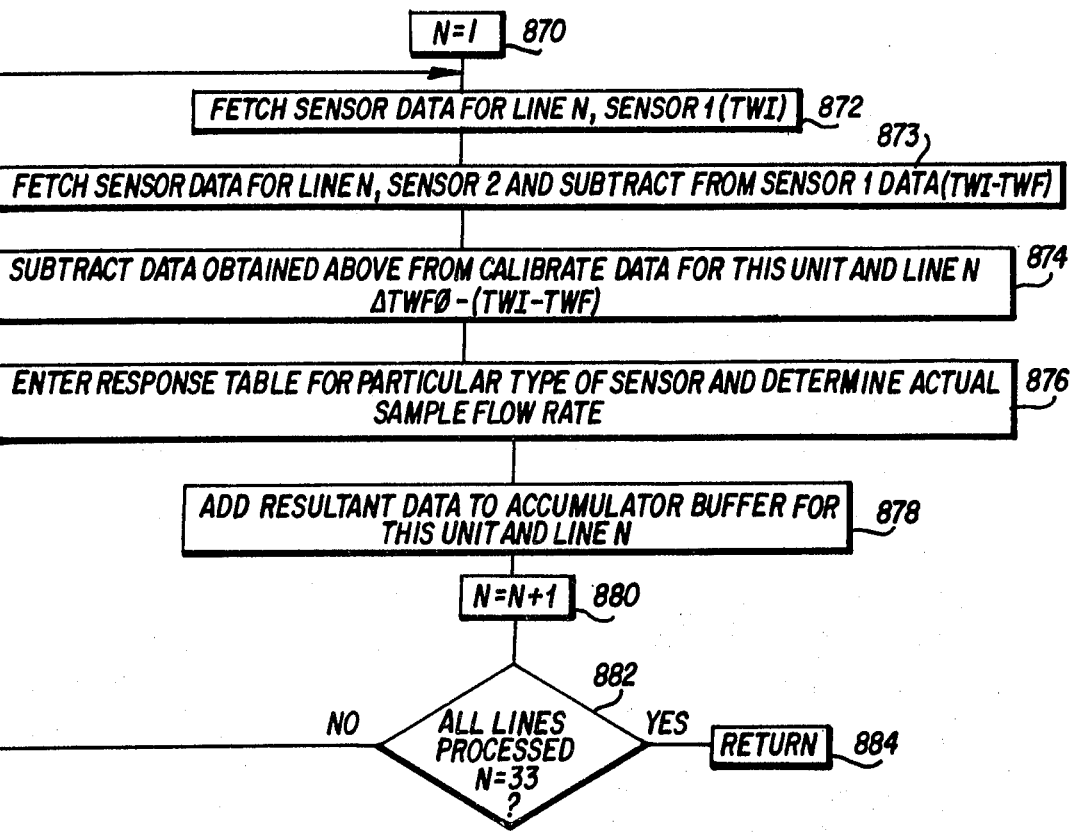
FIG. 23 is a flowchart of a program for processing gathered fluid flow data.

If the gathered sensor data represents fluid flow conditions at a remote station, then the application program of FIG. 23 is executed by the CPU when it reaches step 642 of the FIG. 15 program. The first step 870 in this program is the setting of a line counter value N to 1. Then in step 872, CPU 27 fetches first sensor data TWI (temperature of water in) (e.g. the upstream sensor 244 in FIG. 28A) for line N. This data was previously acquired and stored by the CPU in a temporary buffer when processing the data gathering program for this sensor. In step 873, the CPU 27 fetches second sensor (flow) data TWF (temperature of water flow) (e.g. the downstream sensor 226 in FIG. 28A) for line N, which was obtained during processing of the present sensor, subtracting it from the data fetched in step 872 to yield (TWI−TWF). In step 874, the value calculated in step 873 is further subtracted from previously acquired and stored calibration data ΔTWFO (ΔTWFO−(-TWI−TWF)) for line N representing the difference between the data of the first and second sensors under known flow conditions. The result of the calculation in step 874 is then used in step 876 in a table look-up function for the type of sensor employed to determine the actual flow rate. As noted earlier, a table of flow values can be developed relating the outputs of the upstream and downstream sensors to a flow rate. The data from step 876 is then added to resultant data in an accumulator buffer in step 878 and in step 880 the CPU increments the unit counter N. In step 882, the CPU determines whether all lines have been processed (N=33) and if not, CPU returns to step 872 where it begins processing data for the next line. If data for all lines has been processed, as determined in step 882, the CPU returns at step 884.

Figure 24:
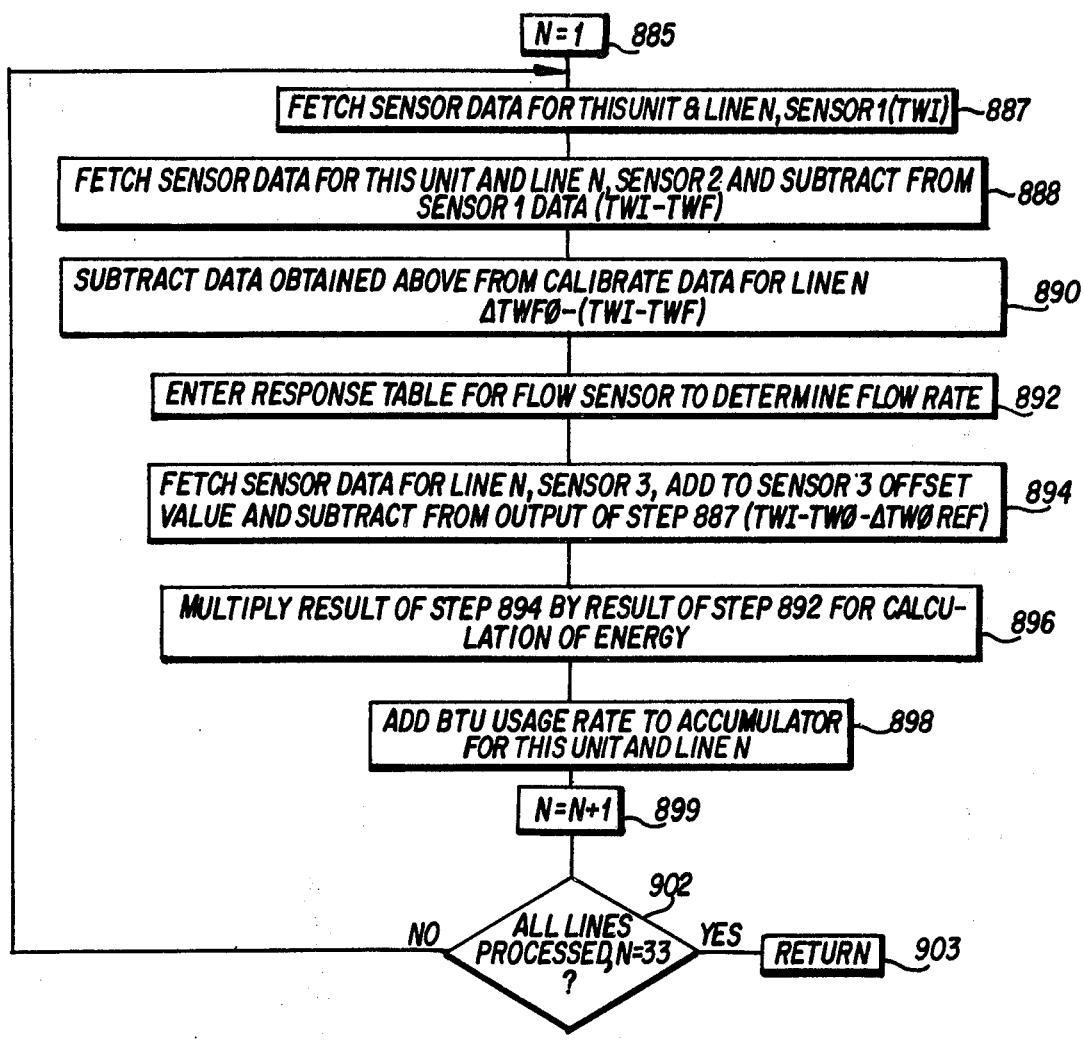
FIG. 24 is a flowchart of a program for processing gathered BTU data.

If the gathered sensor data represent BTU data, the application program of FIG. 24 is executed at step 642 of FIG. 15. In step 885 of this program, the CPU sets a line counter value N to 1. In step 887, the CPU fetches first sensor data TWI (temperature of water in) for line N (e.g. an upstream temperature sensor). This data was previously acquired and stored by the CPU in a temporary buffer when processing the data gathering program for this sensor. Following this in step 888, the CPU fetches second sensor data TWF (temperature of water flow) for line N (e.g. a downstream temperature sensor), subtracting it from the sensor data fetched in step 887 to yield TWI−TWF. The subtracted data is then further subtracted from previously acquired and stored calibration data ΔTWFØ for line N of the current set of units representing the difference between the data of the first and second sensors under known flow conditions. Following this the CPU proceeds to step 892 where it uses the value calculated in step 890 (ΔTWFO−(TWI−TWF)) in a table look-up operation to determine flow rate through a heat exchanger corresponding to the value calculated. The CPU then proceeds to step 894 where it fetches third sensor data TWO for line N (sensor 245, FIG. 29), which was also previously acquired and stored by the CPU when processing the data gathering program for this sensor. The third sensor data represents a downstream fluid temperature at the output of a heat exchanger. This data is corrected with previously acquired calibration data (ΔTWO), and is subtracted from the data TWI obtained in step 887 to determine the difference in temperature between the input and output of a heat exchanger. This value is then used in step 896 by the CPU as a value which is multiplied by the flow rate acquired in step 892 for calculation of a thermal energy usage rate; that is, the BTU rate. In step 898, the calculated BTU rate is applied to an accumulating buffer and the CPU then increments the unit counter N in step 899, after which it determines in step 902 if data from the sensors of all lines has been processed. If not, CPU returns to step 887 where data for the next line is processed. If all units have been processed as determined in step 902, the CPU returns at step 903.

Figure 16A:
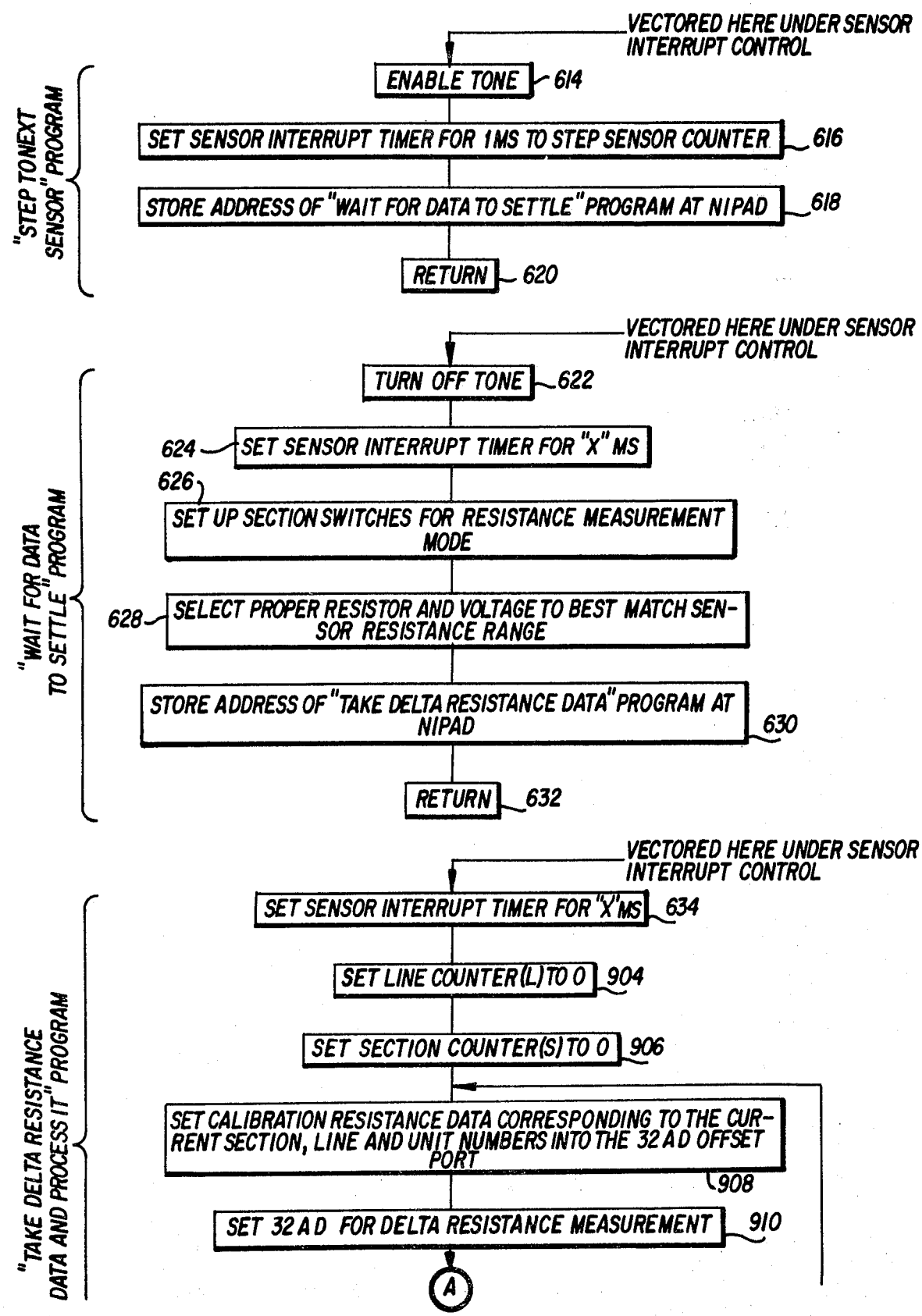
FIGS. 16A and 16B taken together form a flowchart of the program of FIG. 13 as specifically configured to gather and process data for a precision resistance change measurement.
Figure 16B:
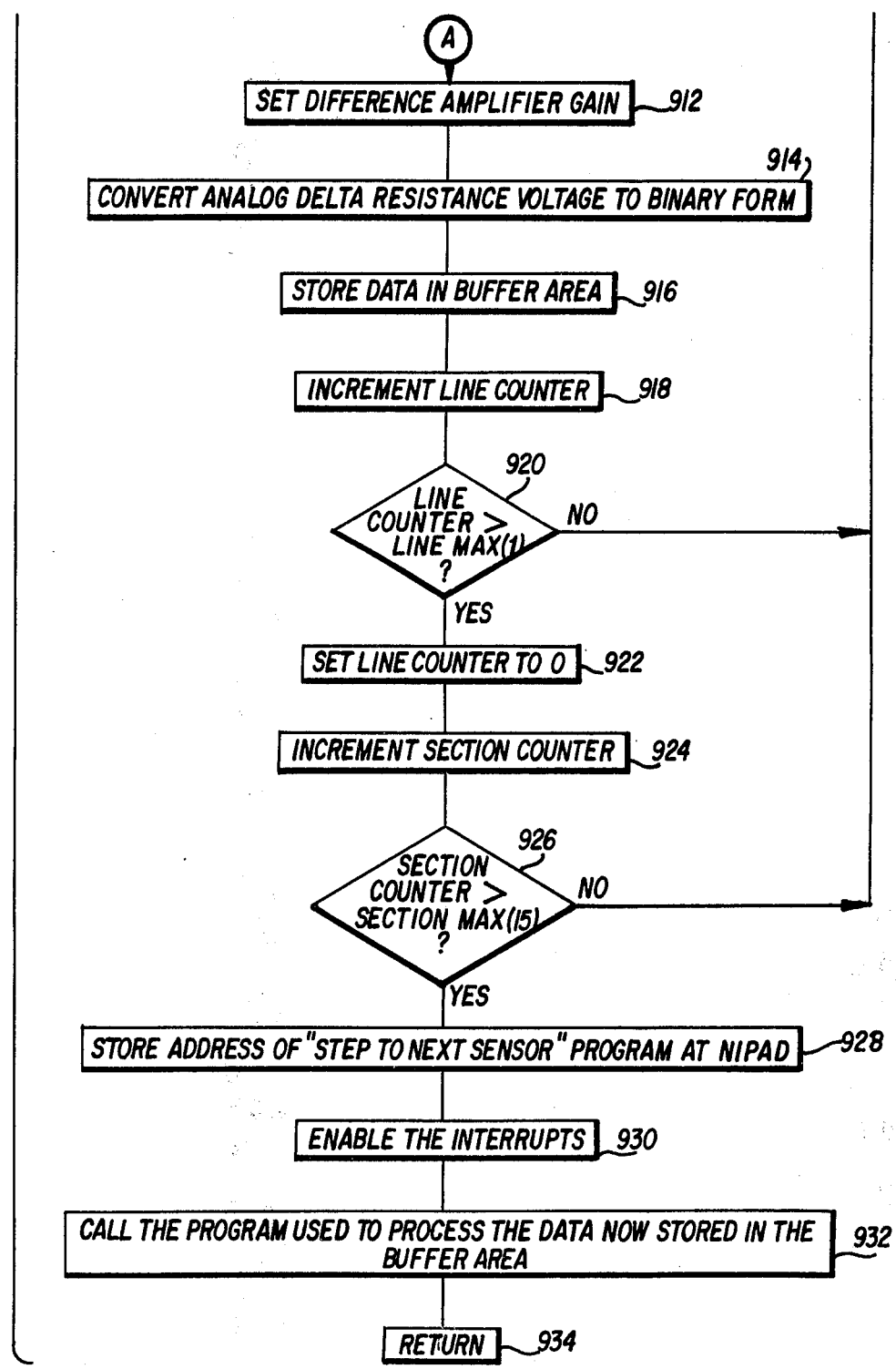
Figure 18A:
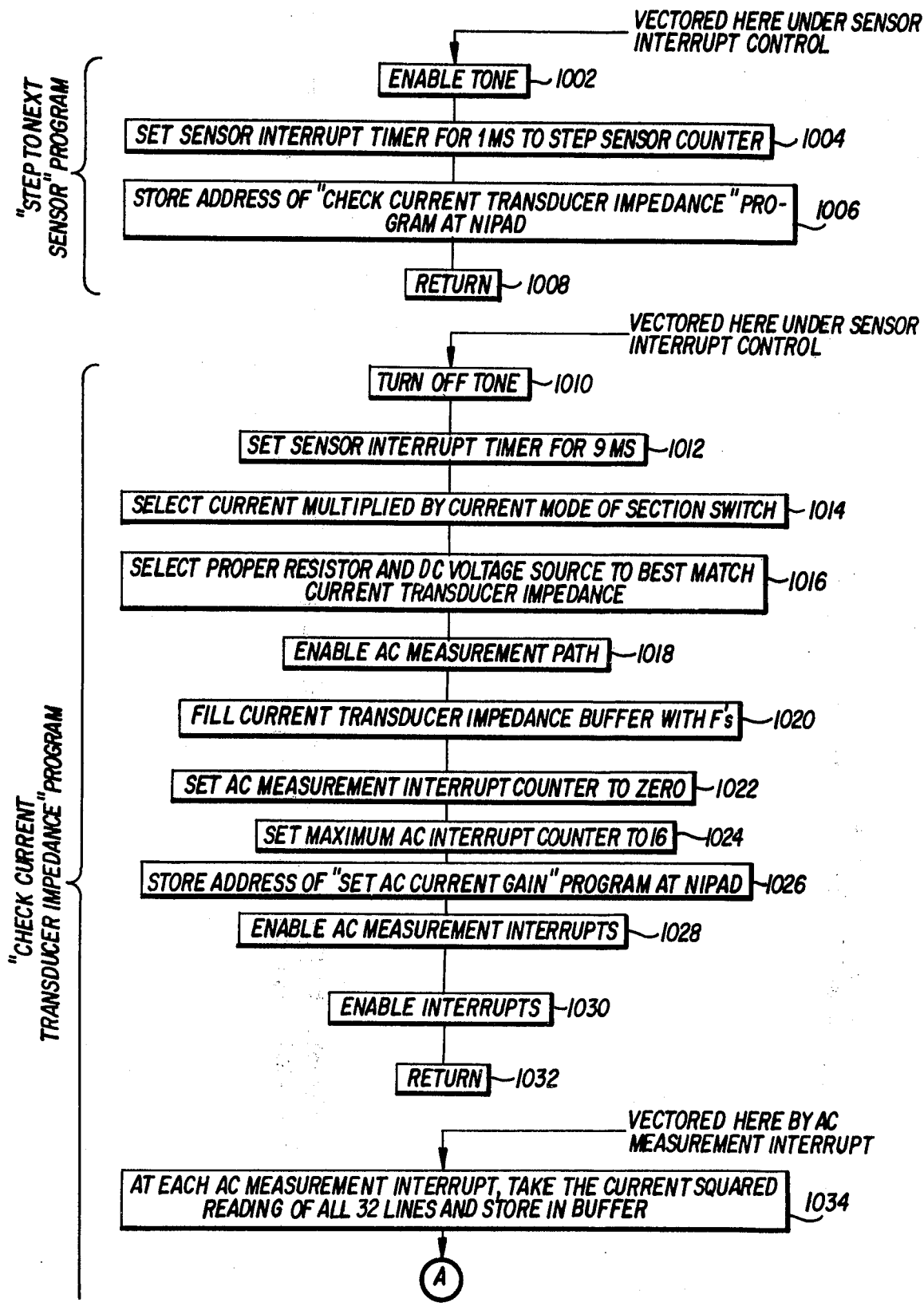
Figure 18B:
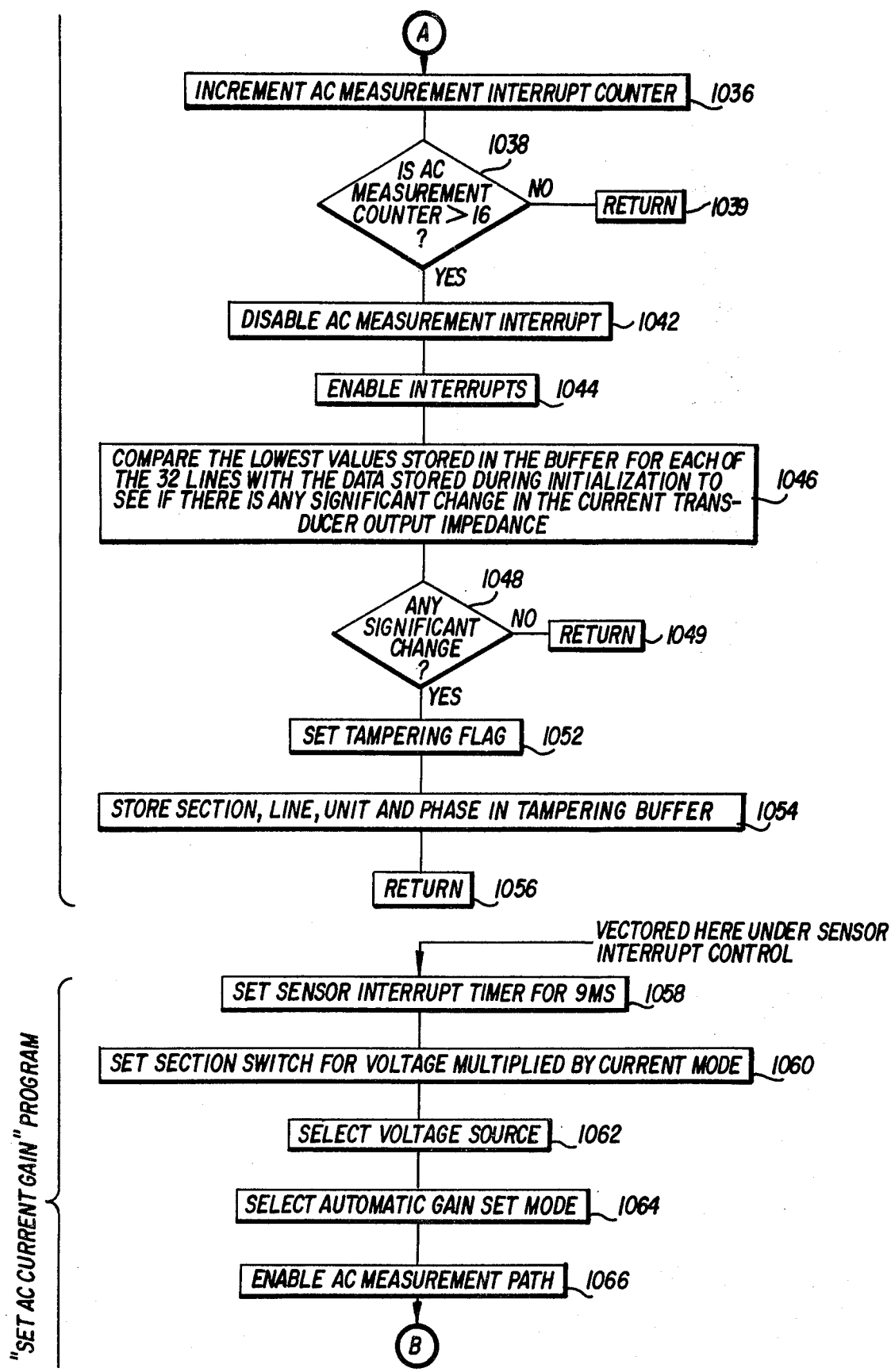
Figure 18C:
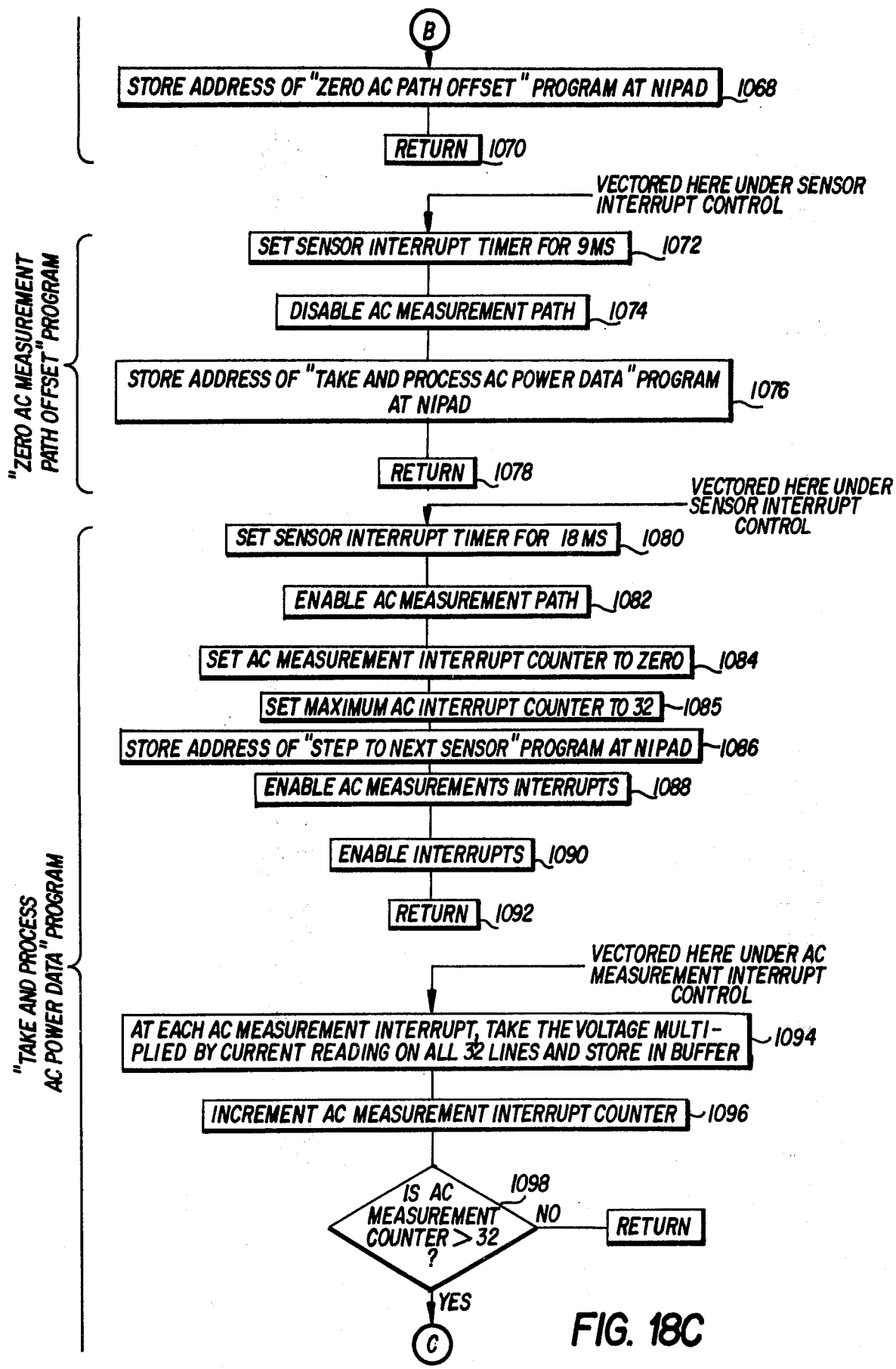

FIGS. 16A, 16B illustrate the programs executed by the CPU 27 when measuring a sensor output which is in the form of a precision resistance change. Some of this program is identical with that illustrated in FIG. 15 and accordingly like boxes have been numbered with the same reference numerals. The principal difference between this program and that of FIG. 15 occurs in how the resistance data which has been taken is processed and this begins at step 904 of FIG. 16A and discussion will begin at this point. When an interrupt occurs after the "take delta resistance data" program has been set in NIPAD by step 630 the sensor interrupt timer is set for "X" milliseconds (corresponding to the time for execution of the "take delta resistance data" program) in step 634 and the CPU then proceeds to step 904 where it sets a line counter L to zero and to step 906 where it sets a section counter S to zero. In step 908, the CPU sets reference data previously acquired for the sensor into latches 513 and 509 for section S and line L and in steps 910 and 912 the CPU configures the A/D converter 21 for a delta resistance measurement. A/D converter 21 is set for delta resistance mode in steps 910 and 912 by setting the signals GAIN 4X, SIGN and SUMINV at the output of latch 509 as in Table VIII below:

TABLE VIII

| Latch 509 | VO − VI | VI − VO | 4(VO − VI) | 4(VI − VO) | VO + VI | 4(VO + VI) |
|---|---|---|---|---|---|---|
| GAIN 4X | 0 | 0 | 1 | 1 | 0 | 1 |
| SIGN | 0 | 0 | 0 | 0 | 1 | 1 |
| SUMINV | 0 | 1 | 1 | 0 | 1 | 0 |

After setting the A/D converter 21, CPU 27 proceeds to step 914 where it converts the analog delta resistance value for the incoming line (one of the 32 incoming lines) to a binary form, storing this in a buffer area in step 916. Following this, the line counter is incremented in step 918 and the line counter value is tested in step 920 to determine whether it exceeds a predetermined line maximum of 1. If not, the CPU then proceeds back to step 908 where it sets the calibration resistance data for the next line (identified by L and S) into the D/A analog converter latches 513 and 509. If the line counter is greater than a maximum of 1 in step 920, the line counter is set to zero in step 922 and the section counter is incremented in step 924. At this point, data for two lines 0,0 and 0,1 (S, L) will have been gathered. Following this, the CPU in step 926 tests whether the section counter is greater than a maximum number (15). If not, the CPU returns to step 908 to begin processing data for another line, now identified as 1,0. If a yes condition is achieved in step 926 indicating that all lines have been processed (S=15), the address of the "Step to next sensor" program is stored at NIPAD in step 928 following which the interrupts are enabled in step 930 and the program used to process the data currently stored in the buffer is called step 932. This program may be one of the applications programs described above with reference to FIGS. 19 and 21-24 where a change in a precision resistance value may represent any one of a change in calibration data, an air temperature, a fire condition, a fluid flow, or a BTU measurement. Step 932 selects one of these application programs for operation on the data which has been gathered.

The section and line counters (S, L) are used to point to one of the 32 incoming lines. The reason for using these counters is that previous resistance data for an incoming line must be fetched in step 908 and inserted into D/A converter 511 for summation with present resistance data for the same line, as each sensor output is processed. The S and L counters enable the CPU to locate and fetch this previously stored data.

The sensors which may be used in the system can also produce a DC voltage output and when such sensors are used, the program of FIG. 17 is executed by the CPU to gather and process sensor data. As was true of the precision resistance measurement program, certain steps are the same as in the program illustrated in FIG. 15 and these have been labeled with the same reference numerals. The principal difference in a DC voltage measurement program is that a step 936 appears after the sensor interrupt timer is set in step 624 to allow sufficient time for data to settle on the lines. Step 936 sets the section switches for a DC voltage measurement mode. The Section Switches are set for a DC voltage mode by first setting the $\overline{ACMEN}$ signal and resetting the $\overline{ACGRD}$ signal at the controller interface latch 373 and then resetting the L0 and L1 REFEN signal on latch 119 of all the Section Switches. Following this, the address of a "Take DC voltage data" program is stored at NIPAD in step 938 following which the CPU returns in step 940 to await a next interrupt. When the next interrupt occurs, the "take DC voltage data" program is executed which begins at step 634 where the sensor interrupt timer is set for one millisecond. If the DC voltage on the line is out of the normal operating range of A/D converter 21, the CPU can in this step control switch 161 to select a resistor/voltage combination that will sum with the sensor voltage to bring it within the range of A/D converter 21. Following this, the CPU proceeds to step 942 where it converts the DC voltage on each of the 32 section switch lines into binary data and stores it in a buffer area. Upon completion of this, the CPU then proceeds to step 944 where it stores the address of the "step to next sensor" program at NIPAD in step 944 and it then enables the interrupts in step 946 and calls the program used to process the data stored in the buffer area in step 948. Again, this can be any one of the application programs described earlier with references to FIGS. 19 and 21-24. Following execution of the program in step 948, the DC voltage measurement program returns at step 950.

As described above, a principal feature of the present invention is the ability of the CPU to monitor power consumption in an electrical path at one of the remote stations. FIGS. 18A, 18B, 18C, 18D illustrate the flow chart for the program executed by CPU 27 to take the necessary AC measurements which are used to calculate power consumption.

The "Step to next sensor" program which is used for AC power measurements is similar to the "Step to next sensor" programs previously described for other measurements. As a first step, a tone (addressing tone) is enabled in step 1002 following which the CPU 27 sets the sensor interrupt timer for one millisecond in step 1004. After this, the address of a "Check current transducer impedance" program is stored at NIPAD in step 1006 following which the CPU returns in step 1008. When the sensor interrupt timer times out after the one millisecond time interval, the interrupt thus generated causes the CPU to execute the "Check current transducer impedance" program which begins at step 1010. In this step, the CPU turns off the addressing tone and then proceeds to step 1012 where it sets the sensor interrupt timer for nine milliseconds. Nine milliseconds is selected as producing enough time for a full cycle of a 60 Hz sine squared waveform (120 Hz) to occur which is sampled in subsequent steps of the program. Following step 1012, the CPU proceeds to step 1014 where it selects a current multiplied by current mode of the section switches. The current multiplied by current mode is set by first resetting signals VSSEL-L$\emptyset$, VSSEL-L1 and MODESEL at latch 119 of all the Section Switches. Next the CFGSEL signal of latch 371 is reset. The net effect of these controls signals is to connect section switch input line 150 to the input of tracking A/D converter 181. If the system utilizes a split bus configuration it will also be necessary to reset L$\emptyset$A3 and L1A3 of latch 131 on all the Section Switches to disable the external voltage inputs. The third step is to set the AC path gain to a minimum. This is accomplished by first setting the SS signal of latch 371 after which the $\overline{SSP}$ signal of latch 373 is alternately reset and then set again to set the AC path gain to maximum. Now the signal SS at latch 371 is alternately reset and set eight times. The AC path gain has now been clocked to minimum gain.

Following step 1014 the CPU advances to step 1016 where it selects a proper DC test voltage which is applied through a resistor which best matches the current transducer impedance. This matching resistor is shown in FIG. 4 between pin 24 and switch 175.

The proper DC test voltage for measuring the current transducer impedance is set by first setting signal TV$\emptyset$ and resetting signals TV1 and TV2 of latch 373 this selects +10 V for the output of switch 349 and system bus 13 pin 24. The next and last step is to set the signals L$\emptyset$ REFEN, L1 REFEN, REFSELA$\emptyset$, REFSELA1 and REFSELA2 on latch 119 of all the section switches. This applies the test voltage on pin 24 through switch 161 to the incoming lines serviced by a section switch for application to a current transducer connected thereto. Upon completing step 1016, the CPU proceeds to step 1018 where it enables the AC measurement path. The AC measurement path is enabled by setting $\overline{ACGRD}$ and resetting $\overline{ACMEN}$ at latch 373. At this point, an incoming current from a current transducer (in the form of a voltage signal) will be applied to both the A/D converter 181 (via path 150) and the automatic gain control 245 (via input 243) causing A/D multiplier 181 to produce a current squared output.

In the next step 1020, the CPU fills a current transducer impedance buffer with data corresponding to hexidecimal "FF" following which the CPU sets an AC measurement interrupt counter to zero in step 1022. In step 1024, the CPU sets the maximum AC measurement interrupts which will occur to 16. Upon completion of step 1024 the CPU proceeds to step 1026 where it stores the address of a program "Set AC current gain" at NIPAD which will be executed upon the occurrence of the next sensor interrupt. Following this, at step 1028, the CPU enables the AC measurement interrupts. The AC measurement interrupts are enabled by setting V14EN of the Master Controller latch 601. There are 32 AC measurement interrupts generated for each cycle of the 60 Hz main power waveform at the output of the phase lock loop multiplier 307 in the controller interface 15. In step 1030, the CPU enables the interrupts and then returns in step 1032.

At this point, the next sensor interrupt will cause the CPU to execute the "Set AC current gain" program. However, before that, 16 AC measurement interrupts will occur which will cause the AC measurement programs, identified as steps 1034 . . . 1056 (FIGS. 18A, 18B), to be executed. Although not shown in FIGS.

18A and 18B, upon the occurrence of an AC interrupt the CPU will first disable all interrupts and push its present register contents to the stack before executing step 1034. Also, prior to executing the return steps 1039, 1049 and 1056, described below, the stack must be popped to restore the register contents and the interrupts again enabled.

The first step of the AC measurement program 1034 causes the CPU to take the current squared reading of all 32 lines running from the section switches to the groups of remote stations and this data is stored in a buffer. The CPU then proceeds to step 1036 where it increments an AC measurement interrupt counter and then proceeds to step 1038 where it tests whether the AC measurement counter is greater than 16. If not, the CPU pops the stack, enables the interrupts and returns and waits for the next AC interrupt which will again cause it to execute the "Check current transducer impedance" program which begins at step 1034. After this program has been executed 16 times, a yes decision will be produced at step 1038 causing the CPU to execute step 1042 which disables the AC measurement interrupts. The AC measurement interrupts are disabled by resetting V14EN of the Master Controller latch 601.

After disabling the AC measurement interrupts, the CPU proceeds to step 1044 where it again enables the interrupts. Following this, the CPU 27 proceeds to step 1046 where it compares the lowest value stored in the buffer for each of the 32 lines with the data stored during calibration of the system. The lowest readings occur when the AC current is zero. Thus the lowest reading representing transducer output impedance amounts to nothing more than a DC resistance reading which is similar to other DC resistance readings previously described herein. A significant change in transducer impedance may occur by someone deliberately shorting, disconnecting or putting resistive or reactive components in parallel or in series with the current transducer in an attempt to make the system read a smaller current than is actually being consumed in the electrical path at a remote station. Accordingly, this portion of the program is designed to test for tampering or line faults.

If a significant change in the current transducer output impedance is detected in step 1048, a tampering flag is set in step 1052. This flag is periodically monitored by a failure scan program to provide an indication of tampering. After the tampering flag is set, the CPU proceeds to step 1054 where it stores the section switch number, line number, unit number and voltage phase in a tampering buffer. This information can then be displayed along with location information to help identify a remote station which has been tampered with and to help in the repair process for a faulty line condition. After step 1054, the CPU pops the stack, enables the interrupts and returns in step 1056. If there was no significant change in the current transducer output impedance detected in step 1048, the CPU would also return in step 1049 after first popping the stack and enabling the interrupts.

The "AC current gain" program, the address of which was set in NIPAD at step 1026, begins at step 1058 when the next sensor interrupt signal is received. At this point, the CPU sets the sensor interrupt timer for nine milliseconds and then proceeds to step 1060 to set the section switches for a voltage multiplied by a current mode.

The voltage multiplied by current mode is set by resetting signal L∅ REFEN and L1 REFEN on latch 119 at all the section switches. Following step 1060, the CPU proceeds to select a voltage source in step 1062 and then to select the automatic gain mode at step 1064.

The procedure for selecting a voltage source was described earlier and will not be repeated here. To select the automatic gain, signal $\overline{SSP}$ is reset at latch 373 and SS is reset at latch 371. In step 1066 the AC measurement path is enabled following which the address of a "Zero AC path offset" program is stored at NIPAD in step 1068. After this, the CPU returns in step 1070.

When the next sensor interrupt occurs, the "zero AC path offset" program is executed which begins at step 1072 where the sensor interrupt timer is set for nine milliseconds. Following this, in step 1074, the AC measurement path is disabled by resetting $\overline{ACGRD}$ and setting $\overline{ACMEN}$ at latch 373. In the next step 1076, CPU 27 stores the address of the "Take and process AC power data" program at NIPAD following which it returns in step 1078.

The "Take and process AC power data" program which is next executed when the next sensor interrupt occurs begins at step 1080 where the sensor interrupt timer is set for 18 milliseconds. Following this, the CPU enables the AC measurement path in step 1082 and then sets the AC measurement interrupt counter to zero in step 1084. In step 1085, the AC measurement maximum interrupts is set to 32 and in step 1086 the address of the program "Step to next sensor" is stored at NIPAD. In the following step 1088, the AC measurement interrupts are enabled and in step 1090 the CPU internal interrupt controller is enabled following which the CPU returns in step 1092.

When the next AC measurement interrupt occurs and at each AC measurement thereafter, a voltage multiplied by current reading is taken on all 32 lines and stored in a buffer by the CPU in a step 1094. In a subsequent step 1096, the AC measurement interrupt counter is incremented and in step 1098 the AC measurement interrupt counter is tested to see if its content is greater than 32. If not, the CPU returns following step 1098. As earlier noted, the process of disabling interrupts, pushing the register contents to the stack at the beginning of the AC measurement program and popping the stack and enabling the interrupts before a return, are all performed by CPU 27, although not shown in FIGS. 18A . . . 18D. If the AC measurement counter is greater than 32, as determined in step 1098, the CPU proceeds to step 1100 where it disables the AC measurement interrupts following which it executes step 1102 where it disables the AC measurement path (resets $\overline{ACGRD}$ and sets $\overline{ACMEN}$ at latch 373). In a subsequent step 1104, the CPU enables its interrupt controller and then proceeds to step 1106 where it calls the "Process AC measurement data" program. After execution of this program, the CPU returns at step 1108.

Figure 20:
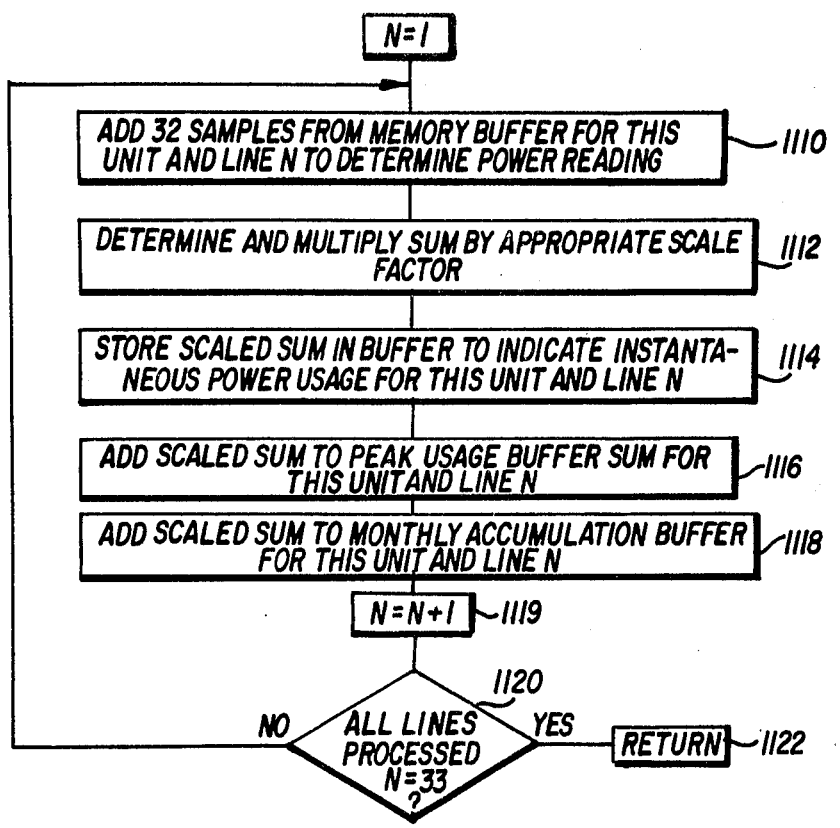
FIG. 20 is a flowchart of a program for processing gathered AC power measurement data.

The "Process AC measurement data" program executed at step 1106 in FIG. 18D is illustrated in greater detail in FIG. 20.

At the time this program is executed, the CPU has stored 32 samples for each remote station on a line for up to 32 lines, 1024 samples in all. In this program, 32 power samples from a memory buffer for each sensor are used to determine a power measurement. In a first step of the program 1110, the CPU adds 32 samples from the memory buffer for a particular current sensor to determine a power reading. The CPU then proceeds to step 1112 where the sum of the 32 samples is multiplied by a scale factor. The scale factor is determined by looking at the automatic gain control setting for each line and using the value thereof which was previously stored. The scaled sum is then stored in another buffer to indicate the instantaneous power usage in a step 1114. Following this, the CPU proceeds to step 1116 where it adds the scaled sum to a peak usage buffer sum. After this, the CPU proceeds to step 1118 where it adds the scaled sum to an accumulator buffer. In a subsequent step 1119, a line counter is incremented and in a step 1020 the CPU determines whether the line counter equals 33 or not indicating that all lines have been processed. If not, it returns to step 1110 and repeats all the steps from this point down to step 1118 for each of the lines of the system. When step 1120 indicates that all lines have been processed, the CPU then proceeds to return at step 1122.

Figure 25D:
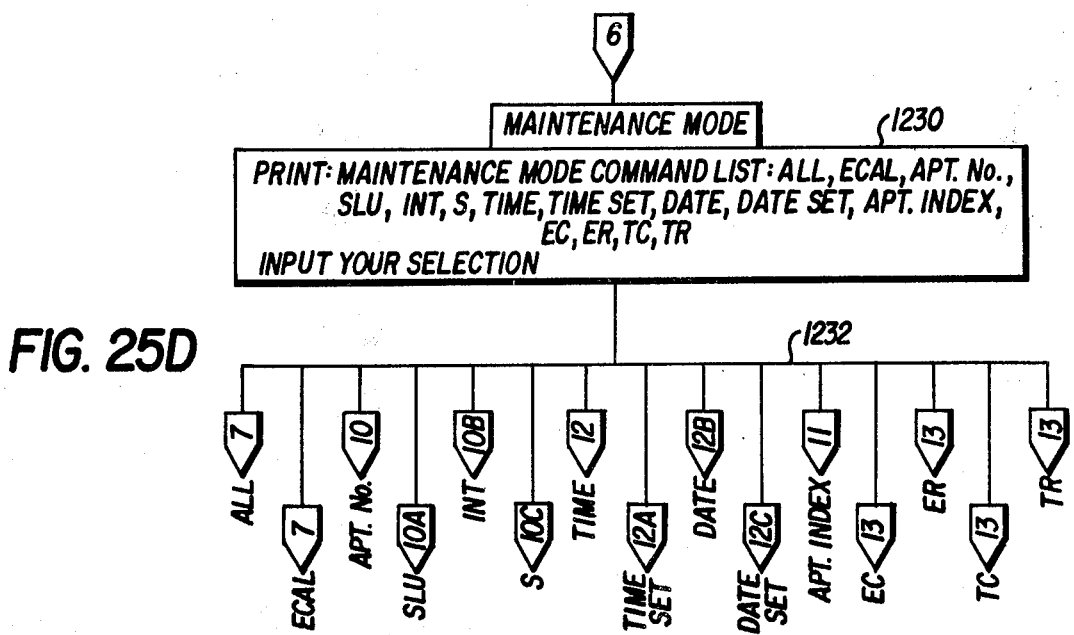
FIGS. 25A ... 25M together form a flowchart of the OIP program illustrated in FIG. 9.
Figure 25A:
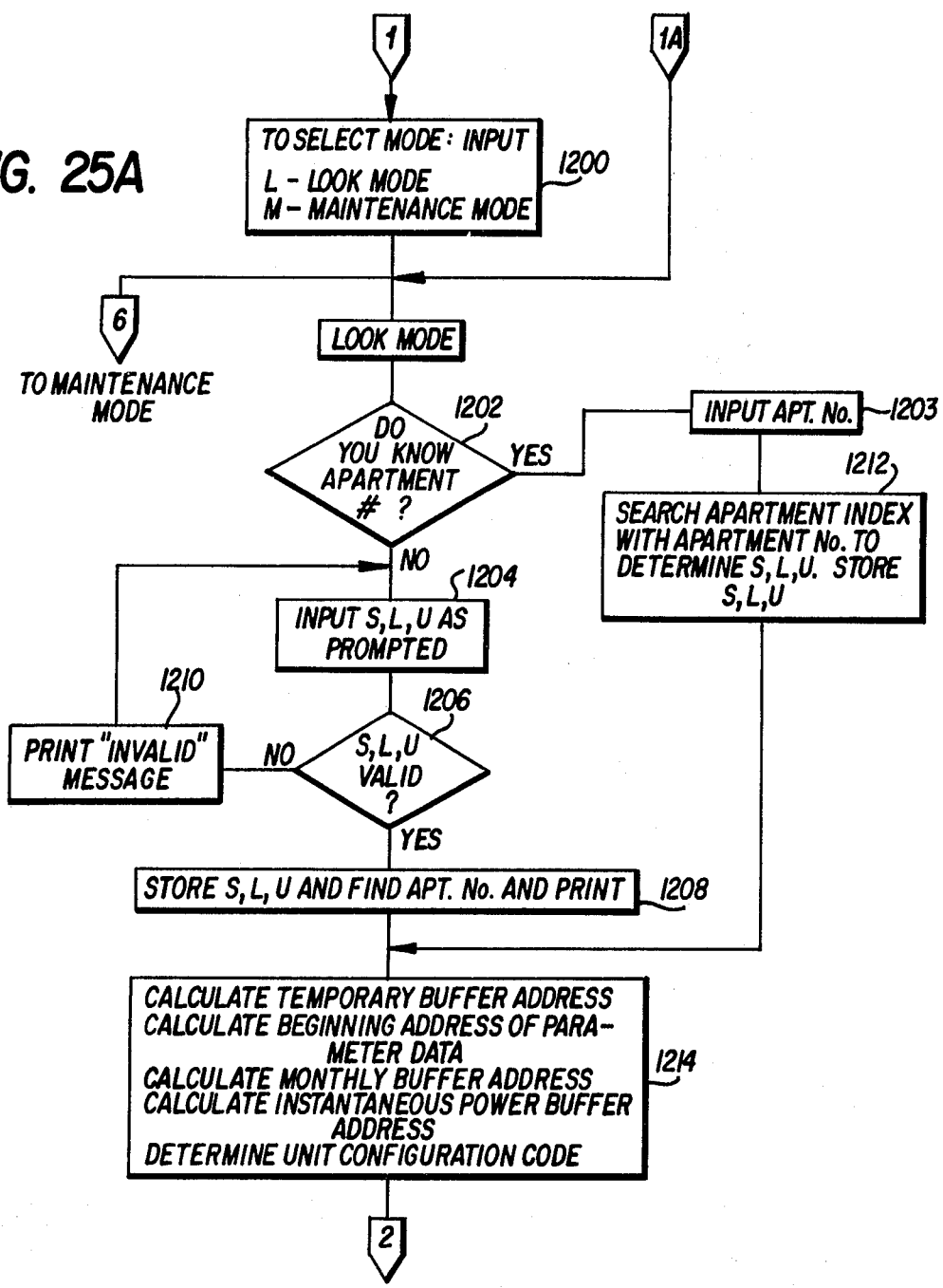

The operator interactive program 403 of FIG. 9 is illustrated in detail in FIGS. 25A . . . 25M. This program is continuously executed by CPU 27 when it is not processing an interrupt program. It is used to extract and further manipulate processed data which has been provided by the sensor interrupt programs described above.

In the first step 1200 of the OIP a terminal operator is instructed to select either a "look" mode or a "maintenance" mode. The look mode is primarily designed to enable an operator to inspect the data acquired from individual remote stations, e.g. apartment units, while the maintenance mode performs various housekeeping and data processing functions. For the purposes of further description, it will be assumed that each remote station is located at an apartment unit of a building.

In the first step of the look mode, the CPU proceeds to step 1202 where it asks the operator whether he knows what apartment he is interested in. If he does, the CPU proceeds to step 1212 where it searches an apartment index with an operator inputted apartment number to determine a section number (0–15), line number (0–1) and unit number (0–15) which has been assigned to that apartment. This data is stored by the CPU and is used to identify and access data for the apartment in question. The apartment index is a stored table which contains the section number, line number and unit numbers assigned to each apartment. The manner in which this index is entered into the system will be further described below. After completing step 1212, the CPU proceeds to step 1214 where it calculates the actual memory addresses where the various data has been stored for the apartment number in question (for the section (S), line (L) and unit (U) numbers assigned thereto). These addresses include a temporary buffer address, a beginning address for parameter data, a monthly buffer address, and the address of an instantaneous power buffer. The CPU also determines from the section, line and unit numbers for a particular apartment, the configuration code thereof. The configuration code represents the type and arrangement of the sensors, what power line phase is being monitored, etc., which are used at the apartment in question. Different configurations may cause the CPU to calculate energy consumption differently.

If in step 1202 a determination is made that the operator does not know the apartment number in question, the CPU proceeds to step 1204 where it asks the operator to directly input the section number, line number and unit number for which data is sought. The CPU then proceeds to step 1206 where it determines whether the input S, L and U data is valid, that is, that it corresponds to a section, line and unit number used in the system. If the entered data is not valid, the CPU proceeds to step 1210 where it prints an "invalid" message and returns to step 1204. If the S, L and U data is valid, the CPU proceeds to step 1208 where it stores the inputted S, L and U data and looks up the apartment number corresponding thereto in the apartment index. The CPU then prints the apartment number for the operator's information. Upon concluding step 1208, the CPU then proceeds to step 1214 where it performs the operations noted above for calculating the various memory addresses for the data requested corresponding to the S, L and U information. The configuration code for the input of S, L and U is also determined in the manner previously described.

Figure 25C:
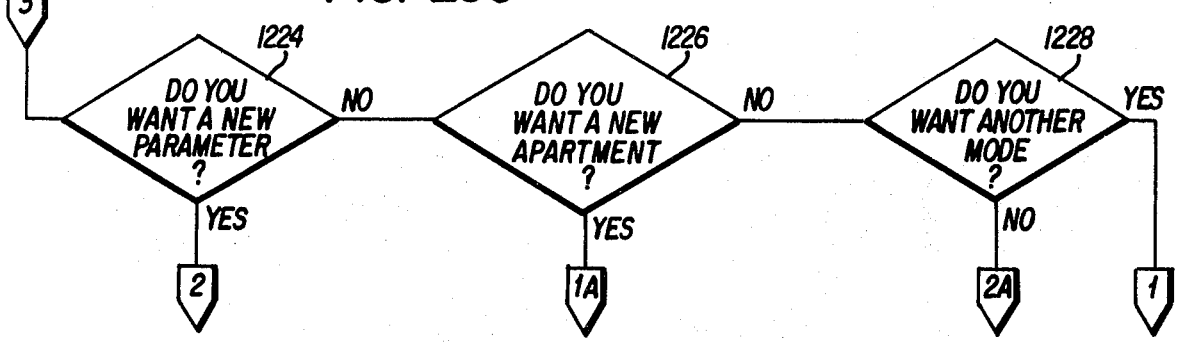
Figure 25B:
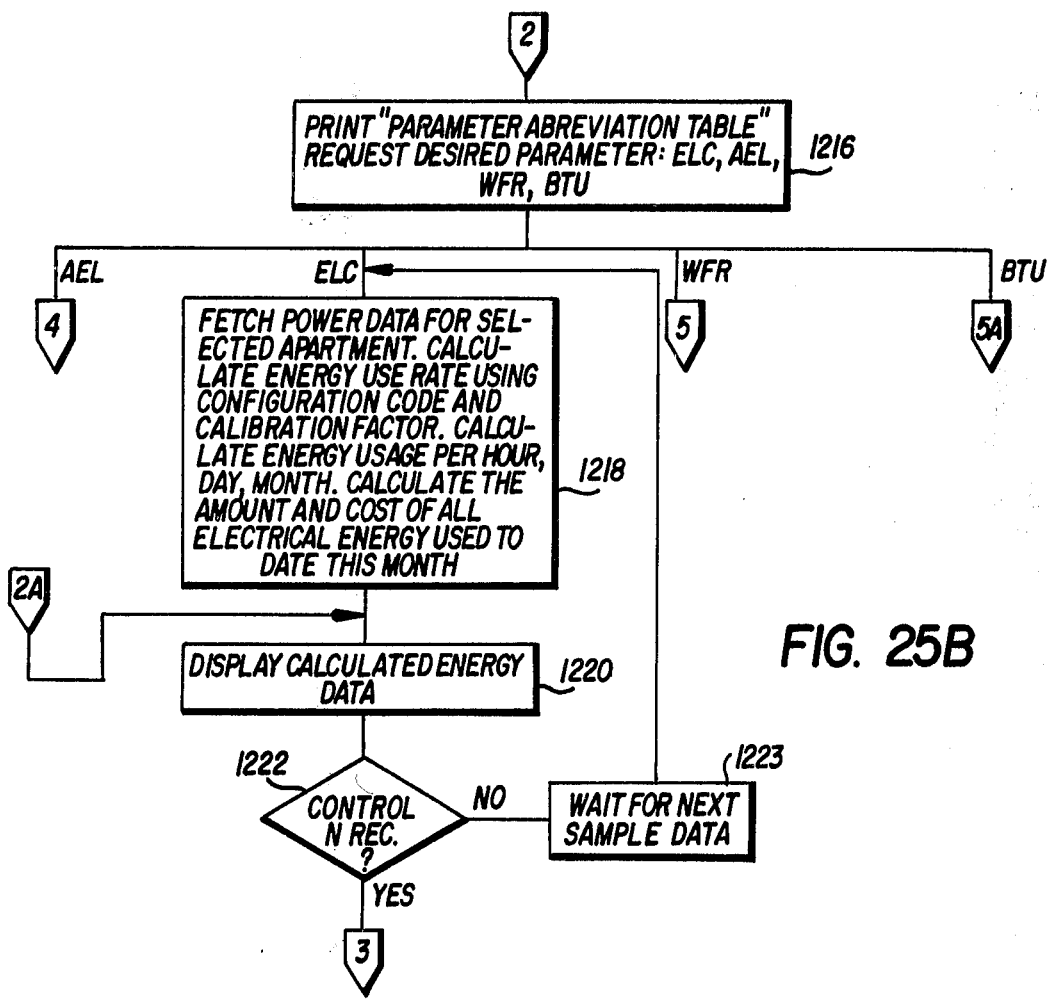

Upon completing step 1214, the CPU proceeds to step 1216 (FIG. 25B) where it prints a parameter abreviation table. This table merely lists all of the parameters for which data has been stored by the CPU, for example, electricity power consumption, air flow, water flow, BTU etc. Also in step 1216, the CPU requests that an operator input a desired parameter. The CPU then branches to a routing corresponding to whatever parameter was selected by an operator and inputted in step 1216. Assuming for the moment that electrical energy use parameter ELC was selected, the CPU proceeds to step 1218. Here it calculates an energy use rate by first retrieving the energy consumption data for the selected apartment. It then examines the configuration code for the apartment unit under consideration to see if any additional processing is required of the data, because of the sensor configuration. The CPU also fetches a calibration scale factor previously stored for use in calculating energy consumption. The calibration scale factor is a factor which is stored in the system by the CPU at the time of installation. It is determined by using a highly accurate calibration meter standard to determine energy consumption in a particular electrical path in an apartment which is compared with energy consumption as calculated and digitized by the section switches 17 and A/D converter 21. If there is any deviation between the standard and the power calculated by the hardware structures of the invention, this is stored by the CPU upon manual entry of an operator as a calibration scale factor. As a result, any measurement inaccuracies inherent in the system can be accounted for and balanced out.

From the power data retrieved, the configuration code and the calibration scale factor, the CPU then calculates the rate of energy usage for the apartment being considered. Appropriate constants are then applied to this rate to determine energy usage per hour, per day, and per month. Summary data indicating the amount and cost of all electrical energy used to date for the present month for this apartment is also calculated. Upon completing all the electrical energy use rate calculations in step 1218, the CPU proceeds to step 1220 where the calculated energy data is displayed.

Upon completing step 1220 the CPU proceeds to step 1222 where it determines if an operator has inputted a control signal instructing the CPU to proceed. If no control signal has been entered, the CPU proceeds to step 1223 where it waits for the next input sample of energy data for the apartment selected which occurs under master and sensor interrupt control as described earlier. When the next energy data sample arrives, the CPU returns to step 1218 where it recalculates energy use data using the new energy data samples. Upon reception of the control signal in step 1222, the CPU proceeds to step 1224 (FIG. 25C) where it asks the operator if he wants to view the data for a new parameter. If yes, the CPU proceeds back to step 1216 and begins the sequence of steps described earlier.

If no new parameter is desired, the CPU proceeds from step 1224 to step 1226 where it asks the operator if he wants to see data for a new apartment. If yes, the CPU proceeds back to step 1202 where it asks whether the apartment is known or not. If the CPU determines in step 1226 that data for a different apartment is not desired, it proceeds to step 1228 where it asks the operator if he wants another mode. If not the CPU proceeds to step 1220, otherwise it returns to step 1200 and awaits a look or maintenance mode input command.

Figure 25G:
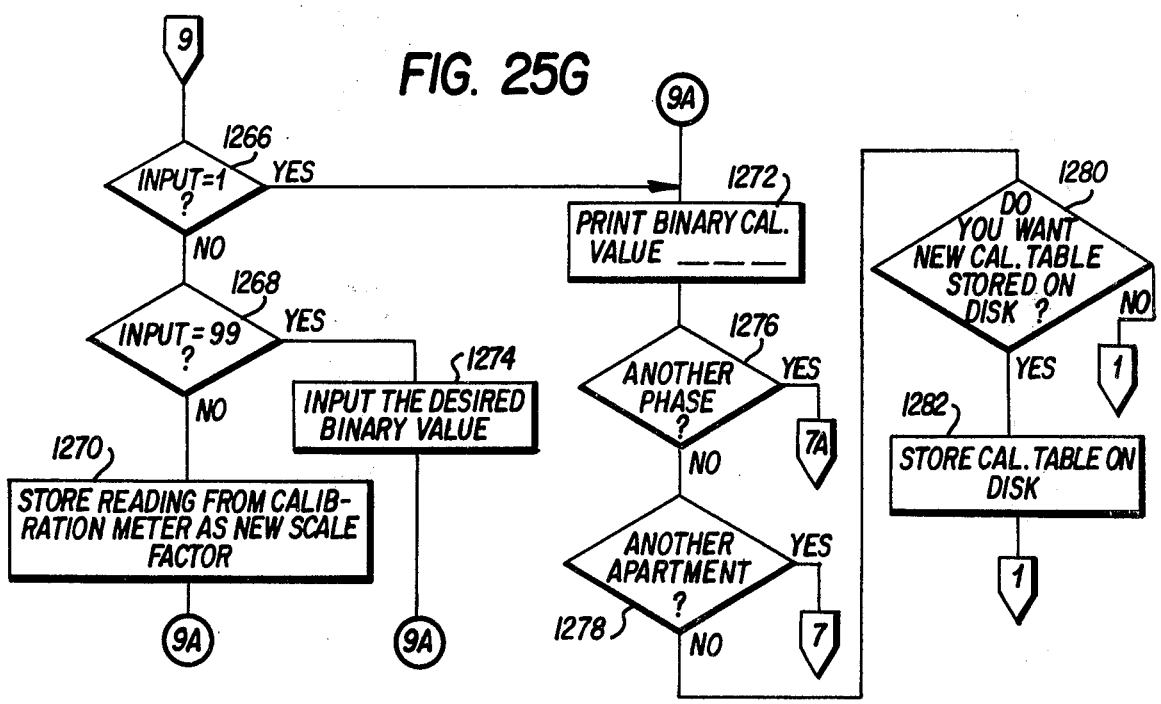
Figure 25E:
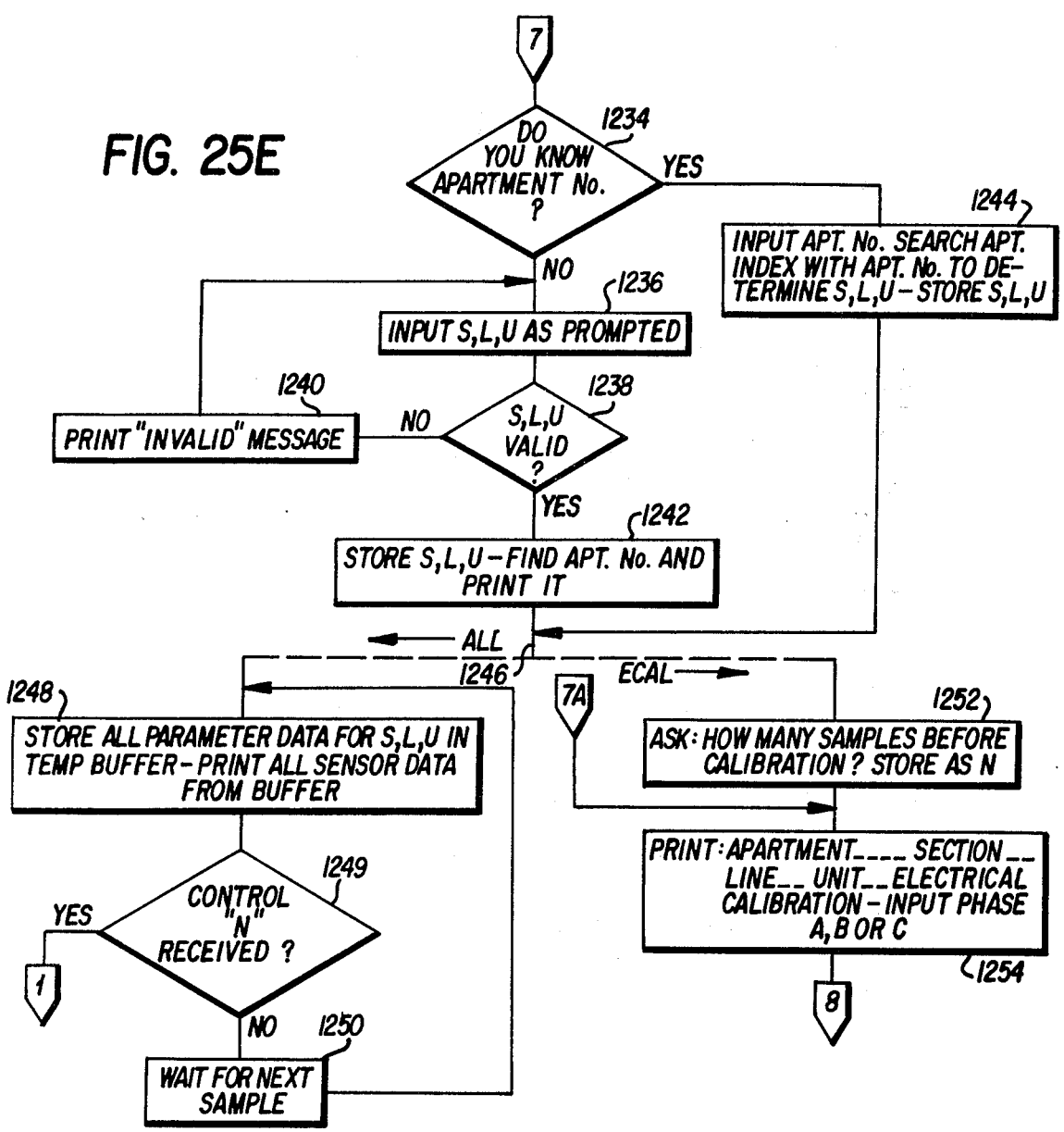
Figure 25M:
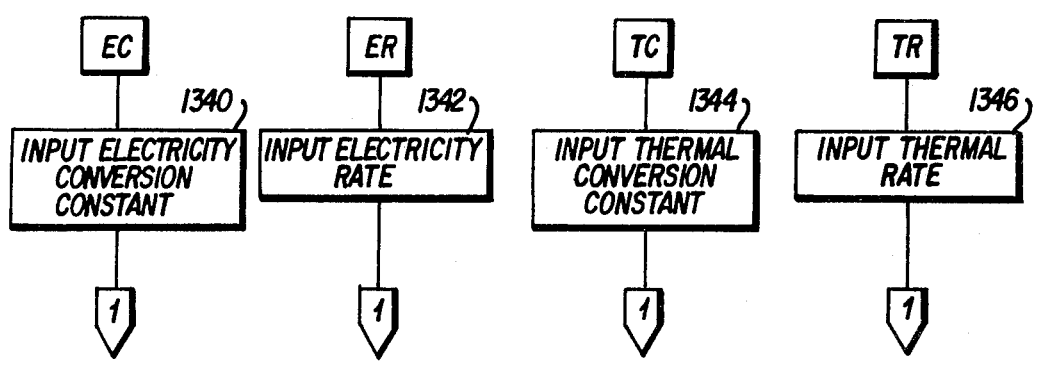
Figure 25F:
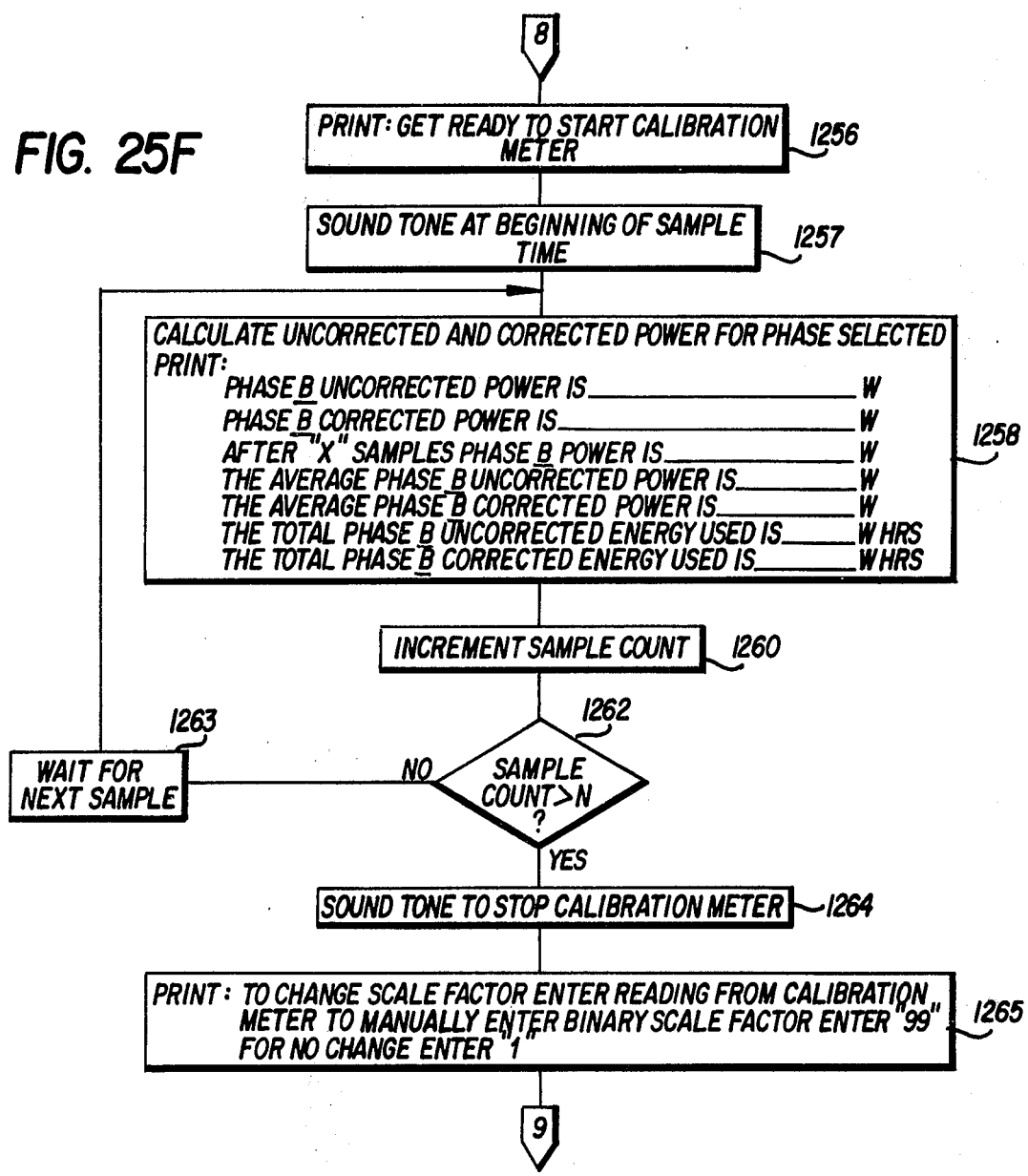

If in step 1216 the operator selects the parameter AEL (Average Electrical Energy) the CPU proceeds from there to step 1350 (FIG. 25J) where it asks the operator how many samples he wishes to include in the averaging. This is input as a value N which the CPU stores in step 1350 following which it proceeds to step 1352 where it calculates and prints electrical energy use rate data.

Following step 1352, the CPU proceeds to step 1354 where it determines whether all of the samples entered at step 1350 have been processed. If not, the CPU proceeds to step 1355 where it waits for the next data sample to be collected during processing of the sensor interrupt programs. After the next sample has been collected, the CPU cycles back to step 1352 and recalculates and prints the electrical energy use again displaying this information. The samples occur at the rate of 512 per hour.

When all samples have been processed as determined in step 1354, the CPU proceeds to step 1356 where it asks the operator if he wants another set of readings. If the operator enters a yes, this is determined in step 1358 by the CPU which then cycles back to step 1350 and repeats the above described process. If a no is entered by the operator in step 1356, as detected by the CPU in step 1358, the CPU cycles back to the beginning of the OIP program step 1200.

Returning to step 1216 (FIG. 25B) if the CPU determines that an operator has inputted a request for a parameter WFR (Water Flow Rate) the CPU jumps at step 1217 to a WFR routine (FIG. 25K) where in the first step 1360 the CPU fetches all water use data for the selected apartment. Water use data is collected by the CPU during execution of the sensor interrupt programs in the same manner as used to collect air flow data described above in reference to FIG. 23. That is, the sensed temperature difference between upstream and downstream temperature sensors mounted in a fluid flow path (e.g. FIG. 28A) provides an indication of flow rate.

The flow rate data is multiplied by a cost factor to provide data representative of total water usage. The CPU then proceeds to step 1362 where it displays data corresponding to the rate of water usage as well as cost. Upon completing the calculation and display of water use in step 1362, the CPU then proceeds to the next step which is identical to step 1222 in FIG. 25B, being labeled 1222 in FIG. 25K. The WFR program operation proceeds as described above for the ELC program shown in FIG. 25B, so that description will not be repeated.

If in step 1216 (FIG. 25B) the operator enters the parameter BTU indicating he wishes to review data relating to BTU consumption, the CPU branches to step 1364 (FIG. 25K) where BTU data for a selected apartment is accessed. Appropriate rate data is used by the CPU to calculate cost of BTU usage. The CPU then proceeds to step 1366 where it calculates and displays thermal energy use data. Upon completion of step 1366, program operation proceeds as described for ELC and WFR and this description will not be repeated.

Assuming that at the output of step 1200 (FIG. 25A), the CPU has been instructed to enter a maintenance mode, it proceeds to step 1230 (FIG. 25D) where it prints a maintenance mode command list and request an operator input selection. The maintenance mode command list is illustrated in step 1230 of FIG. 25D. In step 1232 the CPU branches to a subroutine corresponding to the maintenance mode command selected by an operator. If the command is ALL or ECAL, the CPU proceeds to step 1234 (FIG. 25E) where it asks the operator if he knows the apartment number. Steps 1234, 1236, 1238, 1240, 1242 and 1244 all correspond to respective steps 1202, 1204, 1206, 1210, 1208 and 1212 which have been previously described. The purpose of these steps is to determine the S, L and U numbers for the apartment under consideration and a detailed description of these steps will not be repeated herein.

Upon completion of the routine for determining the S, L and U for the apartment number in question, the CPU at step 1246 branches to either the ALL or ECAL routines which were previously selected in step 1230. In the ALL routine, the CPU proceeds to step 1248 where it stores all parameter data for the S, L and U which has been selected in a temporary buffer and all sensor data is printed from the buffer. The CPU then proceeds to step 1249 where it determines if an operator has input a control code N. If not, the CPU proceeds to step 1250 where it waits for the next data sample from the sensors which is inputted during processing of the master and sensor interrupt programs. When the next sample is received, about seven seconds later, the CPU proceeds back to step 1248 where it stores the new sample data for the S, L and U selected in a temporary buffer and prints this data from the buffer. If in step 1249 the CPU determines that the control N code has been received, it branches back to step 1200 (FIG. 25A) which is the beginning of the OIP program.

If during initial execution of step 1230, the CPU detects an input for ECAL, this routine will be entered at branching step 1246 to step 1252.

The ECAL routine is designed to compare power calculated by the invention with an independent calibration meter having a very high degree of accuracy. The purpose of this is to determine the calibration scale factor described earlier. Any differences between power calculated by the system of the invention and power calculated by the calibration meter is set into the system as a calibration scale factor which is used by the system when calculating power consumed. In this manner, the system can be periodically calibrated to a high accuracy.

In the first step 1252 of the ECAL routine, the CPU prompts the operator to insert how many samples he wishes the calibration routine to extend over. Twenty samples would be typical. The samples correspond to the updating of the data samples which occurs during processing of the sensor interrupt routines described earlier. The number of samples input by an operator is stored as a value N. Following this, the CPU proceeds to step 1254 where it prints the apartment number.

section line and unit numbers corresponding to the sensor and associated line path being calibrated. Also in step 1254, the CPU asks the operator whether calibration is desired for input phases A, B or C. In many cases, a three phase power line runs to an apartment and each may be separately calibrated. In some installations, only a single phase power line enters an apartment in which case the operator will only select that single phase for calibration in step 1254.

From step 1254, the CPU proceeds to step 1256 (FIG. 25F) where it prints the message to the operator to get ready to start the calibration meter. Then in step 1257 the CPU activates a tone generator which signals an operator to begin operation of the calibration meter. From there the CPU proceeds to step 1258 where it calculates and displays corrected and uncorrected power values for the phase selected by the operator in step 1254. The uncorrected power is that stored by the CPU during sensor interrupt processing which has not been corrected with the calibration scale factor. The corrected power calculation is effected by applying a calibration scale factor to the uncorrected power which was derived during a previous execution of an ECAL routine. In step 1258 the CPU also prints the corrected and uncorrected power for the operator selected phase, e.g. B, the power for this phase after an "X" number of samples (which will vary between 1 and the operator determined sample number N), the average uncorrected power for the selected phase, the average corrected power for the selected phase, the total uncorrected energy used for the selected phase and the total corrected energy used for the selected phase. This latter value is the most important for calibration purposes as it yields a watt hour energy consumption value which is compared with a watt hour energy consumption value determined by the calibration meter.

After executing step 1258 the CPU increments the sample counter in 1260 and in step 1262 determines whether the sample count is greater than the value entered by the operator in step 1252. If not, the CPU proceeds to a wait for the next sample at step 1263. In this step, the CPU determines when the next sample of power data is inputted into the system under the master and sensor interrupt processing routines. When the next data samples for power have been stored in the appropriate buffer registers, the CPU proceeds back to step 1258 where it updates the uncorrected and corrected power information for each of the values described previously. Steps 1258, 1260 and 1263 are continuously repeated until in step 1262 the CPU determines that the number of samples which have occurred exceeds that set by the operator at step 1252. The CPU then proceeds to step 1264 where it sounds a tone instructing the operator to stop the calibration meter. The operator can now compare the contents of the calibration meter with the total corrected energy for the selected phase which appears on the screen from step 1258. If these respective values differ, the operator may instruct the CPU to change the calibration data which is being used to correct the power. The CPU in step 1265 prompts the operator to either enter the actual scale value which is the reading taken from the calibration meter, or to manually enter a different scale factor by first inputting the code "99". If no change is desired, the CPU instructs the operator in step 1265 to enter a "1".

From step 1265, the CPU proceeds to step 1266 and 1268 (FIG. 25G) where it determines whether a "1", a "99", or a scale factor has been entered by the operator.

If a "1" has been entered, the CPU proceeds from step 1266 to step 1272 where it prints the present calibration value. From there it proceeds to step 1276 where it asks the operator if he wishes to calibrate another phase. If the answer is yes, the CPU proceeds to step 1254 and repeats the ECAL routine for a different phase. If the operator does not desire to calibrate another phase, the CPU proceeds from step 1276 to step 1278 where it inquires if the operator wishes to calibrate the power lines for another apartment. If yes, the CPU proceeds from step 1278 to step 1234 (FIG. 25E) but if not, the CPU then proceeds directly to step 1280 where it asks the operator if he wishes to have the new calibration data stored on disk. If yes, the CPU proceeds to step 1282 where it stores the new calibration data on a disk and from there returns to the beginning of the OIP program at step 1200 (FIG. 25A). If the new calibration data is not to be stored on disk, the CPU proceeds from step 1280 to the beginning of the OIP program at step 1200 (FIG. 25A).

If in step 1266 the CPU determines that the operator input at step 1265 was not a "1", it proceeds to step 1268 where it determines if it was a "99". If not it proceeds to step 1270 where a scale factor calculated from the calibration meter reading which was entered by the operator in step 1265 is stored as a new scale factor to be used for subsequent calibration of incoming power data. From there the CPU proceeds to step 1272 where it executes steps 1272, 1276, 1278, 1280 and 1282 (FIG. 25G) in the manner described above.

If in step 1268 the CPU determines that the operator entered a "99" code it proceeds to step 1274 where it prompts the operator to input a desired binary scale value as the calibration scale factor. From there the CPU proceeds to step 1272 (FIG. 25G) and where it executes the subsequent steps in the manner previously described.

If in the maintenance mode command input step 1230 (FIG. 25D), the CPU determines that the command APT NO. was entered, it proceeds to a routine for finding an apartment number from a section, line and unit number input by the operator. This routine begins at step 1284 (FIG. 25H) where the operator is prompted to enter the S, L and U information in sequence. In step 1286 the CPU consults the apartment index and identifies the apartment number associated with the input S, L and U information following which in step 1288 the CPU asks the operator if he wants another apartment number from available S, L and U information. If not, this routine returns to the entry point step 1200 (FIG. 25A) of the OIP program. If in step 1288 the operator indicates that the additional apartment number is desired, the CPU proceeds back to step 1284 where it requests new S, L and U information.

If when in the maintenance mode command input step 1230 (FIG. 25D) the operator inputs the SLU command, the CPU branches to a routine for determining the S, L and U information from an inputted apartment number. This routine is also illustrated in FIG. 25H and has as a first step 1290 an input inquiry to the operator requesting an apartment number. Following this, the CPU searches the apartment index to determine the S, L and U data corresponding to this apartment. From there the CPU proceeds to step 1294 where it prints the S, L and U information and then returns to the input of the OIP program step 1200 (FIG. 25A).

If in the maintenance mode command input step 1230 (FIG. 25D) the operator selects the INT input, the CPU proceeds to an initialization routine illustrated in FIG. 25H. The first step 1296 of this routine is to request the operator to input his initialization code. The CPU then compares this initialization code with previously stored initialization codes representing authorized users of the system. If the initialization code is proper, as checked in step 1298, the CPU proceeds to initialize the system in step 1300. To initialize the system, the CPU executes the sensor interrupt routines to gather an acquire calibration offset data for the sensors operating under known conditions. Also in step 1300 the CPU prints on a display screen that the system was initialized and the data and time of initialization.

Upon completion of step 1300, the CPU proceeds to step 1302 where it asks the operator if he wishes to input an apartment index at this time. If an apartment index input is not desired, the CPU determines this in step 1304 and proceeds to a start routine which begins at step 1305 (FIG. 25H). If in step 1304 the CPU determines that an apartment index is to be inputted it proceeds to an apartment index input routine which begins at step 1310 (FIG. 25I).

The first step of the start routine 1305 prompts the operator to input a control character "S" to start operation of the system. In step 1306, the CPU determines whether the start code for an "S" has been input. If so, it starts the system and prints the time the system was started. If no input command "S" is received, the CPU at step 1306 branches back to the beginning of the OIP program at step 1200 (FIG. 25A).

If as a result of step 1304 it is determined that an apartment index is to be input, the CPU proceeds to step 1310 (FIG. 25I) of the apartment index input routine. There it prompts the operator to input an "I" if an apartment index is to be input or a "C" if a previously stored apartment index is to be corrected. Following step 1310, the CPU proceeds to steps 1312 and 1314 where it determines whether the operator has input an "I" or a "C". If an "I" was input, the CPU proceeds from step 1312 to step 1326 where it instructs the operator that he may exit the apartment index routine by typing an "@" code, or that he can exit a present apartment line by entering a "space bar" code or that he may enter an apartment input by entering a "carriage return" code. After instructing the operator in step 1326 the CPU proceeds to step 1328. In this step the CPU first sets a section counter, a line counter and a unit counter to an initial zero state. It then displays the states of these counters on the screen as S___, L___, and U___, where the blanks represent the present contents of the various counters. The CPU then waits for the operator to enter an apartment number after which he will execute a "carriage return". At this point the CPU then assigns the inputted apartment number to the S, L and U members which were printed on the screen prior to the operator entered apartment number. The CPU then steps the section counter to a new value and displays new S, L and U numbers on the screen following which it awaits a new apartment number entry by the operator. The CPU then cycles through the section counter until it reaches its maximum value after which 16 S, L and U numbers will have been assigned to 16 entered apartment numbers by the operator. Following this, the CPU increments the line counter and resets the section counter to zero and repeats the process for the next 16 apartment entries until the section counter again reaches its maximum. After this the unit counter is incremented and the section and line counters reset to zero. After the next 32 entries, the unit counter is again incremented. Eventually, all the counters reach their maximum states and the CPU exits at step 1328 to step 1330 where it prints "index full" message to the operator. At this point, the CPU has stored corresponding S, L and U numbers for each entered apartment number. From step 1330, the CPU proceeds to step 1332 where it asks the operator if he wishes to store the new apartment index on a disk. If a yes response is entered, the CPU proceeds to step 1324 where the apartment index is stored on disk and then to the OIP program step 1200. If the answer at step 1322 is no, the CPU proceeds back to input step 1200 of the OIP program.

Returning to step 1310, if the operator input a "C" indicating he wished correction of an existing apartment index, the CPU proceeds to step 1316 where it requests the operator to input S, L and U codes for which an assigned apartment number needs correction. The CPU then proceeds to step 1318 where it searches the apartment index and prints the apartment for S, L and U information. It then prompts the operator to enter a corrected apartment number and then stores the corrected apartment number in the apartment index in correspondence to the entered S, L and U codes. Following step 1318, the CPU proceeds to step 1320 where it asks the operator if he wishes to correct another apartment number and if the answer is yes the CPU branches back to step 1316.

Returning to the maintenance mode command input step 1230 (FIG. 25D) another operator selected input mode is TIME. If this is selected, at step 1232 the CPU branches to a TIME routine where in step 1332 (FIG. 25L) it reads a real time clock and prints the present time after which it returns to the beginning of the OIP program, step 1200 (FIG. 25A). Another maintenance mode input command is TIME SET and if this is selected in step 1230 by an operator the CPU proceeds to a TIME SET routine (FIG. 25L) where it prompts an operator to enter the present time which the CPU then sets into the system real time clock. After this, the CPU returns to step 1200 of the OIP program.

Another input mode command which an operator can select at step 1230 is DATE. In the first step 1336 of this routine (FIG. 25L), the CPU reads the present month, day and year from the system clock and displays it to the operator. After this, the CPU returns to step 1200 of the OIP program.

Figure 25L:
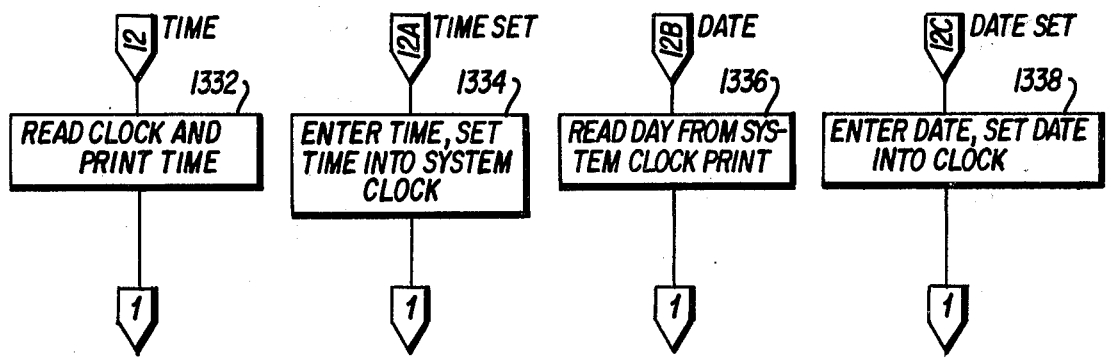
Figure 25H:
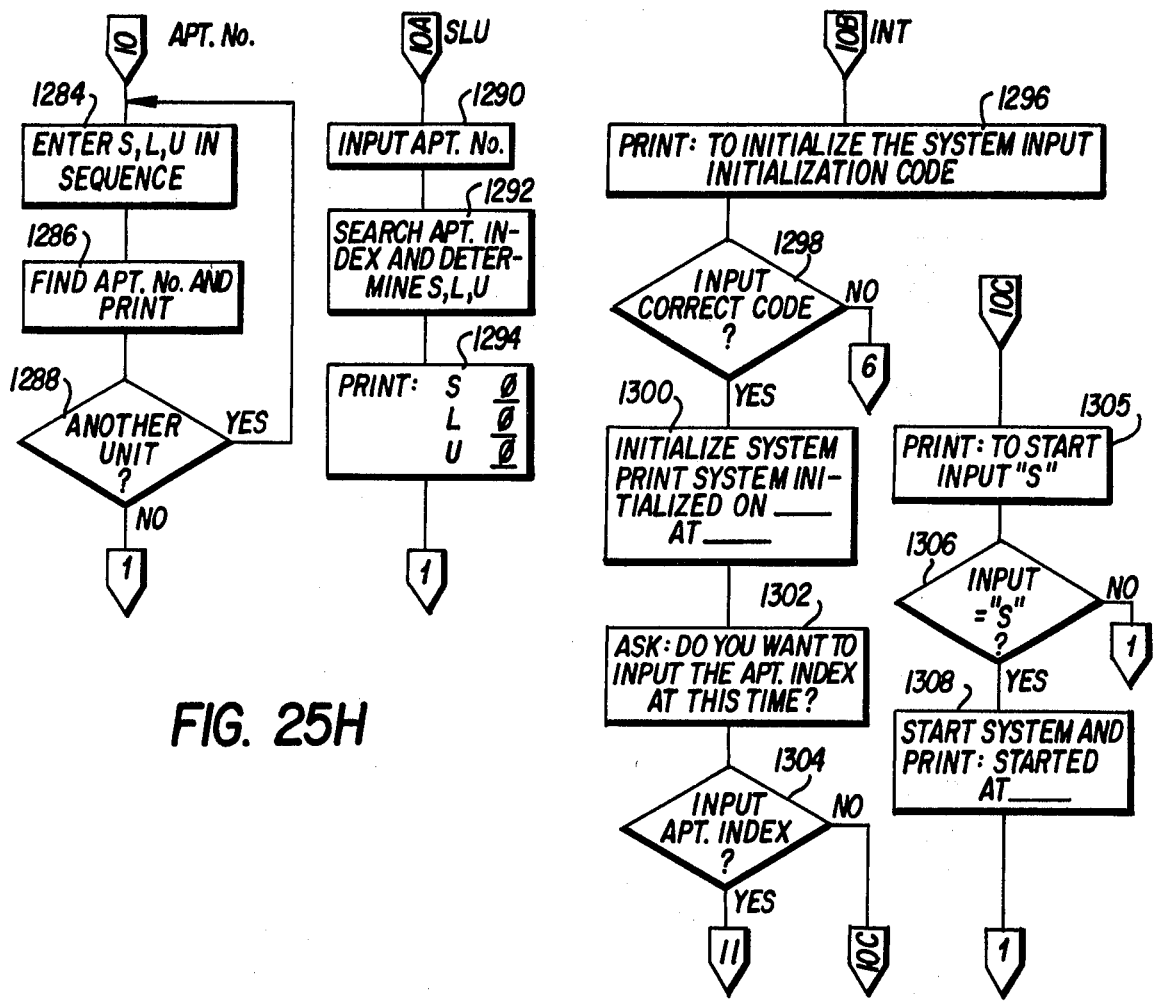
Figure 25J:
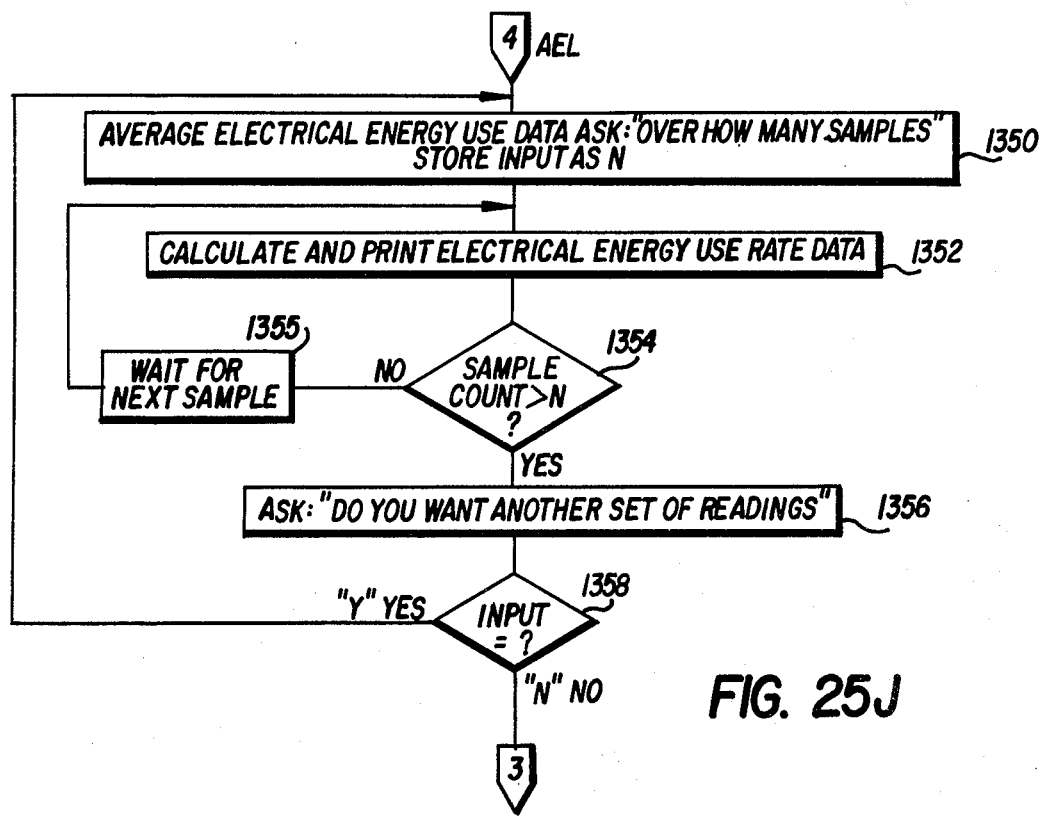
Figure 25I:
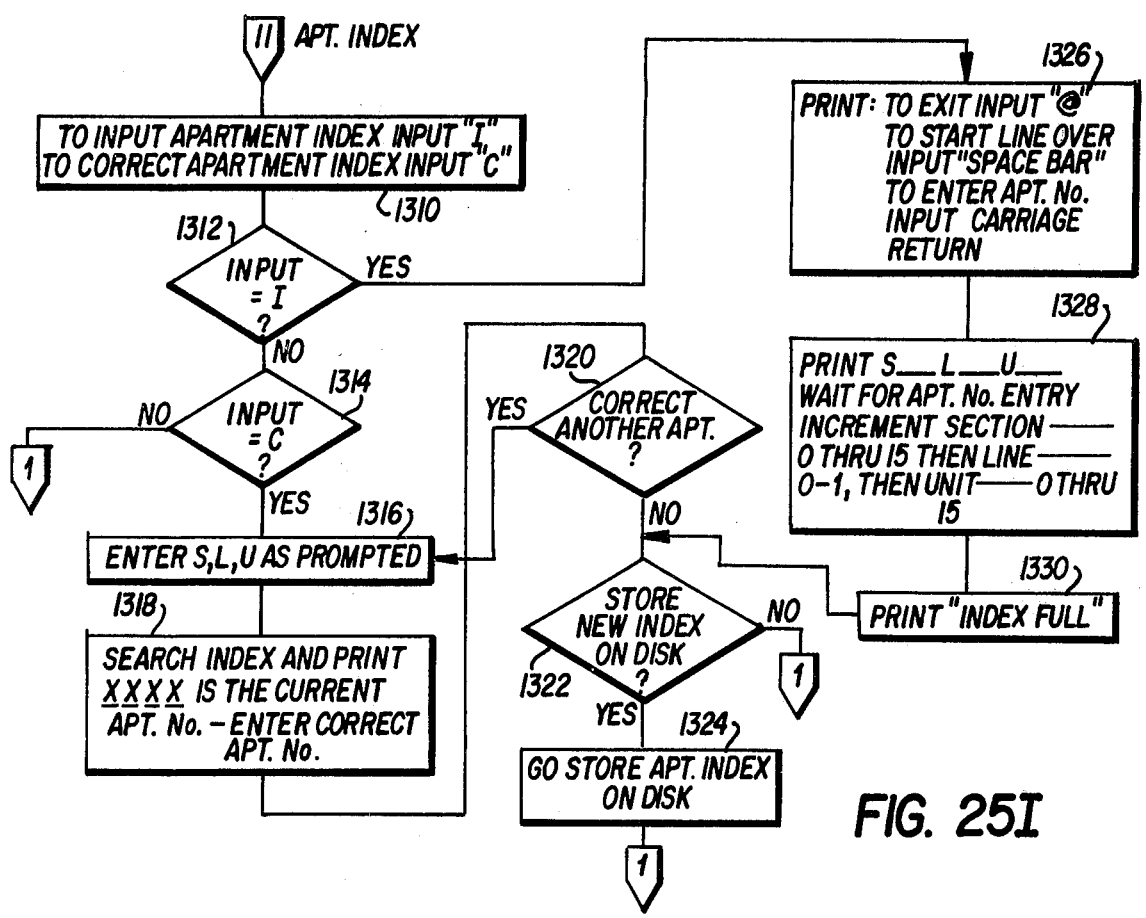
Figure 25K:
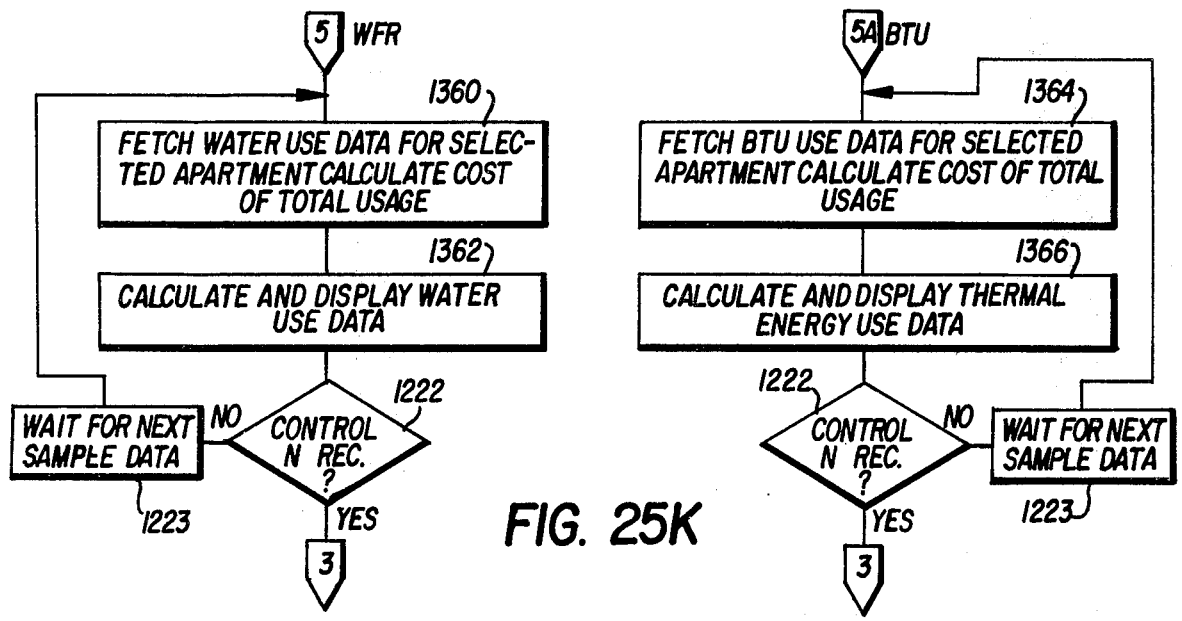

Another maintenance mode input command is DATE SET and if this is selected by the operator in step 1230, the CPU branches to a DATE SET routine illustrated in step 1338 (FIG. 25L). In step 1338 the CPU prompts the operator to enter the present date which the CPU sets into the system clock. Upon completing step 1338, the CPU returns to the beginning of the OIP program at step 1200 (FIG. 25A).

Another maintenance mode input command is APT INDEX. If this command is selected by an operator at step 1230, the CPU enters the APT INDEX routine described earlier which begins at step 1310 (FIG. 25I).

Additional input commands in the maintenance mode are EC, ER, TC, and TR. The EC routine (FIG. 25M) which can be selected has a step 1340 in which the CPU prompts an operator to input an electricity conversion constant which the CPU uses to calculate energy consumption. In the routine ER (FIG. 25M), the CPU proceeds to step 1342 where it prompts an operator to input an electricity rate cost factor. If the routine TC is selected, the CPU proceeds to step 1344 (FIG. 25M)

where it prompts the operator to input a thermal conversion constant which is used for BTU calculations. Finally, if the operator selects the input routine TR, the CPU proceeds to step 1346 (FIG. 25M) where it prompts the operator to input a thermal rate cost figure which is stored and used for thermal energy (BTU) cost calculations. Upon completion of any of the four foregoing routines, the program proceeds to step 1200 (FIG. 25A) of the OIP program.

It should be appreciated from the foregoing description that the present invention provides a unique data gathering and transmitting system in which a central station is capable of easily addressing each of the remote stations and each of the information channels thereat by a simple sequential tone pulsing scheme. Various types of sensors may be connected to the information channels at the remote stations, but the invention finds particular utility in measuring power consumption through an electrical path at the remote station by having at least one of the lines at each remote station connected to a current sensor which provides current data to the central station. This current data is multiplied by a voltage data which represents the voltage in the electrical path which is monitored by the current sensor to provide a consumed power vaue at the central station which can be stored and accumulated for information or billing purposes.

Although the invention has been described with reference to a specific embodiment, it should be understood that various modifications can be made to the disclosed invention without departing from its spirit or scope. Accordingly, the invention is not to be considered as limited by the foregoing description, but is only to be considered as limited by the claims which are appended hereto.

What is claimed is:

1. A data communications system comprising:
   at least one communications channel;
   at least one group of remote stations connected to a respective communications channel, each remote station comprising a plurality of information channels and tone addressable means for selectively connecting one of said plurality of information channels to a respectively communications channel, said tone addressable means comprising a tone detector for detecting clock tones on a respective communications channel, counting means for counting the number of clock tones detected, means for connecting one of said information channels to the respective communications channel in accordance with the number of clock tones which are counted, and means for enabling said connecting means only when the number of clock tones detected falls within a predetermined numerical range;
   a central station connected to each said communications channel and comprising means for sequentially supplying clock tones in common to each said communications channel to cause sequential connection of the information channels at said remote stations to a respective communications channel associated therewith, and means for transmitting a signal to or receiving a signal from an information channel which is connected to a respective communications channel.

2. A data communications system as in claim 1, wherein said tone detector provides a clock signal upon the occurrence of each said clocking tone, said counting means comprises a first counter for counting the number of said clocking signals, said first counter providing a carry output signal when a predetermined number of clocking signals have been counted, said enabling means comprises means for presetting a predetermined remote station address, a second counter for counting the number of carry output signals and for providing an enable signal when said counted number of carry output signals is in a predetermined numerical relationship to said predetermined address, and said connecting means selectively connects one of said plurality of information channels to a respective communications channel in accordance with the number of clock signals counted by said first counter, said connecting means being rendered operative by said enable signal.

3. A data communications system as in claim 2, wherein said second counter provides said enable signal when said counter number of carry output signals numerically equals said predetermined address.

4. A data communications system as in claim 1, wherein at least one of said information channels has an electronic calibration component connected thereto which is selectively connected to a respective central communications channel by said connecting means when a predetermined number of clock signals have been counted by said counting means.

5. A data communications system as in claim 1, further comprising means at said remote stations coupled to a respective communications channel and responsive to a resetting tone thereon for providing reset signals to said counting means for resetting it to a predetermined operative counter state.

6. A data communication system as in claim 5, wherein said detecting means is responsive to a relatively short duration clocking tone on a said respective communications channel and said means for providing reset signals is responsive only to a relatively long duration resetting tone on said respective communications channel.

7. A data communications system as in claim 1, wherein said clocking tone is at a frequency of 100 Khz.

8. A data communications system as in claim 5, wherein said clocking tone and said resetting tone are at a frequency of 100 Khz.

9. A data communications system as in claim 2, wherein said means for detecting said clocking tone comprises a tuned filter having an output connected to the input of a one-shot multivibrator, the output of said multivibrator supplying said clocking signals.

10. A data communications system as in claim 5, wherein said means for providing reset signals comprises a tuned circuit and a timing circuit coupled to the output of the tuned circuit, said timing circuit producing an output signal only when a reset signal is applied to said tuned circuit for a predetermined period of time.

11. A data communication system as in claim 1 further comprising a power supply for supplying voltage to said tone detector, counting means, connecting means, and enabling means, said power supply deriving said voltage from tone signals present on said respective communications channel.

12. A data communications system as in claim 2, wherein said presetting means is programmable.

13. A data communications system as in claim 1, wherein said information channels and said respective communications channel are wire pairs.

14. A data communications system as in claim 13 further comprising a fuse in said communications channel at the entry thereof to each said remote station.

15. A data communications system as in claim 1 further comprising at least one parameter sensor connected to one of said information channels and wherein said central station further comprises means connected to said communications channel for measuring the output of said sensor during the time said one information channel is connected to said communications channel.

16. A data communications system as in claim 1 further comprising operative means at a remote station connected to one of said information channels which is responsive to a predetermined signal on said one information channel, and wherein said central station further comprises means connected to said communications channel for supplying said predetermined signal to said one information channel during the time said one information channel is connected to said communications channel.

17. A data communications system as in claim 16 wherein said predetermined signal is at least one instruction tone.

18. A data communicatins system as in claim 17 wherein said predetermined signal is one of a plurality of instruction tones and further comprising a programmable tone generator at said central station for generating one of said instruction tones, and a processor means for causing said programmable tone generator to generate a selected one of said instruction tones.

19. A data communications system as in claim 15, wherein said measuring means comprises an analog to digital converter means for converting said sensor output to a digital value and a processor means for storing said digital value.

20. A data communications system as in claim 19 further comprising means for combining a calibration signal obtained from said sensor under known conditions with said sensor output prior to the application of said sensor output to said analog to digital converter means.

21. A data communications system as in claim 19, wherein said sensor output is a changing resistance signal and further comprising means for converting said changing resistance to a changing voltage before the application of said sensor output to said analog to digital converter means.

22. A data communications system as in claim 21, wherein said converting means connects a voltage across the series connection of said sensor output and a resistor, said converter means being programmable by said processor means so that one of a plurality of possible voltage and resistor combinations is connected to the output of said sensor.

23. A data communications system as in claim 21, further comprising means for supplying a test voltage to the input of said analog to digital converter means, said processor means storing the digital value of said test voltage.

24. A data communications system as in claim 23, wherein said test voltage supplying means is programmable to supply one of a plurality of test voltages to said analog to digital converter means in accordance with instructions from said processor means.

25. A data communications system as in claim 1 further comprising:
at least one current sensor at at least one of said remote stations having an output connected to an associated information channel, said current sensor measuring the flow of current through an electrical path;
means at said central station for receiving the output of said current sensor during the period said associated information channel is coupled to a respective communications channel; and,
means at said central station for computing the electrical power flowing through said electrical path, said computing means comprising:
means for deriving a voltage corresponding to the voltage on said electrical path;
means for multiplying a signal representative of said derived voltage by a signal representative of the output of said current sensor to provide a power value;
a first analog to digital converter means for digitizing the power value output of said multiplying means; and,
processor means for storing the digitized output of said first analog to digital converter means.

26. A data communications system as in claim 25 wherein said processor means stores a plurality of digitized output signals of said first analog to digital converter means for each cycle of voltage on said electrical path and sums said digitized output signals for each said cycle.

27. A data communications system as in claim 26, wherein said voltage deriving means is connected to and derives said voltage from a power distribution system supplying voltage to said electrical path.

28. A data communications system as in claim 26, wherein said power distribution system is a multi-phase distribution system having at least one set of multiple phase input power lines and said voltage deriving means comprises means connected to each phase power line for deriving a voltage therefrom and means for selectively applying one of the derived voltages from said power lines to said multiplying means.

29. A data communications system as in claim 28, wherein said means for selectively applying selects one of said derived voltages in accordance with instructions received from said processor means.

30. A data communications system as in claim 25 further comprising at least one line voltage sensor at at least one of said remote stations having an output connected to an associated information channel, said line voltage sensor supplying an output signal representative of the voltage on said electrical path, said voltage deriving means comprising means at said central station for receiving the output of said voltage sensor during the period said information channel associated with said line voltage sensor is conneced to a respective communications channel.

31. A data communications system as in claim 25, wherein said multiplying means includes a second analog to digital converter means for digitizing said signal representing derived voltage and a multiplier for multiplying said signal representative of the output of said current sensor by said digitized derived voltage signal.

32. A data communications system as in claim 25, wherein said multiplying means includes an automatic gain control circuit for amplifying said signal representing the output of said current sensor by an amount required to place the output of said multiplying means within a predetermined signal level range.

33. A data communications system as in claim 32, wherein said automatic gain control circuit comprises means for detecting whether the output of said multiplying means is within said predetermined signal level range, programmable amplifying means for amplifying said signal representing the output of said current sensor by a factor determined by a value programmed therein, and means for repeatedly altering said programmed value until said detector indicates the output of said multiplying means is within said predetermined signal level range.

34. A data communications system as in claim 33, wherein said altering means comprises a counter for counting a counting signal, means for repeatedly supplying a counting signal to said counter until said detector indicates the output of said multiplying means is within said predetermined signal level range, and, means for decoding the contents of said counter to form said programmed value and for supplying said programmed value to said programmable amplifying means.

35. A data communications system as in claim 34, further comprising means for supplying the output of said counter to said processor means when the output of said multiplying means is within said predetermined signal level range, said processor means storing said counter output.

36. A data communications system as in claim 25, wherein said processor means calculates from stored power value outputs of said multiplying means energy consumed through said electrical path and provides an output display of said energy consumption.

37. A data communications system as in claim 25, wherein said multiplying means produces an inherent D.C. offset voltage during operation and said multiplying means including a capacitor means which is periodically charged to said D.C. offset voltage prior to the performance of a multiplying operation by said multiplying means by a periodically operated charging means, the charge on said capacitor means offsetting said offset voltage during operation of said multiplying means.

38. A data communications system as in claim 35, wherein said charging means is periodically operated by said processor means to charge said capacitor means.

39. A data communications system as in claim 1, further comprising:
a plurality of communications channels each having a respective group of remote stations associated therewith, each remote station of a group being able to connect an information channel thereof to a respective central communications channel in accordance with the number of detected clock tones which are counted by a counting means,
said central station being coupled to said plurality of communications channels such that clock tones from said central station are sequentially applied to each of said communications channels in common,
said central station further comprising means for transmitting a signal to or receiving a signal from an information channel connected to any one of said communications channels.

40. A data communications system as in claim 39, further comprising
at least one signal path in said central station; and
a signal path selector means for selectively connecting said signal path to one of said communications channels, said signal path selector means comprising:
a plurality of input lines respectively connected to said plurality of communications channels, and a programmable line selector for connecting one of said input lines to said signal path.

41. A data communications system as in claim 40, further comprising a processor means for instructing said programmable line selector to connect one of said input lines to said signal path.

42. A data communications system as in claim 41, wherein said programmable line selector has at least two switching sections, each associated with a respective group of input lines, each section selectively connecting one of the input lines associated therewith to a respective output line of the section, means for coupling the output lines of said sections to respective signal paths in said central station, said signal path selector further comprising means operable by said processor means for selectively coupling the output lines of said sections together.

43. A data communications system as in claim 25, wherein said current sensor output is a voltage signal.

44. A data communications system as in claim 25, further comprising means for supplying a test voltage to the current sensor input of said multiplying means, said processor means storing the digital value of said test voltage.

45. A data communications system as in claim 44, wherein said test voltage supplying means is programmable to supply one of a plurality of test voltages to said analog to digital converter means in accordance with instructions from said processor means.

46. A data communications system as in claim 26, wherein said processor means controls said first analog to digital converter means to digitize the power value output of said multiplying means and to store the digitized values by means of an interrupt program which is executed by said processor means in response to receipt of a first periodically generated interrupt signal.

47. A data communications system as in claim 46, wherein said periodically generated interrupt signal is generated by a frequency multiplier which is phase locked to the frequency of said derived voltage.

48. A data communications system as in claim 47, wherein said voltage deriving means is connected to and derives said voltage from a power distribution system supplying voltage to said electrical path, said power distribution system being a multi-phase distribution system having at least one set of multiple phase input power lines, said data communicating system further comprising means for selectively connecting one of said input power lines to said frequency multiplier.

49. A data communication system as in claim 15 further comprising a first temperature sensor connected to a first of said information channels and located so as to be affected by the flow of fluid in a flow path, a second temperature sensor connected to a second of said information channels and located so as to be effected by said flow of fluid and downstream of said first temperature sensor, and said central station further comprising a processor means for receiving output signals from said first and second temperature sensors, said processor means forming a difference value from the outputs of said first and second temperature sensors, said processor means storing a table of fluid flow rates verses temperature difference values for said temperature sensors and determining a fluid flow rate by looking up a determined temperature difference value in said table.

50. A data communication system as in claim 49 wherein said processor means further stores calibration data relating to said temperature sensors which is combined with the output signals of said sensors in forming said difference value.

51. A data communications system as in claim 15, wherein said parameter sensor is a temperature sensor.

52. A data communication system as in claim 15, wherein said parameter sensor is an electrical current sensor.

53. A data communications system as in claim 15, wherein said parameter sensor is a humidity sensor.

54. A data communications system as in claim 49, wherein said second temperature sensor comprises a temperature sensing device having an output signal which varies in accordance with a sensed temperature, a resistor thermally bonded to said temperature sensing device, and a voltage source connected across said resistor.

55. A data communications system as in claim 54, wherein said resistor and temperature sensing device are bonded together by a highly conductive material which forms a housing surrounding at least a portion of said resistor and said temperature sensing device.

56. A data communications system as in claim 55, wherein said housing has an oval shape.

57. A data communications system as in claim 55, wherein said second temperature sensor further comprises a metal layer surrounding said resistor, temperature sensing device and material housing.

58. A data communications system as in claim 49, wherein said fluid flow path is on the input side of a heat exchanging device and wherein a third temperature sensor is connected to a third information channel and is located so as to be affected by said flow of fluid as it exits from said heat exchanging device, said processor means further determining a BTU rate for said heat exchanging device from said determined flow rate and the outputs of said first and third temperature sensors.

59. A data communications system as in claim 51, wherein said central station further comprises means for comparing the output signal of said temperature sensor at different points in time and for issuing an alarm signal if the difference between the compared output signals exceeds a predetermined value.

60. A data communications system comprising:
at least one central communications channel;
at least one group of remote stations connected to a respective communications channel, each remote station comprising a plurality of information channels, addressable means for selectively connecting an addressed one of said plurality of information channels to said central communications channel, and at least one current sensor having an output connected to an associated information channel, said current sensor measuring the flow of current through an electrical path;
a central station connected to each said central communications channel and comprising means for selectively addressing the information channels at said remote stations, means for receiving the output of said current sensor during the period said associated information channel is connected to a respective communications channel; and means for computing the electrical power flowing through said electrical path, said computing means comprising:
means for deriving a voltage corresponding to the voltage on said electrical path;
means for multiplying a signal representative of said derived voltage by a signal representative of the output of said current sensor to provide a power value;
a first analog to digital converter means for digitizing the power value output of said multiplying means; and
processor means for storing the digitized output of said first converter means.

61. A data communications system as in claim 60 further comprising means for combining a calibration signal obtained from said multiplying means under known conditions with the output of said multiplying means prior to application of the output of said multiplying means to said analog to digital converter means.

62. A data communications system as in claim 60, wherein said processor means stores a plurality of digitized output signals of said first analog to digital converter means for each cycle of voltage on said electrical path and sums said digitized output signals for each said cycle.

63. A data communications system as in claim 60, wherein said voltage deriving means is connected to and derives said voltage from a power distribution system supplying voltage to said electrical path.

64. A data communications system as in claim 63, wherein said power distribution system is a multi-phase distribution system having at least one set of multiple phase input power lines and said voltage deriving means comprising means connected to each phase power line for deriving a voltage therefrom and means for selectively applying one of the derived voltages from said power lines to said multiplying means.

65. A data communications system as in claim 64, wherein said means for selectively applying selects one of said derived voltages in accordance with instructions received from said processor means.

66. A data communications system as in claim 62, further comprising at least one line voltage sensor at at least one of said remote stations and having an output connected to an associated addressable information channel, said line voltage sensor supplying to a central communications channel when addressed by said central station an output signal representative of the voltage on said electrical path, said voltage deriving means comprising means at said central station for receiving the output of said voltage sensor during the period said information channel associated with said line voltage sensor is connected to a respective communications channel.

67. A data communications system as in claim 66, wherein said voltage deriving means further comprising means connected to and deriving voltage from a power distribution system supplying voltage to said electrical path, and means for selecting between a voltage derived from said power distribution system and a voltage corresponding to the output received from said line voltage sensor, the output of said selecting means supplying said signal representative of a derived voltage to said multiplying means.

68. A data communications system as in claim 67, wherein said voltage selecting means performs said selection in response to instructions received from said processor means.

69. A data communications system as in claim 60, wherein said multiplying means comprises a second analog to digital converter means for digitizing said signal representing derived voltage and a multiplier for multiplying said signal representative of the output of said current sensor by said digitized derived voltage signal.

70. A data communications system as in claim 60, wherein said multiplying means includes an automatic gain control circuit for amplifying said signal representing the output of said current sensor by an amount required to place the output of said multiplying means within a predetermined signal level range.

71. A data communications system as in claim 70, wherein said automatic gain control circuit comprises means for detecting whether the output of said multiplying means is within said predetermined signal level range, programmable amplifying means for amplifying said signal representing the output of said sensor by a factor determined by a value programmed therein, and means for repeatedly altering said programmed value until said detecting means indicates that the output of said multiplying means is within said predetermined signal level range.

72. A data communications system as in claim 71, wherein said altering means comprises a counter for counting a counting signal, means for repeatedly supplying a counting signal to said counter until said detector indicates the output of said multiplying means is within said predetermined signal level range, and means for decoding the contents of said counter to form said programmed value and supplying said programmed value to said programmable amplifying means.

73. A data communications system as in claim 72, further comprising means for supplying the output of said counter to said processor means when the output of said multiplying means is within said predetermined signal level range, said processor means storing said counter output.

74. A data communications system as in claim 60, wherein said processor means calculates from stored power value outputs of said multiplying means energy consumed through said electrical path and provides an output display of said energy consumption.

75. A data communications system as in claim 60, wherein said multiplying means produces an inherent D.C. offset voltage during operation, said multiplying means further comprising a capacitor means which is periodically charged to said D.C. offset voltage prior to the performance of a multiplying operation by said multiplying means by a periodically operated charging means, the charge on said capacitor means offsetting said offset voltage during operation of said multiplying means.

76. A data communications system as in claim 75, wherein said charging means is periodically operated by said processor means to charge said capacitor means.

77. A data communications system as in claim 60, further comprising means for supplying a test voltage to the derived voltage input of said multiplying means, said processor means storing the digital value of said test voltage.

78. A data communication system as in claim 77, wherein said test voltage supplying means is programmable to supply one of a plurality of test voltage to said analog to digital converter means in accordance with instructions from said processor means.

79. A data communications system as in claim 60, further comprising
at least one signal path in said central station; and
a signal path selector means for selectively connecting said signal path to one of said communications channels, said signal path selector means comprising:
a plurality of input lines respectively connected to said plurality of communications channels, and a programmable line selector for connecting one of said input lines to said signal path.

80. A data communications system as in claim 79, further comprising a processor means for instructing said programmable line selector to connect one of said input lines to said signal path.

81. A data communication system as in claim 80, wherein said programmable line selector has at least two switching sections, each associated with a respective group of input lines, each section selectively connecting one of the input lines associated therewith to a respective ouput line of the section, means for coupling the output lines of said sections to respective signal paths in said central station, said signal path selector further comprising means operable by said processor means for selectively coupling the output lines of said sections together.

82. A data communications system as in claim 60, wherein said processor means controls said first analog to digitial converter means to digitize the power value output of said multiplying means and to store the digitized values by means of an interrupt program which is executed by said processor means in response to receipt of a first periodically generated interrupt signal.

83. A data communications system as in claim 82, wherein said periodically generated interrupt signal is generated by a frequency multiplier which is phase locked to the frequency of said derived voltage.

84. A data communications system as in claim 83, wherein said voltage deriving means is connected to and derives said voltage from a power distribution system supplying voltage to said electrical path, said power distribution system being a multi-phase distribution system having at least one set of multiple phase input power lines, said data communicating system further comprising means for selectively connecting one of said input power lines to said frequency multiplier.

* * * * *